(12) United States Patent
Moriwaka

(10) Patent No.: US 8,432,021 B2
(45) Date of Patent: Apr. 30, 2013

(54) MANUFACTURING METHOD OF SOI SUBSTRATE

(75) Inventor: Tomoaki Moriwaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 309 days.

(21) Appl. No.: 12/786,574

(22) Filed: May 25, 2010

(65) Prior Publication Data

US 2010/0304550 A1    Dec. 2, 2010

(30) Foreign Application Priority Data

May 26, 2009    (JP) .................................. 2009-126962

(51) Int. Cl.
 *H01L 21/22*    (2006.01)
(52) U.S. Cl.
 USPC .................... 257/567; 257/E21.567; 438/458
(58) Field of Classification Search .................. 438/458; 257/567
 See application file for complete search history.

(56) References Cited

U.S. PATENT DOCUMENTS

| | | | |
|---|---|---|---|
| 5,374,564 A | 12/1994 | Bruel | |
| 6,140,210 A | 10/2000 | Aga et al. | |
| 6,287,941 B1 | 9/2001 | Kang et al. | |
| 6,653,209 B1 | 11/2003 | Yamagata | |
| 6,759,277 B1 | 7/2004 | Flores et al. | |
| 6,818,529 B2 | 11/2004 | Bachrach et al. | |
| 6,884,694 B2 | 4/2005 | Park et al. | |
| 7,119,365 B2 | 10/2006 | Takafuji et al. | |
| RE39,484 E | 2/2007 | Bruel | |
| 7,354,844 B2 | 4/2008 | Endo et al. | |
| 7,619,250 B2 | 11/2009 | Takafuji et al. | |
| 2004/0238851 A1 | 12/2004 | Flores et al. | |
| 2005/0032283 A1 | 2/2005 | Itoga et al. | |

(Continued)

FOREIGN PATENT DOCUMENTS

| | | |
|---|---|---|
| JP | 05-211128 A | 8/1993 |
| JP | 2003-257804 A | 9/2003 |

(Continued)

OTHER PUBLICATIONS

Sullivan.J et al., "P-220L: Late-News Poster: Layer-Transfer of Silicon Single-Crystal Films on Large-Area Glass Substrates for Mobile Display Applications," SID Digest '06 : SID International Symposium Digest of Technical Papers, 2006, vol. 37, pp. 280-282.

*Primary Examiner* — Robert J Hoffberg
*Assistant Examiner* — Igwe U Anya
(74) *Attorney, Agent, or Firm* — Eric J. Robinson; Robinson Intellectual Property Law Office, P.C.

(57) ABSTRACT

An object is to provide a manufacturing method of an SOI substrate in which a plurality of single crystal semiconductor layers uniform in quality is bonded to a substrate having a larger area than a single crystal silicon substrate. At the time of a heat treatment, uniform heat distribution in single crystal semiconductor substrates is realized by using a tray which has depression portions each with a large depth and is not in contact with the single crystal semiconductor substrate bonded to a base substrate as a tray for supporting the base substrate and holding the single crystal semiconductor substrates. Further, by providing a supporting portion for the base substrate between the depression portions of the tray, a contact area between the tray and the base substrate is reduced.

18 Claims, 22 Drawing Sheets

U.S. PATENT DOCUMENTS

| | | |
|---|---|---|
| 2007/0281172 A1 | 12/2007 | Couillard et al. |
| 2008/0063840 A1 | 3/2008 | Morita et al. |
| 2008/0160661 A1 | 7/2008 | Henley |
| 2009/0079024 A1* | 3/2009 | Yamazaki ............ 257/506 |
| 2009/0079025 A1* | 3/2009 | Yamazaki ............ 257/506 |
| 2009/0081844 A1* | 3/2009 | Yamazaki ............ 438/406 |
| 2009/0081845 A1* | 3/2009 | Yamazaki et al. ....... 438/406 |
| 2009/0096054 A1* | 4/2009 | Yamazaki et al. ....... 257/506 |

FOREIGN PATENT DOCUMENTS

| | | |
|---|---|---|
| JP | 2004-087606 A | 3/2004 |
| JP | 2005-539259 | 12/2005 |
| WO | WO-2004/025360 | 3/2004 |

* cited by examiner

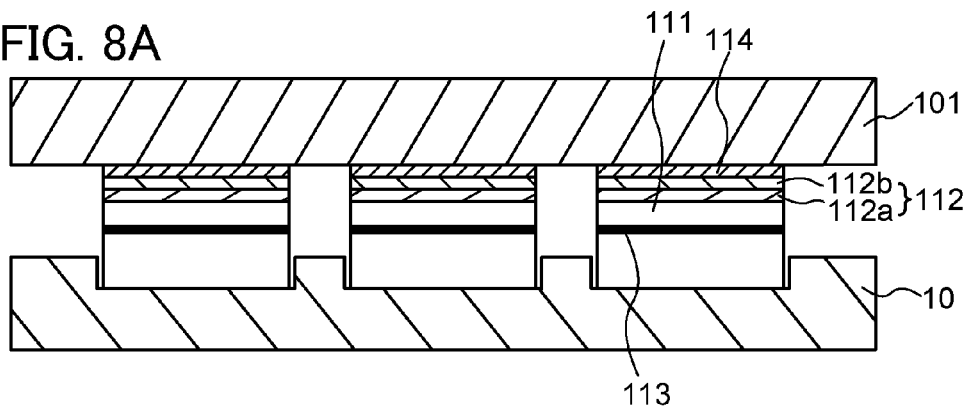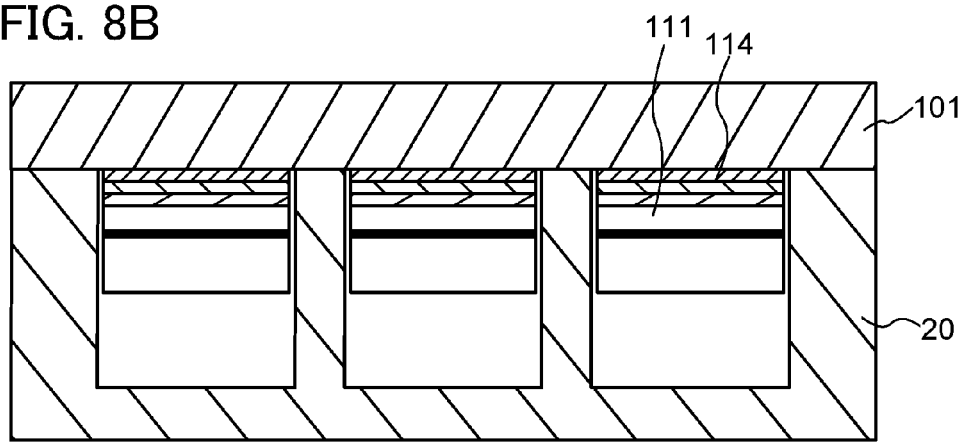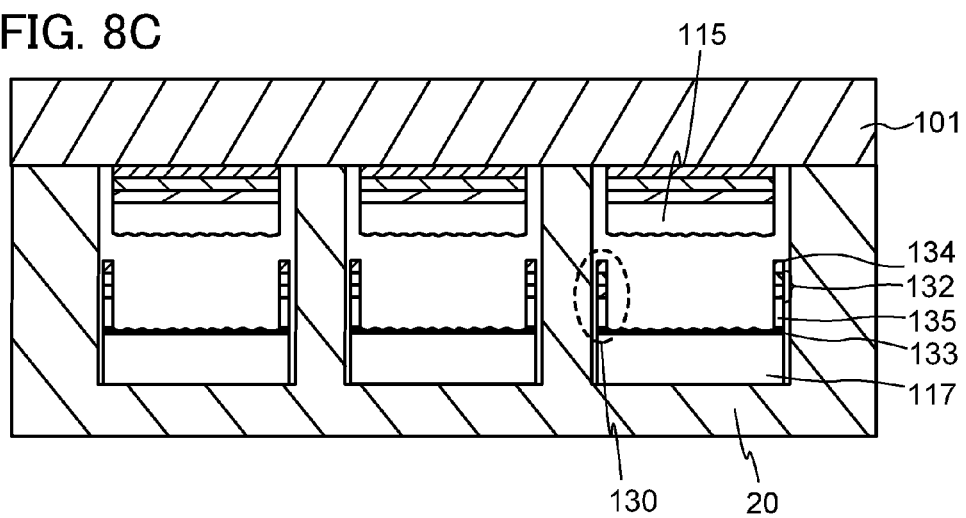

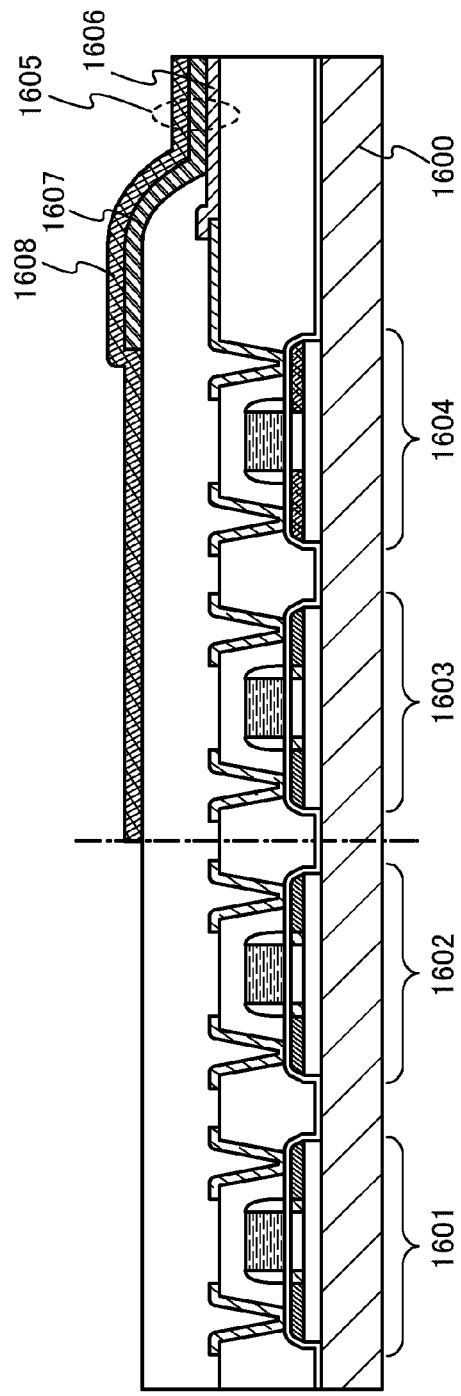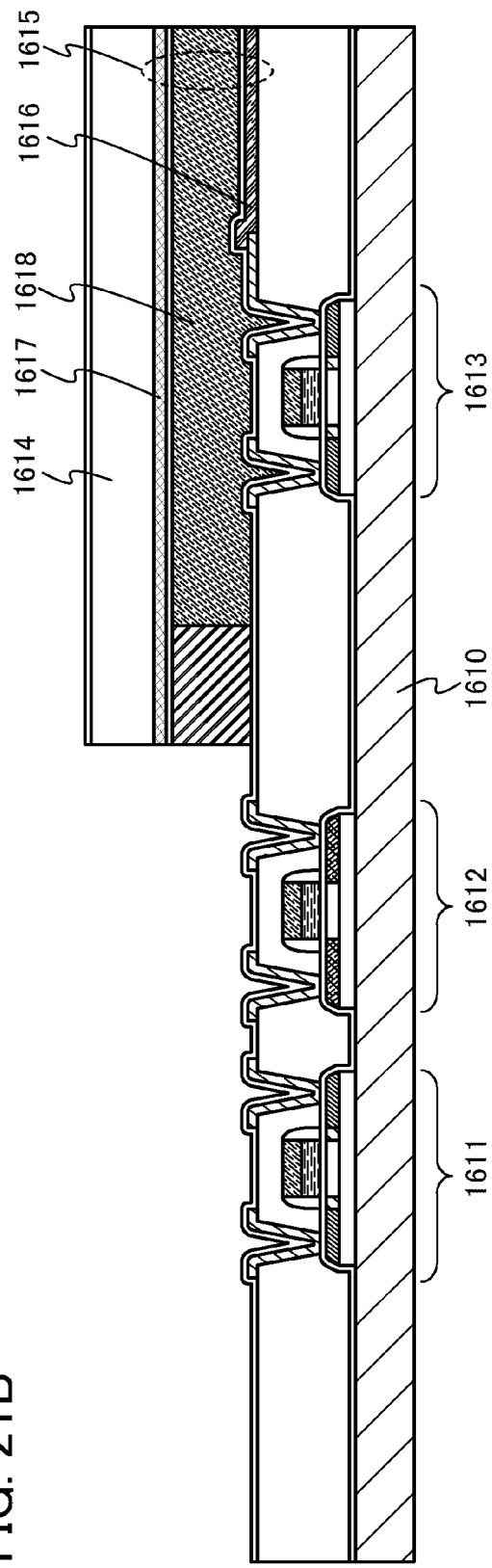

MANUFACTURING METHOD OF SOI SUBSTRATE

BACKGROUND OF THE INVENTION

1. Field of the Invention

The present invention relates to a manufacturing method of a substrate provided with a semiconductor layer with an insulating film interposed therebetween, particularly, a silicon-on-insulator (SOI) substrate.

2. Description of the Related Art

In recent years, integrated circuits that use a silicon on insulator (SOI) substrate in which a thin single crystal semiconductor layer is provided on an insulating surface, instead of a bulk silicon wafer, have been developed. By utilizing characteristics of a thin single crystal silicon film formed over an insulating film, transistors formed in the integrated circuit can be separated from each other completely. Further, since fully-depleted transistors can be formed, a semiconductor integrated circuit with high added value such as high integration, high speed driving, and low power consumption can be realized.

As one of the manufacturing methods of SOI substrates, a Smart Cut (registered trademark) method can be given. By a Smart Cut (registered trademark) method, not only an SOI substrate in which a single crystal silicon film is formed over a silicon substrate but also an SOI substrate in which a single crystal silicon film is formed over an insulating substrate such as a glass substrate can be manufactured (for example, see Patent Document 1). A manufacturing method of an SOI substrate having a single crystal silicon thin film over a glass substrate, in which a Smart Cut (registered trademark) method is used, is briefly described below. First, a silicon dioxide film is formed over a surface of a single crystal silicon wafer. Next, by implantation of a hydrogen ion into the single crystal silicon wafer, a hydrogen ion implantation plane is formed at a predetermined depth in the single crystal silicon wafer. Then, the single crystal silicon wafer into which the hydrogen ion is implanted is bonded to a glass substrate with the silicon dioxide film interposed therebetween. After that, a heat treatment is performed, whereby the hydrogen ion implantation plane serves as a cleavage plane and a thin film of the single crystal silicon wafer into which the hydrogen ion is implanted is separated. In this manner, a single crystal silicon thin film can be formed over the bonded glass substrate. This Smart Cut (registered trademark) method may also be referred to as a hydrogen ion implantation separation method.

REFERENCE

Patent Document

[Patent Document 1] Japanese Published Patent Application No. 2004-87606

SUMMARY OF THE INVENTION

However, the size of a conventional SOI substrate depends on the size of a single crystal silicon wafer and it is difficult to achieve size increase for conventional SOI substrates. The area of an SOI substrate can be increased by bonding a plurality of single crystal silicon wafers to a large-area base substrate with the use of a holding tray and performing separation using a hydrogen ion implantation separation method; however, even in that case, there is a problem in that a difference arises between the single crystal silicon wafers in the separation of single crystal semiconductor layers, which does not allow the single crystal semiconductor layers to be uniform in quality.

It is considered that this is mainly because the heat distribution in the base substrate and the single crystal silicon wafers becomes non-uniform when a heat treatment is performed to separate the single crystal semiconductor layers from the single crystal silicon wafers which are bonded to the base substrate.

Therefore, according to one embodiment of the present invention, an object is to provide a manufacturing method of an SOI substrate in which a plurality of single crystal semiconductor layers uniform in quality is bonded to a substrate having a larger area than a single crystal silicon substrate.

To solve the above problem, at the time of the heat treatment for separating the single crystal semiconductor layers from the single crystal semiconductor substrates, the heat distribution in the single crystal semiconductor substrates and the base substrate is made uniform. At the time of the heat treatment, uniform heat distribution in the single crystal semiconductor substrates is realized by using a tray which has a depression portion with such a large depth that a bottom surface thereof is not in contact with the single crystal semiconductor substrate which is bonded to the base substrate, as a tray for supporting the base substrate and holding the single crystal semiconductor substrates. Further, by providing a supporting portion for the base substrate between the depression portions of the tray, a contact area between the tray and the base substrate is reduced.

One embodiment of the present invention is a manufacturing method of an SOI substrate including the steps of: preparing a plurality of single crystal semiconductor substrates in each of which a bonding layer is formed over a top surface and an embrittlement layer is formed at a predetermined depth, a base substrate, a first tray provided with a plurality of depression portions, and a second tray provided with a plurality of depression portions; disposing the plurality of single crystal semiconductor substrates in the plurality of depression portions of the first tray; making the plurality of single crystal semiconductor substrates disposed in the plurality of depression portions of the first tray be closely in contact with the base substrate with the bonding layers interposed therebetween so that surfaces of the bonding layers and a surface of the base substrate are bonded to each other and the base substrate and the plurality of single crystal semiconductor substrates are bonded to each other; detaching the first tray from the plurality of single crystal semiconductor substrates; disposing the second tray so that the plurality of single crystal semiconductor substrates overlaps with the plurality of depression portions provided in the second tray; and generating a crack in the embrittlement layers by a heat treatment performed on the plurality of single crystal semiconductor substrates which is disposed over the second tray to form the base substrate with which a plurality of single crystal semiconductor layers separated from the single crystal semiconductor substrates is closely in contact. In the manufacturing method, the depth of the depression portion provided in the first tray is smaller than the thickness of the single crystal semiconductor substrate, and the depth of the depression portion provided in the second tray is larger than the thickness of the single crystal semiconductor substrate. Here, the depth of the depression portion provided in the first tray refers to depth D1 of a depression portion 11 which is illustrated in FIG. 3B. Further, the depth of the depression portion provided in the second tray refers to depth D2 of a depression portion 21 which is illustrated in FIG. 11B.

Another embodiment of the present invention is a manufacturing method of an SOI substrate including the steps of: preparing a plurality of single crystal semiconductor substrates in each of which a bonding layer is formed over a top surface and an embrittlement layer is formed at a predetermined depth, a base substrate, a first tray provided with a plurality of depression portions, and a second tray provided with a plurality of depression portions and a supporting portion between the depression portions; disposing the plurality of single crystal semiconductor substrates in the plurality of depression portions of the first tray; making the plurality of single crystal semiconductor substrates disposed in the plurality of depression portions of the first tray be closely in contact with the base substrate with the bonding layers interposed therebetween so that surfaces of the bonding layers and a surface of the base substrate are bonded to each other, and the base substrate and the plurality of single crystal semiconductor substrates are bonded to each other; detaching the first tray from the plurality of single crystal semiconductor substrates; disposing the second tray so that the plurality of single crystal semiconductor substrates overlaps with the plurality of depression portions provided in the second tray; and generating a crack in the embrittlement layers by a heat treatment performed on the plurality of single crystal semiconductor substrates which is disposed over the second tray to form the base substrate with which a plurality of single crystal semiconductor layers separated from the single crystal semiconductor substrates is closely in contact. In the manufacturing method, the depth of the depression portion provided in the first tray is smaller than the thickness of the single crystal semiconductor substrate; a sum of the depth of the depression portion and the height of the supporting portion which are provided in the second tray is larger than the thickness of the single crystal semiconductor substrate; and a distance between the depression portions provided in the second tray is larger than the width of the supporting portion. Here, the depth of the depression portion provided in the first tray refers to the depth D1 of the depression portion 11 which is illustrated in FIG. 3B; the depth of the depression portion provided in the second tray refers to depth D3a of a depression portion 31 which is illustrated in FIG. 13B; the height of the supporting portion which is provided in the second tray refers to height D3b of a supporting portion 32 which is illustrated in FIG. 13B; the distance between the depression portions provided in the second tray refers to width D4a which is illustrated in FIG. 13B; and the width of the supporting portion provided in the second tray refers to width D4b of the supporting portion 32 which is illustrated in FIG. 13B.

Note that the second tray is preferably disposed without being in contact with the plurality of single crystal semiconductor substrates. The single crystal semiconductor substrates separated from the single crystal semiconductor layers are preferably held in the plurality of depression portions which is provided in the second tray. In addition, the area of the bottom surface of the depression portion provided in the second tray is preferably less than or equal to 1.1 times that of the bottom surface of the single crystal semiconductor substrate.

The bonding layer may be formed over an insulating layer which is formed in contact with the single crystal semiconductor substrate. The insulating layer may have a stacked-layer structure including a plurality of insulating films.

The embrittlement layer is preferably formed by using hydrogen gas as a source gas, exciting the hydrogen gas to generate plasma containing $H_3^+$, and accelerating an ion species contained in the plasma to dope the single crystal semiconductor substrate with the ion species.

Further, it is preferable that the base substrate be a glass substrate. The second tray is preferably made of quartz glass, silicon, silicon carbide, or non-alkali glass.

Note that the ordinal numbers such as "first" and "second" in this specification are used for convenience and do not denote the order of steps and the stacking order of layers. In addition, the ordinal numbers in this specification do not denote particular names which specify the present invention.

By the manufacturing method of an SOI substrate according to one embodiment of the present invention, an SOI substrate can be provided in which a plurality of single crystal semiconductor layers uniform in quality is formed over a substrate having a larger area than a single crystal silicon substrate. Accordingly, by using an SOI substrate according to one embodiment of the present invention, for example, productivity of a semiconductor device such as a semiconductor integrated circuit can be improved. Note that the term "semiconductor device" in this specification includes all types of devices that can function by utilizing semiconductor characteristics.

BRIEF DESCRIPTION OF THE DRAWINGS

In the accompanying drawings:

FIGS. 8A to 8C are cross sectional views illustrating a manufacturing method of an SOI substrate according to one embodiment of the present invention;

FIGS. 21A and 21B are views each illustrating a structure of a semiconductor device which is formed using an SOI substrate according to one embodiment of the present invention.

DETAILED DESCRIPTION OF THE INVENTION

Figure 1:
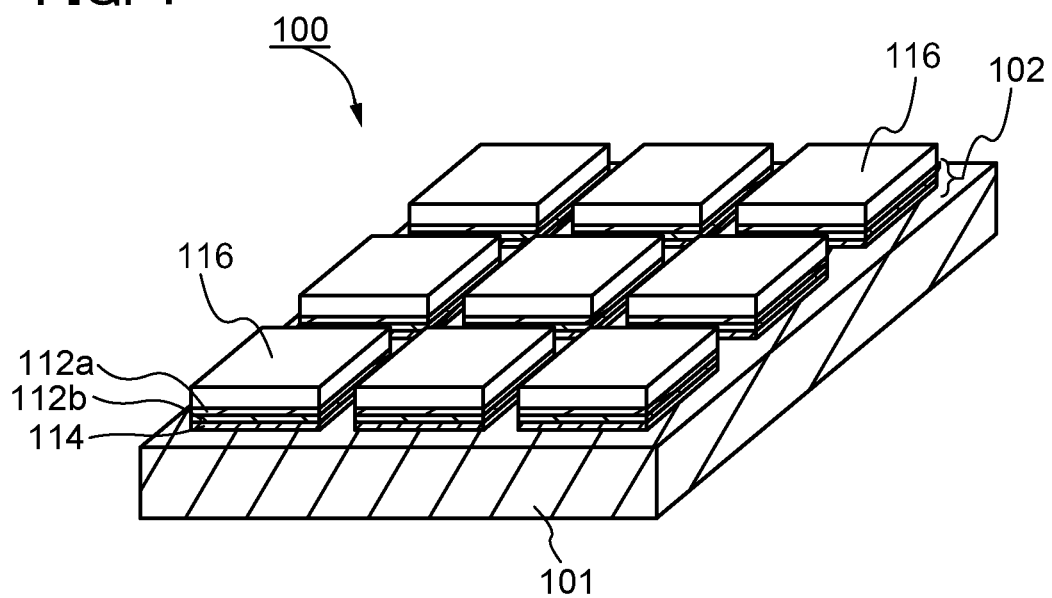
FIG. 1 is an external view illustrating an example of a structure of an SOI substrate according to one embodiment of the present invention.

Embodiments of the present invention will be described with reference to the drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, an SOI substrate in which a plurality of single crystal semiconductor layers is provided over a substrate and a manufacturing method thereof are described.

FIG. 1 is a perspective view illustrating a structural example of an SOI substrate 100. In the SOI substrate 100, a plurality of single crystal semiconductor layers 116 is bonded to a base substrate 101. Each of the single crystal semiconductor layers 116 is provided over the base substrate 101 with an insulating layer 102 interposed therebetween, and the SOI substrate 100 is a so-called semiconductor substrate with an SOI structure.

The insulating layer 102 may have a single-layer structure or a stacked-layer structure. In this embodiment, the insulating layer 102 has a three-layer structure in which a bonding layer 114, an insulating film 112b, and an insulating film 112a are stacked in this order from the base substrate 101 side.

The single crystal semiconductor layer 116 is formed by thinning a single crystal semiconductor substrate. A commercially available semiconductor substrate can be used as the single crystal semiconductor substrate. For example, a single crystal semiconductor substrate made of a group 14 element such as a single crystal silicon substrate, a single crystal germanium substrate, or a single crystal silicon-germanium substrate can be used. Alternatively, a compound semiconductor substrate formed of gallium arsenide, indium phosphide, or the like can be used.

As the base substrate 101, a substrate having an insulating surface is used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. Preferably, a glass substrate is used as the base substrate 101. As a glass substrate, one that has a coefficient of thermal expansion of greater than or equal to $25 \times 10^{-7}/°C$. and less than or equal to $50 \times 10^{-7}/°C$. (preferably greater than or equal to $30 \times 10^{-7}/°C$. and less than or equal to $40 \times 10^{-7}/°C$.), and a distortion point at greater than or equal to 580° C. and lower than or equal to 750° C. (preferably greater than or equal to 600° C. and less than or equal to 680° C.). In order to suppress contamination of the semiconductor device, the glass substrate is preferably a non-alkali glass substrate. Materials of a non-alkali glass substrates include glass materials such as aluminosilicate glass, aluminoborosilicate glass, and barium borosilicate glass. Alternatively, an insulating substrate such as a ceramic substrate, a quartz substrate, or a sapphire substrate; a conductive substrate such as a metal substrate or a stainless steel substrate; or a semiconductor substrate formed of silicon, gallium arsenide, or the like can be used as the base substrate 101.

As the base substrate 101, it is preferable that a substrate that is greater than or equal to 300 mm×300 mm be used. For example, as such a large-area substrate, a mother glass substrate developed for manufacturing liquid crystal panels is preferably used. As such a mother glass substrate, substrates having the following sizes are known: the third generation (550 mm×650 mm), the 3.5-th generation (600 mm×720 mm), the fourth generation (680 mm×880 mm, or 730 mm×920 mm), the fifth generation (1100 mm×1300 mm), the sixth generation (1500 mm×1850 mm), the seventh generation (1870 mm×2200 mm), the eighth generation (2200 mm×2400 mm), the ninth generation (2400 mm×2800 mm), and the tenth generation (2850 mm×3050 mm) and the like.

Size increase of an SOI substrate can be realized by using a large-area substrate such as a mother glass substrate, as the base substrate 101. When a large-area SOI substrate is realized, a large number of chips of ICs or LSIs can be manufactured by using one SOI substrate. Thus, the number of chips which are manufactured by using one substrate increases, thereby increasing the productivity dramatically.

Hereinafter, a manufacturing method of the SOI substrate 100 illustrated in FIG. 1 is described with reference to FIG. 2, FIGS. 3A and 3B, FIG. 4, FIGS. 5A and 5B, FIGS. 6A and 6B, FIGS. 7A to 7D, FIGS. 8A to 8C, FIG. 9, FIGS. 10A and 10B, FIGS. 11A and 11B, FIGS. 12A and 12B, and FIGS. 13A and 13B.

Figure 2:
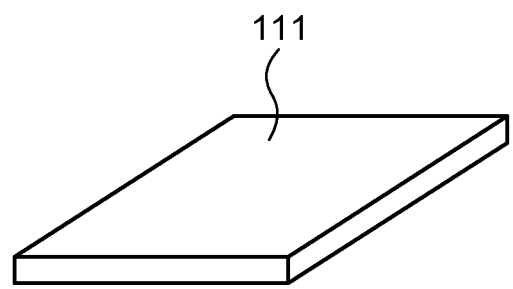
FIG. 2 is an external view illustrating an example of a structure of a single crystal semiconductor substrate.

First, a single crystal semiconductor substrate 111 is prepared. The single crystal semiconductor substrate 111 is processed into a desired size and shape. FIG. 2 is an external view illustrating an example of a structure of the single crystal semiconductor substrate 111. When the fact that the shape of the base substrate 101 to which the single crystal semiconductor substrates 111 are bonded is rectangular and a light-exposing region of a light exposure apparatus such as a reduced projection exposure apparatus is rectangular is taken into consideration, the shape of the single crystal semiconductor substrate 111 is preferably rectangular as illustrated in FIG. 2. Note that unless otherwise specified, a square is also included as a rectangle. For example, the length of a long side of the rectangular single crystal semiconductor substrate 111 is preferably processed so as to be n (n is an arbitrary positive integer, and n≧1) times the length of a side of one shot of the light-exposing region of a reduced projection exposure apparatus.

The rectangular single crystal semiconductor substrate 111 can be formed by cutting a circular bulk single crystal semiconductor substrate that is commercially available. To cut the substrate, a cutting apparatus such as a dicer or a wire saw, a cutting device such as a laser cutter, a plasma cutter, or an electron beam cutter can be used. Alternatively, before being sliced into a substrate, an ingot for manufacturing semiconductor substrates can be processed into a rectangular solid so that it has a rectangular cross section, and this ingot that is a rectangular solid may be sliced to manufacture the rectangular single crystal semiconductor substrate 111.

Note that in the case of using as the single crystal semiconductor substrate 111 a substrate made of a Group 14 element, which has a diamond structure as a crystal structure such as a single crystal silicon substrate, a plane orientation of a main surface thereof may be (100), (110), or (111). By using the single crystal semiconductor substrate 111 the plane orientation of the main surface of which is (100), the interface state density between the single crystal semiconductor layer 116 and the insulating layer formed on a surface thereof can be made to be low, which is favorable in manufacturing a field effect transistor.

By using the single crystal semiconductor substrate 111 the plane orientation of the main surface of which is (110), a close bond between an element included in the bonding layer 114 and a Group 14 element (for example, a silicon element) included in the single crystal semiconductor layer 116 is formed on a bonding plane between the bonding layer 114 and the single crystal semiconductor layer 116. Accordingly, a bond force between the bonding layer 114 and the single crystal semiconductor layer 116 is improved.

By using the single crystal semiconductor substrate 111 the plane orientation of the main surface of which is (110), planarity of the single crystal semiconductor layer 116 is improved since atoms are densely arranged on the main surface compared with surfaces of other plane orientations. Accordingly, a transistor manufactured using the single crystal semiconductor layer 116 with the plane orientation of the main surface of which is (110) has excellent electric characteristics such as a small S value and a high electron field-effect mobility. Note that a single crystal semiconductor substrate the plane orientation of the main surface of which is (110) has advantages over a single crystal semiconductor substrate the plane orientation of the main surface of which is (100) in that it has a high Young's modulus and is likely to be cleaved.

Figure 3A:
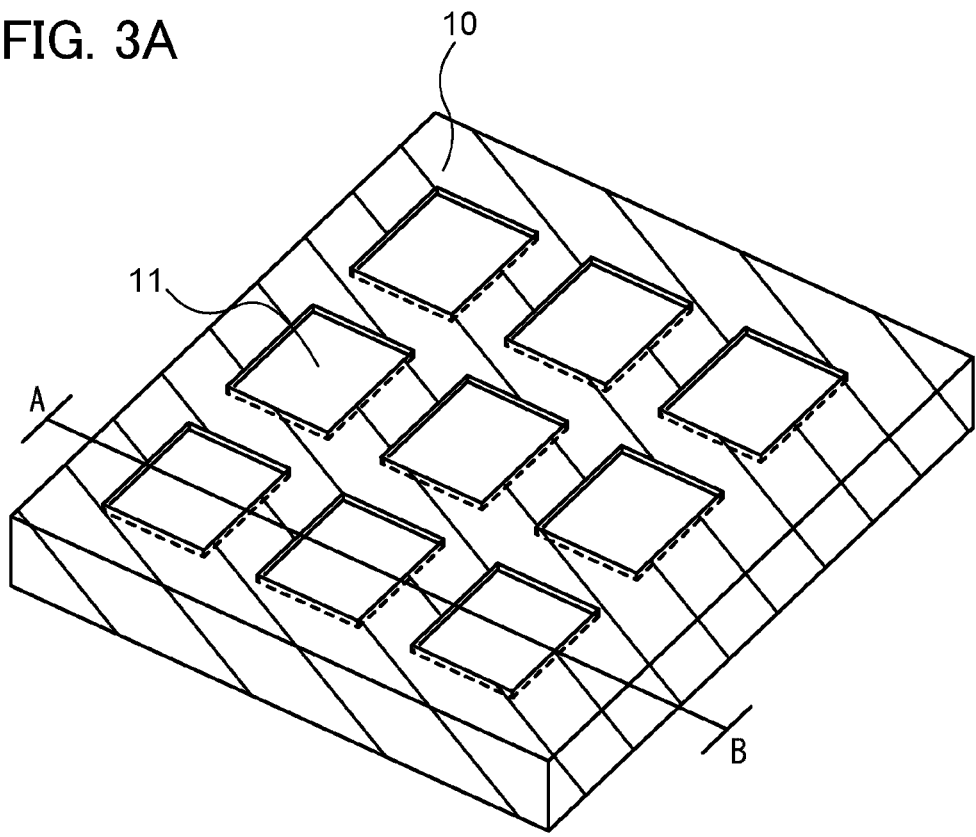
FIGS. 3A and 3B are views illustrating an example of a structure of a tray.
Figure 3B:
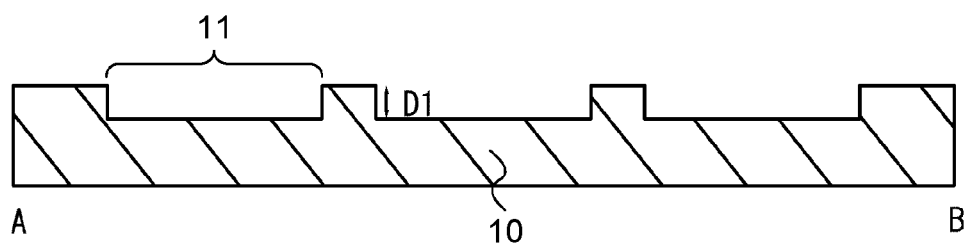
Figure 4:
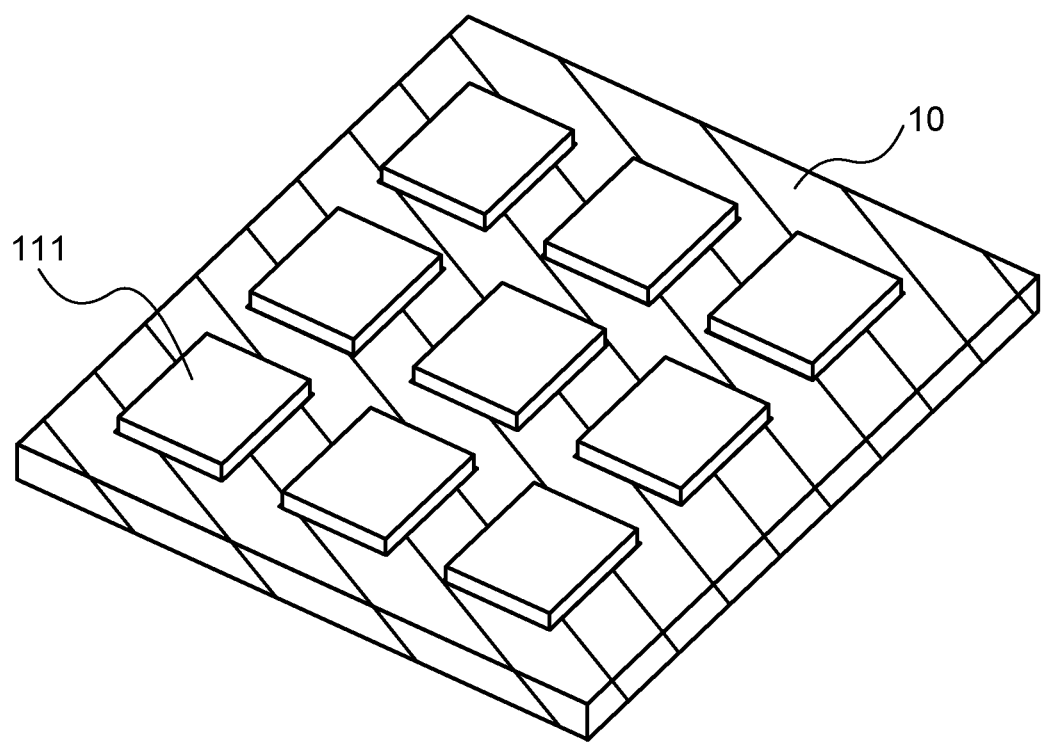
FIG. 4 is an external view illustrating a plurality of single crystal semiconductor substrates disposed on a tray.

After cleaning a plurality of single crystal semiconductor substrates 111, the single crystal semiconductor substrates 111 are disposed on a first tray 10. Note that it is preferable that a surface of the single crystal semiconductor substrate 111 be cleaned using a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), or the like. FIG. 3A is an external view illustrating an example of a structure of the first tray 10. Further, FIG. 3B is a cross-sectional view taken along line A-B of FIG. 3A. The first tray 10 is a plate-like member and is provided with a plurality of depression portions 11 for holding the single crystal semiconductor substrates 111. FIGS. 3A and 3B illustrate the first tray 10 for manufacturing the SOI substrate 100 in FIG. 1 and three rows and three columns of depression portions 11 are formed here. As illustrated in FIG. 4, the plurality of single crystal semiconductor substrates 111 is disposed on the first tray 10 so as to fit in the plurality of depression portions 11. Further, the shape of the depression portion 11 is preferably rectangular corresponding to the single crystal semiconductor substrate 111. Note that unless otherwise specified, a square is also included as a rectangle. Note also that a depression portion in this specification includes a portion in a hollow shape, a dent shape, and a groove shape.

The first tray 10 is manufactured using a material which does not change its quality and shape by a heat treatment in a manufacturing process of the SOI substrate 100. For example, the first tray 10 can be manufactured using quartz glass, a semiconductor material such as silicon or silicon carbide, non-alkali glass, or the like.

The thickness of the first tray 10 can be greater than or equal to 1.1 mm and less than or equal to 2 mm Depth D1 of the depression portion 11 is made smaller than the thickness of the single crystal semiconductor substrate 111. Here, the depth D1 of the depression portion 11 can be greater than or equal to 0.2 mm and less than or equal to 0.6 mm, preferably greater than or equal to 0.3 mm and less than or equal to 0.5 mm The first tray 10 preferably has the same size as the base substrate 101. The depression portion 11 has a size that allows the single crystal semiconductor substrate 111 to fit in the depression portion 11. The area of the bottom surface of the depression portion 11 is preferably less than or equal to 1.1 times that of the bottom surface of the single crystal semiconductor substrate 111. In addition, it is preferable that the depression portion 11 have a size that makes a distance between an edge of the single crystal semiconductor substrate 111 and an edge of the depression portion 11 be less than or equal to 1 mm when the single crystal semiconductor substrate 111 fits in the depression portion 11. Note that in the manufacturing method in this embodiment, the size and arrangement of the single crystal semiconductor layers 116 of the SOI substrate 100 depend on the size and arrangement of the depression portions 11 as illustrated in FIG. 4. Note that the bottom surface of the depression portion 11 refers to the surface thereof which is open and faces upward in FIG. 3B and does not refer to the bottom surface of the entire first tray 10.

Figure 5A:
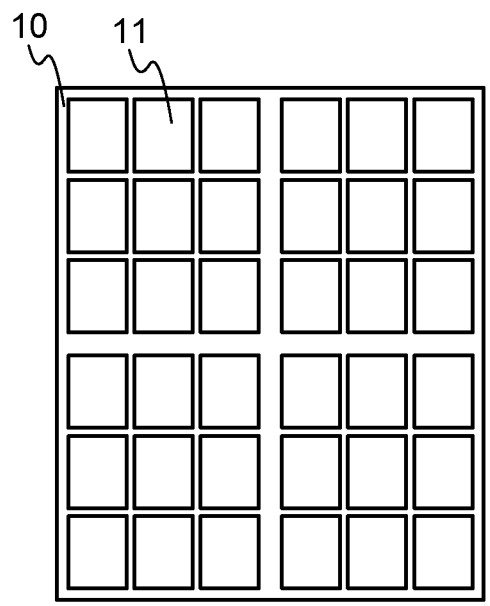
FIGS. 5A and 5B are each a top view illustrating a structural example of a tray.
Figure 5B:
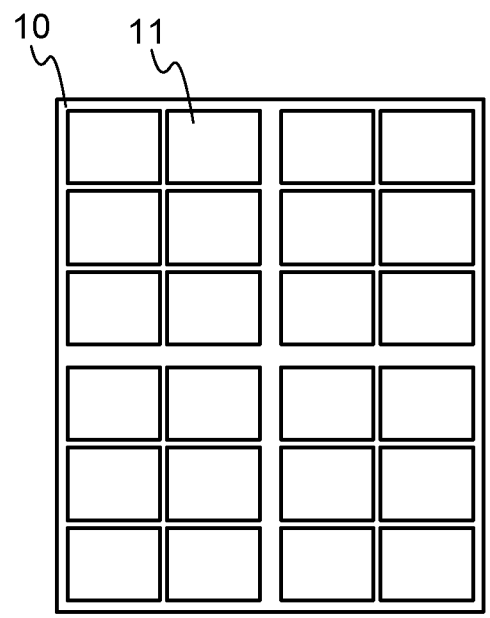
Figure 6A:
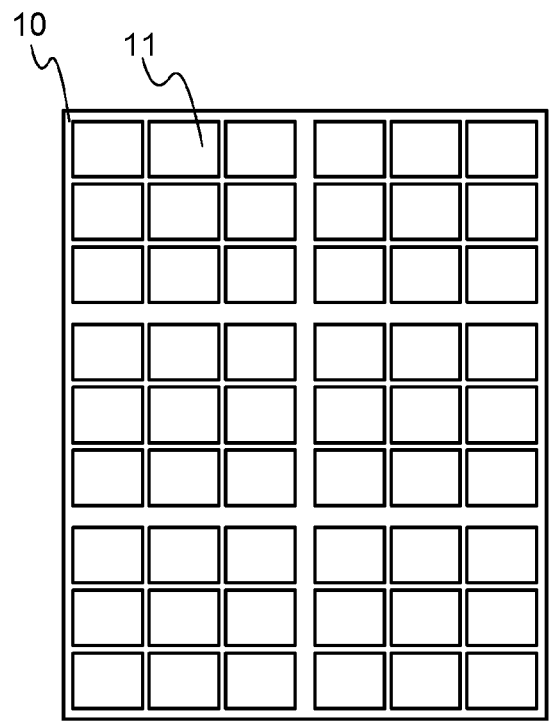
FIGS. 6A and 6B are each a top view illustrating a structural example of a tray.
Figure 6B:
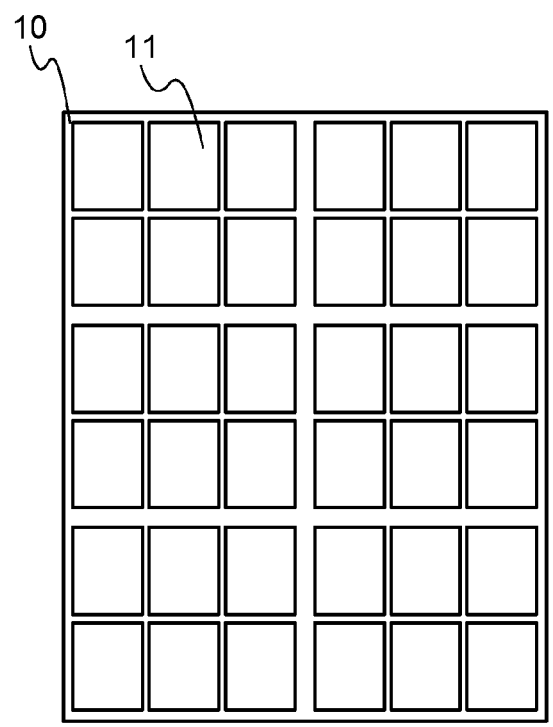

FIGS. 5A and 5B and FIGS. 6A and 6B are top views illustrating structural examples of the first tray 10. FIGS. 5A and 5B is each a top view of the first tray 10 in the case of using a mother glass substrate with a size of 600 mm×720 mm as the base substrate 101 and the size of the first tray 10 is 600 mm×720 mm FIGS. 6A and 6B is each a top view of the first tray 10 in the case of using a mother glass substrate of the fourth generation with the size of 730 mm×920 mm as the base substrate 101 and the size of the first tray 10 is 730 mm×920 mm.

FIG. 5A is a plan view of the first tray 10 in which the size and arrangement of the depression portions 11 are determined so as to correspond with a light exposure region size of four inches on each side of a reduced projection light exposure apparatus. The first tray 10 is divided into four blocks, and nine depression portions 11 are formed in three rows and three columns in each block. Each of the depression portions 11 has a size of 102 mm×82 mm so as to fit in a light exposure region of one shot. In one block, the distances between the adjacent depression portions 11 both in rows and in columns are 11 mm, and the distances from edges of the first tray 10 to edges of the depression portions 11 closest to the edges of the first tray 10 both in a row direction and in a column direction are 16 mm.

FIG. 5B is a plan view of the first tray 10 in which the size and arrangement of the depression portions 11 are determined so as to correspond with a light exposure region size of five inches on each side of a reduced projection light exposure apparatus. The first tray 10 is divided into four blocks, and six depression portions 11 are formed in three rows and two columns in each block. Each of the depression portions 11 has a size of 102 mm×130 mm so as to fit in a light exposure region of one shot. In one block, the distances between the adjacent depression portions 11 in columns are 11 mm, and those in rows are 10 mm The distances from edges of the first tray 10 to edges of the depression portions 11 closest to the edges of the first tray 10 both in a row direction and in a column direction are 16 mm.

FIG. 6A is a plan view of the first tray 10 formed considering the size and arrangement of the depression portions 11 in order to correspond with a light exposure region size of four inches on each side of a reduced projection light exposure apparatus. The first tray 10 is divided into six blocks, and nine depression portions 11 are formed in three rows and three columns in each block. Each of the depression portions 11 has a size of 105 mm×84 mm so as to fit in a light exposure region of one shot. In one block, the distances between the adjacent depression portions 11 in columns are 11 mm, and those in rows are 10 mm The distances from edges of the first tray 10 to edges of the depression portions 11 closest to the edges of the first tray 10 in a column direction are 16 mm, and the distances from edges of the first tray 10 to edges of the depression portions 11 closest to the edges of the first tray 10 in a row direction are 15 mm.

FIG. 6B is a plan view of the first tray 10 formed considering the size and arrangement of the depression portions 11 in order to correspond with a light exposure region size of five inches on each side of a reduced projection light exposure apparatus. The first tray 10 is divided into six blocks, and six depression portions 11 are formed in two rows and three columns in each block. Each of the depression portions 11 has a size of 132 mm×105 mm so as to fit in a light exposure region of one shot. In one block, the distances between the adjacent depression portions 11 in columns are 13 mm and those in rows are 10 mm The distances from edges of the first tray 10 to edges of the depression portions 11 closest to the edges of the first tray 10 both in a row direction and in a column direction are 15 mm.

Figure 7A:
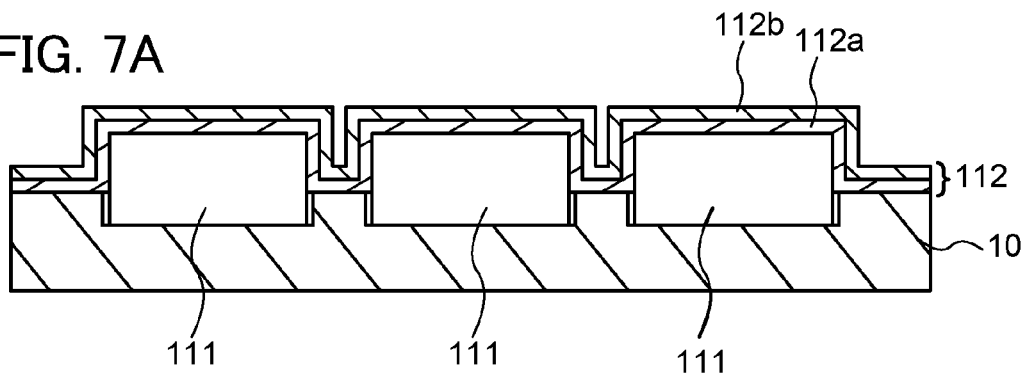
FIGS. 7A to 7D are cross sectional views illustrating a manufacturing method of an SOI substrate according to one embodiment of the present invention.

The insulating layer 112 is formed over the single crystal semiconductor substrates 111 as illustrated in FIG. 7A after the single crystal semiconductor substrates 111 are disposed on the first tray 10 as illustrated in FIG. 4. The insulating layer 112 can have a single-layer structure or a multi-layer structure of two or more layers. The thickness of the insulating layer 112 can be greater than or equal to 5 nm and less than or equal to 400 nm As the insulating layer 112, an insulating film containing silicon or germanium in its composition, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Alternatively, an insulating film made of a metal oxide such as aluminum oxide, tantalum oxide, or hafnium oxide; an insulating film made of a metal nitride such as aluminum nitride; an insulating film made of a metal oxynitride such as an aluminum oxynitride film; or an insulating film made of a metal nitride oxide such as an aluminum nitride oxide film, can be used.

In this specification, the oxynitride refers to a substance which contains more oxygen atoms than nitrogen atoms; whereas the nitride oxide refers to a substance which contains more nitrogen atoms than oxygen atoms. For example, a silicon oxynitride film refers to a film that contains oxygen, nitrogen, silicon, and hydrogen at concentrations of 50 to 70 at. %, 0.5 to 15 at. %, 25 to 35 at. %, and 0.1 to 10 at. %, respectively, when measurements are performed using Rutherford backscattering spectrometry (RBS) and hydrogen forward scattering (HFS). Further, a "silicon nitride oxide film" refers to a film that contains oxygen, nitrogen, silicon, and hydrogen at concentrations of 5 at. % to 30 at. %, 20 at. % to 55 at. %, 25 at. % to 35 at. %, and 10 at. % to 30 at. %, respectively, when they are measured by RBS and HFS. Note that percentages of nitrogen, oxygen, silicon, and hydrogen fall within the ranges given above, where the total number of atoms contained in the silicon oxynitride film or the silicon nitride oxide film is defined as 100 at. %.

The insulating film forming the insulating layer 112 can be formed by a CVD method, a sputtering method, a method of oxidizing or nitriding the single crystal semiconductor substrate 111, or the like.

In the case of using as the base substrate 101a substrate containing an impurity such as an alkali metal or an alkaline-earth metal that reduces reliability of a semiconductor device, the insulating layer 112 is preferably provided with at least one layer of a film that can prevent such an impurity from diffusing into the semiconductor layers of the SOI substrate from the base substrate 101. Examples of such a film include a silicon nitride film, a silicon nitride oxide film, an aluminum nitride film, and an aluminum nitride oxide film. With the provision of such a film, the insulating layer 112 can function as a barrier layer.

For example, in the case where the insulating layer 112 is formed as a barrier layer having a single-layer structure, it can be formed with a silicon nitride film, a silicon nitride oxide film, an aluminum nitride film, or an aluminum nitride oxide film with a thickness of greater than or equal to 5 nm and less than or equal to 200 nm.

In the case of forming the insulating layer 112 as a barrier layer with a two-layer structure, an upper layer is preferably formed of an insulating film with a high barrier function. The upper layer can be formed of a silicon nitride film, a silicon nitride oxide film, an aluminum nitride film, or an aluminum nitride oxide film with a thickness ranging from 5 nm to 200 nm These films have a high blocking effect for preventing impurity diffusion, but their internal stress is also high. Therefore, as an insulating film as a lower layer that is in contact with the single crystal semiconductor substrate 111, it is preferable to select a film that has an effect of alleviating the stress of an insulating film as the upper layer. As such an insulating film, there are a silicon oxide film, a silicon oxynitride film, a thermal oxide film formed by thermal oxidation of the single crystal semiconductor substrate 111, and the like. The insulating film as the lower layer can be formed in a thickness of greater than or equal to 5 nm to less than or equal to 300 nm.

In this embodiment, the insulating layer 112 has a two-layer structure including an insulating film 112a and an insulating film 112b. As a combination of the insulating film 112a and the insulating film 112b which allows the insulating layer 112 to function as a blocking film, for example, the following combinations are given: a silicon oxide film and a silicon nitride film, a silicon oxynitride film and a silicon nitride film, a silicon oxide film and a silicon nitride oxide film, and a silicon oxynitride film and a silicon nitride oxide film.

For example, as the insulating film 112a as the lower layer, a silicon oxynitride film can be formed using $SiH_4$ and $N_2O$ as a process gas by a plasma-enhanced CVD method (hereinafter referred to as a "PECVD method"). Alternatively, as the insulating film 112a, a silicon oxide film can be formed using an organosilane gas and oxygen as a process gas by a PECVD method. Further alternatively, the insulating film 112a can be formed of an oxide film formed by oxidizing the single crystal semiconductor substrate 111.

As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane $(SiH(OC_2H_5)_3)$, or trisdimethylaminosilane $(SiH(N(CH_3)_2)_3)$ can be used.

As the insulating film 112b as the upper layer, a silicon nitride oxide film can be formed using SiH$_4$, N$_2$O, NH$_3$, and H$_2$ as a process gas by a PECVD method. Alternatively, a silicon nitride film can be formed using SiH$_4$, N$_2$, NH$_3$, and H$_2$ for a process gas by a PECVD method.

For example, in the case of forming the insulating film 112a made of silicon oxynitride and the insulating film 112b made of silicon nitride oxide by a PECVD method, the plurality of single crystal semiconductor substrates 111 which is disposed in the first tray 10 is carried into a treatment chamber of a PECVD apparatus. Then, SiH$_4$ and N$_2$O are supplied to the treatment chamber as a process gas for forming the insulating film 112a, and plasma of this process gas is generated, whereby a silicon oxynitride film is formed over the single crystal semiconductor substrate 111. Next, gases introduced into the treatment chamber are switched to gases for a process for forming the insulating film 112b. Here, SiH$_4$, N$_2$O, NH$_3$, H$_2$, and N$_2$O are used. Plasma of a mixed gas of these is generated, and a silicon nitride oxide film is formed over the silicon oxynitride film in succession. In the case where a PECVD apparatus having a plurality of treatment chambers is used, a silicon oxynitride film and a silicon nitride oxide film can be formed in different treatment chambers. Needless to say, by changing a gas introduced into the treatment chamber, a silicon oxide film can be formed as the lower layer and a silicon nitride film can be formed as the upper layer.

By forming the insulating film 112a and the insulating film 112b in the above manner, the insulating layer 112 can be formed over the plurality of single crystal semiconductor substrates 111 in high throughput. In addition, since the insulating films 112a and 112b can be formed without exposure to the atmosphere, the interface between the insulating films 112a and 112b can be prevented from being contaminated by the atmosphere.

Alternatively, an oxide film formed by oxidizing the single crystal semiconductor substrate 111 can be used as the insulating film 112a. A thermal oxidation treatment for forming this oxide film may be dry oxidation, but adding a gas containing halogen into an oxygen atmosphere is preferable. As the gas containing halogen, one type or plural types of gasses selected from the following can be used: HCl, HF, NF$_3$, HBr, Cl$_2$, ClF, BCl$_3$, F$_2$, Br$_2$, and the like.

For example, a heat treatment is performed at a temperature of greater than or equal to 700° C., in an atmosphere containing HCl at 0.5 vol % to 10 vol % (preferably 3 vol %) with respect to oxygen. It is preferable that the thermal oxidation be performed at a heating temperature of greater than or equal to 950° C. and less than or equal to 1100° C. Treatment time may be 0.1 to 6 hours, preferably 2.5 to 3.5 hours. The thickness of the oxide film that is formed can be made to be 15 nm to 1100 nm (preferably 50 nm to 150 nm), for example, 100 nm.

By performing an oxidation treatment in such a temperature range, a gettering effect by a halogen element can be obtained. As the gettering effect, there is an effect of removing a metal impurity in particular. That is, by the action of chlorine, an impurity such as metal turns into volatile chloride, and then is released into an air phase and removed from the single crystal semiconductor substrate 111. In addition, since a dangling bond on the surface of the single crystal semiconductor substrate 111 is terminated with a halogen element used in the oxidation treatment, the localized level density at the interface between the oxide film and the single crystal semiconductor substrate 111 can be reduced.

By this a thermal oxidation treatment in an atmosphere containing halogen, the oxide film can contain halogen. By containing a halogen element at a concentration of $1\times10^{17}$ atoms/cm$^3$ to $5\times10^{20}$ atoms/cm$^3$, the insulating film 112a can manifest a function of a protective film that prevents contamination of the single crystal semiconductor layer 116 by capturing an impurity such as a metal, in the SOI substrate 100.

As an example of a method of forming the insulating film 112a as the lower layer by a thermal oxidation treatment and forming the insulating film 112b as the upper layer by a vapor deposition method such as a PECVD method, the following method can be used: the insulating film 112a is formed by a thermal oxidation treatment before disposing the single crystal semiconductor substrates 111 on the first tray 10, the single crystal semiconductor substrates 111 over which the insulating films 112a of oxide films are formed are disposed on the first tray 10, and then the insulating films 112b are formed.

Figure 7B:
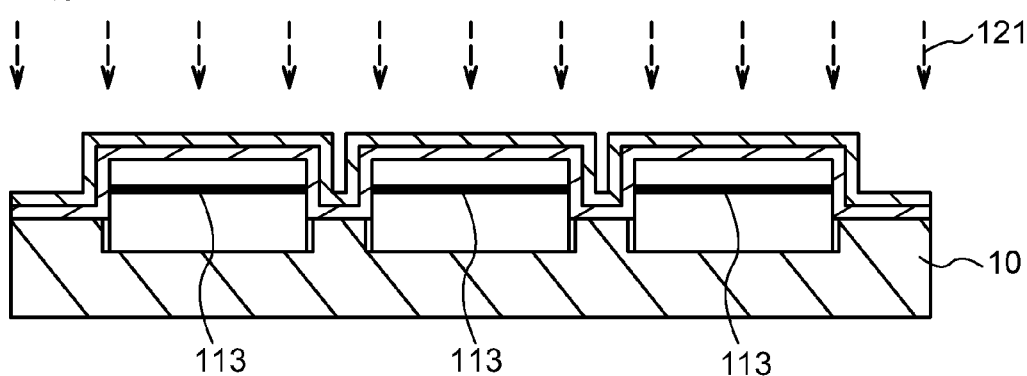

Next, as illustrated in FIG. 7B, an ion beam 121, which is made of ions that are accelerated by an electric field, is emitted to the single crystal semiconductor substrate 111 through the insulating layer 112, to form the embrittlement layer 113 in a region that is at a predetermined depth from a surface of the single crystal semiconductor substrate 111. The ion beam 121 is generated by exciting a source gas to generate plasma of the source gas, and then extracting ions contained in the plasma from the plasma by an effect of an electric field.

The depth at which the embrittlement layer 113 is formed can be adjusted by the acceleration energy of the ion beam 121 and the angle at which the ion beam 121 enters. The acceleration energy can be adjusted by an acceleration voltage, dosage, or the like. The embrittlement layer 113 is formed at the same depth or substantially the same depth as the average depth at which the ions have entered. The thickness of a semiconductor layer which is to be separated from the single crystal semiconductor substrate 111 is determined in accordance with the depth at which the ions are added. The depth at which the embrittlement layer 113 is formed is greater than or equal to 50 nm and less than or equal to 500 nm from the surface of the single crystal semiconductor substrate 111; preferably, greater than or equal to 50 nm and less than or equal to 200 nm from the surface of the single crystal semiconductor substrate 111.

In adding the ions to the single crystal semiconductor substrates 111, it is preferable to use an ion doping method that does not involve mass separation, instead of an ion implantation method that does. This is because takt time for forming the embrittlement layers 113 in the plurality of single crystal semiconductor substrates 111 disposed on the first tray 10 having a large area can be shortened.

The single crystal semiconductor substrates 111 fitted in the first tray 10 are carried into a treatment chamber of an ion doping apparatus. Then, a source gas is excited to generate plasma, and an ion species is extracted from the plasma and accelerated to generate the ion beam 121. The plurality of single crystal semiconductor substrates 111 is irradiated with the ion beam 121, whereby the ions are introduced to a predetermined depth at a high concentration, and the embrittlement layers 113 are formed.

In the case of using hydrogen (H$_2$) for the source gas, the hydrogen gas can be excited to generate plasma containing H$^+$, H$_2^+$, and H$_3^+$. The ratio of ion species generated from the source gas can be varied by adjusting an excitation method of plasma, pressure of an atmosphere in which plasma is generated, supply quantity of a source gas, or the like.

Since H$_3^+$ has a larger number of hydrogen atoms compared with the other hydrogen ion species (H$^+$ and H$_2^+$) and therefore has a larger mass, in the case of being accelerated with the same energy, H$_3^+$ is added in a shallower region of the single crystal semiconductor substrate 111 compared with $H^+$ and $H_2^+$. Therefore, by a high percentage of $H_3^+$ contained in the ion beam 121, variation in the average depth at which the hydrogen ions enter becomes small; accordingly, a concentration profile of hydrogen in a depth direction in the single crystal semiconductor substrate 111 becomes steep, and a peak position of the profile can be made to be shallow. Consequently, it is preferable that $H_3^+$ be preferably contained in the ion beam 121 at greater than or equal to 50%, and more preferably at greater than or equal to 80%, with respect to the total amount of $H^+$, $H_2^+$, and $H_3^+$ contained in the ion beam 121.

In the case of performing ion addition by an ion doping method using hydrogen gas, the acceleration voltage can be greater than or equal to 10 kV and less than or equal to 200 kV, and the dosage can be greater than or equal to $1 \times 10^{16}$ ions/$cm^2$ and less than or equal to $6 \times 10^{16}$ ions/$cm^2$. By adding hydrogen ions under this condition, the embrittlement layer 113 can be formed in a region in the single crystal semiconductor substrate 111 that is at a depth of greater than or equal to 50 nm and less than or equal to 500 nm, although it depends on an ion species contained in the ion beam 121 and the percentage thereof.

For example, in the case where the single crystal semiconductor substrate 111 is a single crystal silicon substrate, the insulating film 112a is a silicon oxynitride film with a thickness of 50 nm, and the insulating film 112b is a silicon nitride oxide film with a thickness of 50 nm, under a condition in which the source gas is hydrogen, the acceleration voltage is 40 kV, and the dosage is $2.2 \times 10^{16}$ ions/$cm^2$, a single crystal semiconductor layer with a thickness of about 120 nm can be peeled off from the single crystal semiconductor substrate 111. Alternatively, when hydrogen ions are added under a condition that is the same as above except for the insulating film 112a being a silicon oxynitride film with a thickness of 100 nm, a single crystal semiconductor layer with a thickness of about 70 nm can be peeled off from the single crystal semiconductor substrate 111.

For the source gas of the ion beam 121, helium (He) can also be used. Most of ion species generated by excitation of helium is $He^+$; therefore, He can be added to the single crystal semiconductor substrate 111 as main ions even by an ion doping method without mass separation. Accordingly, microvoids can be formed efficiently in the embrittlement layer 113 by an ion doping method. In the case of performing ion addition by an ion doping method using helium, the acceleration voltage can be greater than or equal to 10 kV and less than or equal to 200 kV, and the dosage can be greater than or equal to $1 \times 10^{16}$ ions/$cm^2$ and less than or equal to $6 \times 10^{16}$ ions/$cm^2$.

A halogen gas such as chlorine gas ($Cl_2$ gas) or fluorine gas ($F_2$ gas) can be used for the source gas.

Figure 7C:
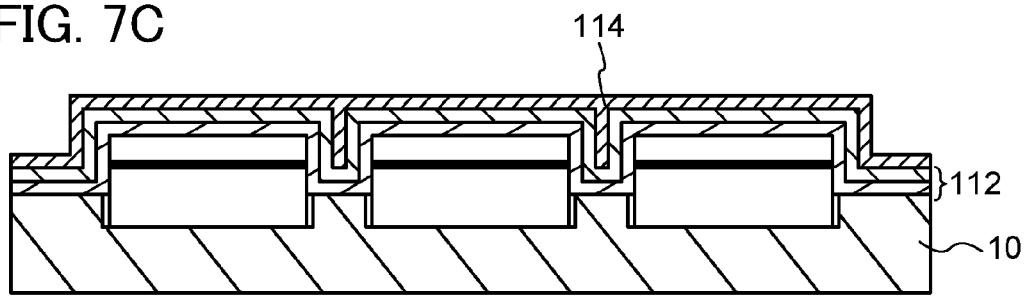

After forming the embrittlement layers 113, the bonding layer 114 is formed over a top surface of the insulating layer 112 as illustrated in FIG. 7C. In a step of forming the bonding layer 114, a heating temperature of the single crystal semiconductor substrates 111 is to be a temperature at which an element or a molecule added to the embrittlement layers 113 does not separate out, and the heating temperature is preferably less than or equal to 350° C. In other words, this heating temperature is a temperature at which gas is not released from the embrittlement layers 113. Note that the bonding layer 114 can be formed before performing the ion addition. In this case, a processing temperature for forming the bonding layer 114 can be greater than or equal to 350° C. In addition, when the insulating layer 112 sufficiently functions as a hydrophilic bonding plane, the insulating layer 112 may be used as a bonding layer without providing the bonding layer 114. For example, a thermal oxide film which is formed as the insulating layer 112 by performing thermal oxidation on the single crystal semiconductor substrate 111 may be used as the bonding plane to the base substrate 101.

The bonding layer 114 is a layer for forming a smooth and hydrophilic bonding plane on each of the surfaces of the single crystal semiconductor substrates 111. Therefore, the mean surface roughness Ra of the bonding layer 114 preferably is less than or equal to 0.7 nm, and more preferably less than or equal to 0.4 nm The thickness of the bonding layer 114 can be greater than or equal to 5 nm and less than or equal to 500 nm; more preferably, the thickness can be greater than or equal to 10 nm and less than or equal to 200 nm.

The bonding layer 114 is preferably an insulating film formed by a chemical vapor reaction. For example, a silicon oxide film, a silicon oxynitride film, a silicon nitride oxide film, a silicon nitride film, or the like can be formed as the bonding layer 114. In the case of forming a silicon oxide film by a PECVD method as the bonding layer 114, an organosilane gas and an oxygen ($O_2$) gas are preferably used as a source gas. By using organosilane as a source gas, a silicon oxide film having a smooth surface can be formed at a process temperature of less than or equal to 350° C. Alternatively, the bonding layer 114 can be formed using a low temperature oxide (LTO) which is formed by a thermal CVD method at a heating temperature of greater than or equal to 200° C. and less than or equal to 500° C. For formation of the LTO, monosilane ($SiH_4$), disilane ($Si_2H_6$), or the like can be used as a silicon source gas, and dinitrogen monoxide ($N_2O$) or the like can be used as an oxygen source gas.

For example, the condition example for forming the bonding layer 114 of a silicon oxide film using TEOS and $O_2$ as a source gas is such that TEOS is introduced into a treatment chamber at a flow rate of 15 sccm and $O_2$ is introduced at a flow rate of 750 sccm. The film formation pressure can be 100 Pa, the film formation temperature can be 300° C., the RF power output can be 300 W, and the power frequency can be 13.56 MHz.

The order of the step of FIG. 7B and the step of FIG. 7C can be reversed. In other words, after forming the insulating layer 112 and the bonding layer 114 over the plurality of single crystal semiconductor substrates 111 disposed on the first tray 10, the embrittlement layers 113 can be formed. In this case, it is preferable that the insulating layer 112 and the bonding layer 114 be formed in succession when the insulating layer 112 and the bonding layer 114 can be formed with the same film formation apparatus.

Further alternatively, after the step of FIG. 7B, the step of FIG. 7A and the step of FIG. 7C can be performed. In other words, after forming the embrittlement layers 113 by doping the plurality of single crystal semiconductor substrates 111 which is disposed on the first tray 10 with ion species, the insulating layer 112 and the bonding layer 114 can be formed. In this case, it is preferable that the insulating layer 112 and the bonding layer 114 be formed in succession when the insulating layer 112 and the bonding layer 114 can be formed with the same film formation apparatus. Alternatively, in order to protect the surfaces of the single crystal semiconductor substrates 111, before forming the embrittlement layers 113, the single crystal semiconductor substrates 111 can be subjected to an oxidation treatment to form an oxide film on the surfaces and the single crystal semiconductor substrates 111 can be doped with ion species through the oxide film. This oxide film is removed after formation of the embrittlement layers 113. Alternatively, the insulating layer 112 can be formed with this oxide film left behind.

Since the single crystal semiconductor substrates 111 are doped with ion species generated from a source gas by an ion doping method of forming the embrittlement layers 113, ion species other than the ion species of the source gas are included in the ion beam 121. Such other ion species are, for example, metal or the like which partly forms a tool or an electrode of a treatment chamber of the ion doping apparatus. Since the other ion species have larger mass than the ion species of the source gas (such as hydrogen or helium), the other ion species are introduced by doping to a surface of a film (the insulating layer 112, the bonding layer 114, or the oxide film) which is formed over the surfaces of the single crystal semiconductor substrates 111. In order to remove the impurities such as the metal, the surface of the film formed over the surfaces of the single crystal semiconductor substrates 111 can be thinly removed by wet etching after the ion doping step.

Figure 7D:
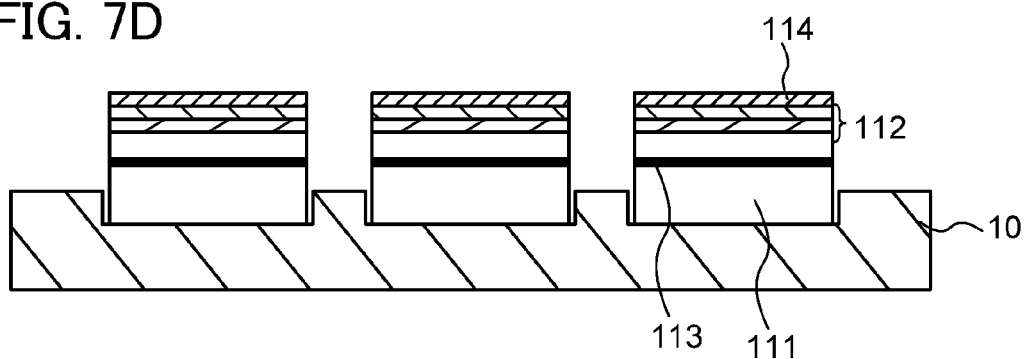

Next, the single crystal semiconductor substrates 111 each provided with the insulating layer 112, the embrittlement layer 113, and the bonding layers 114 are detached from the first tray 10, and the plurality of single crystal semiconductor substrates 111 is cleaned. This cleaning step can be performed by ultrasonic cleaning with pure water. As the ultrasonic cleaning, megahertz ultrasonic cleaning (megasonic cleaning) is preferable. After the ultrasonic cleaning, the single crystal semiconductor substrates 111 may be cleaned with ozone water. By cleaning with ozone water, an organic substance can be removed, and surface activation which improves a hydrophilic property of the surfaces of the bonding layers 114 can be performed. After the cleaning step and the surface activation treatment, the single crystal semiconductor substrates 111 are disposed in the depression portions 11 of the first tray 10 as illustrated in FIG. 7D.

As the activation treatment of the surfaces of the bonding layers 114, an irradiation treatment with an atomic beam or an ion beam, a plasma treatment, or a radical treatment can be performed as well as an ozone treatment or the cleaning with ozone water. When an atomic beam or an ion beam is used, an inert gas neutral atom beam or inert gas ion beam of argon or the like can be used. These treatments can also be performed with the single crystal semiconductor substrates 111 disposed on the first tray 10.

Here, an example of an ozone treatment is described. For example, an ozone treatment can be performed on a surface of an object to be processed by irradiation with ultraviolet (UV) in an atmosphere containing oxygen. An ozone treatment in which ultraviolet irradiation is performed in an atmosphere containing oxygen is also called a UV ozone treatment, an ultraviolet ozone treatment, or the like. In an atmosphere containing oxygen, irradiation with ultraviolet light having a wavelength of less than 200 nm and ultraviolet light having a wavelength greater than or equal to 200 nm is performed, whereby ozone can be generated and singlet oxygen can be generated from the ozone. Irradiation with ultraviolet light having a wavelength of less than 180 nm is performed, whereby ozone can be generated and singlet oxygen can be generated from the ozone.

Examples of reactions which occur by performing irradiation with ultraviolet light having a wavelength of less than 200 nm and ultraviolet light having a wavelength greater than or equal to 200 nm in an atmosphere containing oxygen are described below.

$$O_2 + h\nu(\lambda_1 \text{ nm}) \rightarrow O(^3P) + O(^3P) \tag{1}$$

$$O(^3P) + O_2 \rightarrow O_3 \tag{2}$$

$$O_3 + h\nu(\lambda_2 \text{ nm}) \rightarrow O(^1D) + O_2 \tag{3}$$

In the above reaction formula (1), irradiation with ultraviolet light (hν) having a wavelength ($\lambda_1$ nm) of less than 200 nm in an atmosphere containing oxygen ($O_2$) is performed to generate an oxygen atom ($O(^3P)$) in a ground state. Next, in the reaction formula (2), the oxygen atom ($O(^3P)$) in a ground state and oxygen ($O_2$) react with each other to generate ozone ($O_3$). Then, in the reaction formula (3), irradiation with ultraviolet light having a wavelength ($\lambda_2$ nm) of greater than or equal to 200 nm in an atmosphere containing the generated ozone ($O_3$) is performed to generate singlet oxygen $O(^1D)$ in an excited state. In an atmosphere containing oxygen, irradiation with ultraviolet light having a wavelength of less than 200 nm is performed to generate ozone while irradiation with ultraviolet light having a wavelength of greater than or equal to 200 nm is performed to generate singlet oxygen by decomposing the ozone. The ozone treatment as described above can be performed, for example, by irradiation with light of a low-pressure mercury lamp ($\lambda_1$=185 nm, $\lambda_2$=254 nm) in an atmosphere containing oxygen.

In addition, examples of reactions which occur by performing irradiation with ultraviolet light having a wavelength of less than 180 nm in an atmosphere containing oxygen are described below.

$$O_2 + h\nu(\lambda_3 \text{ nm}) \rightarrow O(^1D) + O(^3P) \tag{4}$$

$$O(^3P) + O_2 \rightarrow O_3 \tag{5}$$

$$O_3 + h\nu(\lambda_3 \text{ nm}) \rightarrow O(^1D) + O_2 \tag{6}$$

In the above reaction formula (4), irradiation with ultraviolet light having a wavelength ($\lambda_3$ nm) of less than 180 nm in an atmosphere containing oxygen ($O_2$) is performed to generate singlet oxygen $O(^1D)$ in an excited state and an oxygen atom ($O(^3P)$) in a ground state. Next, in the reaction formula (5), the oxygen atom ($O(^3P)$) in a ground state and oxygen ($O_2$) react with each other to generate ozone ($O_3$). In the reaction formula (6), irradiation with ultraviolet light having a wavelength ($\lambda_3$ nm) of less than 180 nm in an atmosphere containing the generated ozone ($O_3$) is performed to generate singlet oxygen in an excited state and oxygen. In an atmosphere containing oxygen, irradiation with ultraviolet light having a wavelength of less than 180 nm is performed to generate ozone and to generate singlet oxygen by decomposing the ozone or oxygen. The ozone treatment as described above can be performed, for example, by irradiation with light of a Xe excimer UV lamp ($\lambda_3$=172 nm) in an atmosphere containing oxygen.

Ultraviolet light having a wavelength of less than 200 nm cuts chemical bonds of an organic substance attached to a surface of an object to be processed, whereby the organic substance attached to the surface of the object to be processed or the organic substance whose chemical bonding is cut can be removed by oxidative decomposition by ozone or singlet oxygen generated from the ozone. By performing the ozone treatment as described above, a hydrophilicity and purity of the surface of the object to be processed can be increased, and bonding can be favorably performed.

Ozone is generated by performing irradiation with ultraviolet in an atmosphere containing oxygen. The ozone is effective in removal of the organic substance attached to the surface of the object to be processed. In addition, singlet oxygen is as effective as or even more effective than ozone in removal of the organic substance attached to the surface of the object to be processed. Ozone and singlet oxygen are examples of oxygen in an active state, and are collectively called active oxygen. As described with the above reaction formulae and the like, since there are reactions where ozone is generated in generating singlet oxygen or singlet oxygen is generated from the ozone, here, reactions where singlet oxygen contributes are also called an ozone treatment for the sake of convenience.

Next, the single crystal semiconductor substrates 111 disposed on the first tray 10 and the base substrate 101 are attached. Before attachment, the base substrate 101 is also cleaned. At that time, cleaning with hydrochloric acid and a hydrogen peroxide solution, or megahertz ultrasonic cleaning can be used. Similarly to the bonding layers 114, the surface to be a bonding plane to the base substrate 101 is preferably subjected to a surface activation treatment such as an ozone treatment.

Further, it is preferable that an insulating film be formed over the base substrate 101. Although an insulating film is not necessarily formed over the base substrate 101, impurities such as an alkali metal or an alkaline-earth metal can be prevented from entering the single crystal semiconductor substrates 111 from the base substrate 101 in the case where a silicon nitride film, a silicon nitride oxide film, an aluminum nitride film, an aluminum nitride oxide film, or the like which functions as a barrier film is formed over the surface of the base substrate 101.

FIG. 8A is a cross-sectional view illustrating a bonding step. The base substrate 101 is placed from above the first tray 10 on which the plurality of single crystal semiconductor substrates 111 is disposed, and the base substrate 101 and the plurality of single crystal semiconductor substrates 111 are made to be closely in contact with each other with the bonding layers 114 interposed therebetween. A pressure of about 1 N/cm$^2$ to 500 N/cm$^2$ is applied to one part of the edge of the base substrate 101. This pressure is preferably 1 N/cm$^2$ to 20 N/cm$^2$. The bonding layers 114 and the base substrate 101 start bonding to each other from the pressurized part. Then, all the single crystal semiconductor substrates 111 on the first tray 10 are bonded to one base substrate 101, so that the plurality of single crystal semiconductor substrates 111 can be closely in contact with the base substrate 101. This bonding step can be performed at room temperature without a heat treatment; therefore, a substrate with such low heat resistance as to have an allowable temperature limit of less than or equal to 700° C. like a glass substrate can be used as the base substrate 101.

Since the plurality of single crystal semiconductor substrates 111 is disposed on the first tray 10, there is a case where a surface of the bonding layer 114 is not in contact with the base substrate 101 due to difference in thickness between the single crystal semiconductor substrates 111. Therefore, it is preferable to apply pressure to not one part (one single crystal semiconductor substrate) but to each of the single crystal semiconductor substrates 111. Further, even in the case where there is variation in height between the surfaces of the bonding layers 114 while in the state of the single crystal semiconductor substrates 111 being disposed on the first tray 10, if one part of the bonding layer 114 is closely in contact with the base substrate 101 due to deflection of the base substrate 101, bonding can proceed to the entire surface of the bonding layer 114.

Figure 9:
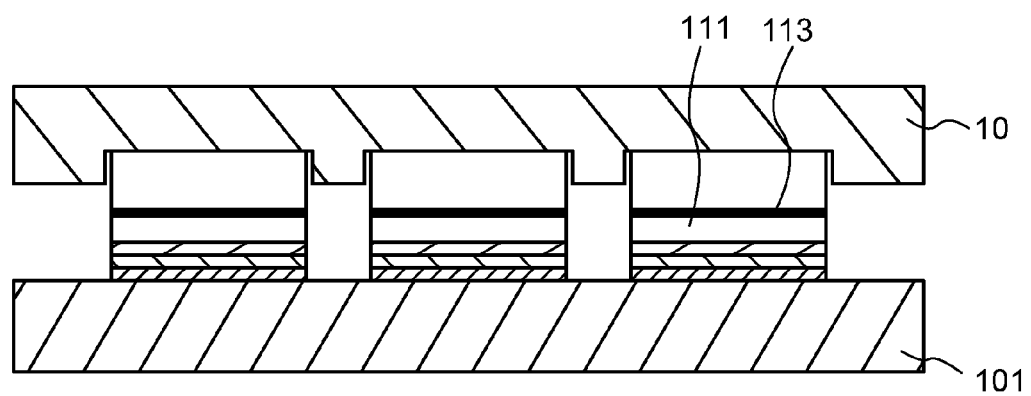
FIG. 9 is a cross sectional view illustrating a manufacturing method of an SOI substrate according to one embodiment of the present invention.

After placing the base substrate 101 above the first tray 10 as illustrated in FIG. 8A, the position of the base substrate 101 may be changed to the bottom as illustrated in FIG. 9. By turning the base substrate 101 and the first tray 10 upside down, the difference in thickness between the single crystal semiconductor substrates 111 can be balanced out, so that the entire surfaces of the bonding layers 114 can be easily made to be in contact with the surface of the base substrate 101.

When the base substrate 101 is placed above the single crystal semiconductor substrates 111 disposed on the first tray 10 as illustrated in FIG. 8A, if the bonding plane is contaminated by dusts or the like, bonding does not occur in the contaminated part. Accordingly, in order to prevent contamination at the bonding plane, placement of the base substrate 101 is preferably conducted in an airtight treatment chamber. In addition, the treatment chamber preferably has a reduced pressure of about $5.0 \times 10^{-3}$ Pa, and the atmosphere at the bonding treatment is preferably kept clean.

Then, as illustrated in FIG. 8B, the first tray 10, which is used in bonding the single crystal semiconductor substrates 111, is detached from the single crystal semiconductor substrates 111 and the base substrate 101 and then a second tray 20 is disposed.

Figure 11A:
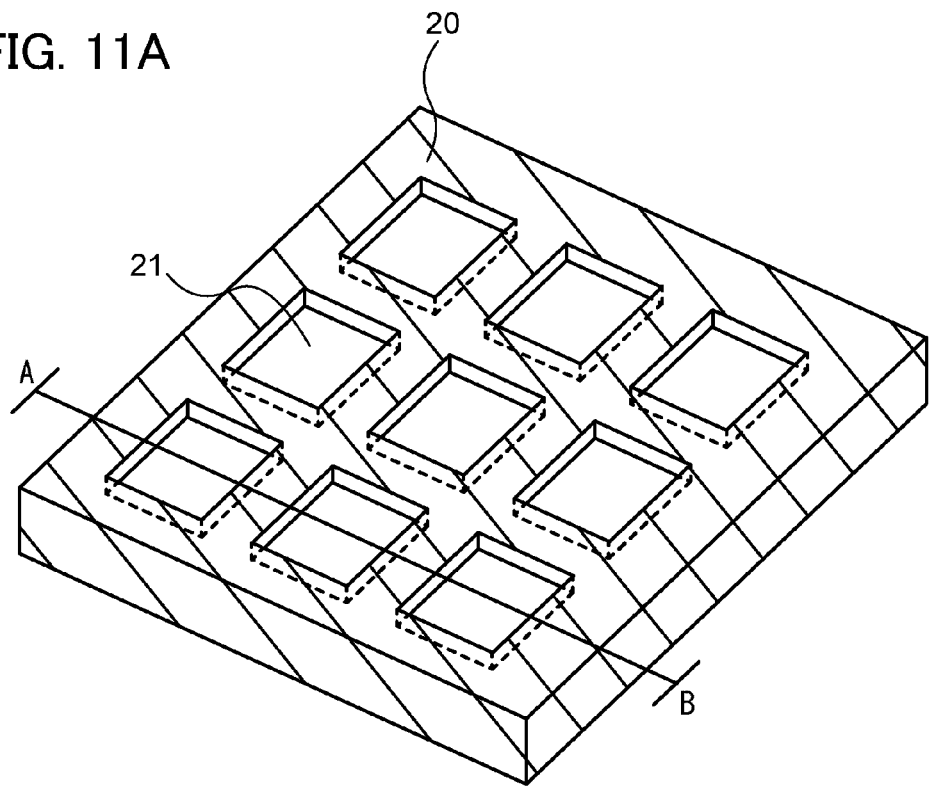
FIGS. 11A and 11B are views illustrating an example of a structure of a tray.
Figure 11B:
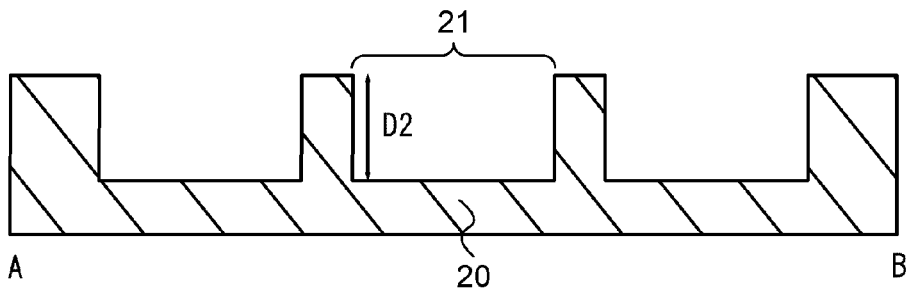

FIGS. 11A and 11B are an external view and a cross-sectional view of the second tray 20. FIG. 11B is a cross-sectional view taken along line A-B of FIG. 11A. The second tray 20 is a plate-like member and is provided with a plurality of depression portions 21 for holding single crystal semiconductor substrates which are to be separated afterwards. Here, depression portions 21 are formed in three rows and three columns here. The second tray is different from the first tray 10 in that depth D2 of the depression portion 21 is made greater than the thickness of the single crystal semiconductor substrate 111. Further, the shape of the depression portion 21 is preferably rectangular corresponding to the single crystal semiconductor substrate 111. Note that unless otherwise specified, a square is also included as a rectangle.

The thickness of the second tray 20 can be greater than or equal to 1.7 mm and less than or equal to 2.9 mm The depth D2 of the depression portion 21 can be greater than or equal to 0.8 mm and less than or equal to 1.5 mm. Note that the second tray 20 preferably has a size similar to that of the first tray 10. In other words, the second tray 20 preferably has the same size as the base substrate 101. The depression portion 21 has a size that allows the single crystal semiconductor substrate 111 (a single crystal semiconductor substrate 117) to fit in the depression portion 21. The area of the bottom surface of the depression portion 21 is preferably less than or equal to 1.1 times that of the bottom surface of the single crystal semiconductor substrate 111 (the single crystal semiconductor substrate 117). In addition, it is preferable that the distance between an edge of the single crystal semiconductor substrate 111 (the single crystal semiconductor substrate 117) and an edge of the depression portion 21 be less than or equal to 1 mm when the single crystal semiconductor substrate 111 (the single crystal semiconductor substrate 117) fits in the depression portion 21. FIGS. 5A and 5B and FIGS. 6A and 6B illustrate not only structural examples of the first tray 10 but also those of the second tray 20. Note that the bottom surface of the depression portion 21 refers to the surface thereof which is open and faces upward in FIG. 11B and does not refer to the bottom surface of the entire second tray 20.

The second tray 20 is manufactured using a material which does not change its quality and shape by a heat treatment in a manufacturing process of the SOI substrate 100. In particular, a material which does not expand much by a heat treatment is preferably selected. For example, the second tray 20 can be manufactured using quartz glass, a semiconductor material such as silicon or silicon carbide, non-alkali glass, or the like.

The second tray 20 described above is disposed so that the depression portion 21 and the single crystal semiconductor substrate 111 overlap with each other as illustrated in FIG. 8B, thereby supporting the base substrate 101 to which the single crystal semiconductor substrates 111 are bonded. Here, the depth D2 of the depression portion 21 of the second tray 20 is greater than the thickness of the single crystal semiconductor substrate 111; therefore, the second tray 20 can support the base substrate 101 without being in contact with the bottom surfaces of the single crystal semiconductor substrates 111.

Since the size of the tray is similar to that of the base substrate 101, the heat distribution easily varies depending on locations. When the single crystal semiconductor substrates 111 are in contact with the tray as illustrated in FIG. 8A, the single crystal semiconductor substrates 111 are easily affected by the heat distribution in the tray. However, when the second tray 20 is used, a contact between the second tray 20 and the bottom surfaces of the single crystal semiconductor substrates 111 is prevented at the time of performing a heat treatment, thereby preventing variation in heat distribution in the single crystal semiconductor substrates 111. Thus, the single crystal semiconductor layers can be separated with the uniform heat distribution in the single crystal semiconductor substrates 111, which enables the single crystal semiconductor layers uniform in quality to be formed over the base substrate 101.

Further, by supporting the base substrate 101 by the second tray 20, the base substrate can be supported not only at the periphery thereof but also at the central portion thereof. As a result, the base substrate can be prevented from being bent at the time of performing a heat treatment, whereby the single crystal semiconductor layers which are uniform in quality can be formed over the base substrate 101.

After the second tray 20 is disposed, a heat treatment is preferably performed in order to increase bond force at a bonding interface between the base substrate 101 and the bonding layers 114. This heat treatment is performed at a temperature at which the embrittlement layers 113 do not crack; specifically, the temperature is within a temperature range of greater than or equal to 200° C. and less than or equal to 450° C. Further, when the single crystal semiconductor substrates 111 are bonded to the base substrate 101 while heating at a temperature in the above-described range, the bond force at the bonding interface between the base substrate 101 and the bonding layer 114 can be made strong.

Next, a heat treatment is performed to cause separation at the embrittlement layers 113 so that single crystal semiconductor layers 115 are separated from the single crystal semiconductor substrates 111. FIG. 8C is a view illustrating a separation step of separating the single crystal semiconductor layers 115 from the single crystal semiconductor substrates 111. The single crystal semiconductor substrates 117 are the single crystal semiconductor substrates 111 from which the single crystal semiconductor layers 115 are separated.

When the heat treatment is performed, the element added by ion doping is separated out into microvoids which are formed in the embrittlement layers 113 by temperature increase, and the pressure in the microvoids is increased. By pressure increase, the volume of the microvoids in the embrittlement layers 113 is changed and a crack is generated in the embrittlement layers 113; accordingly, the single crystal semiconductor substrates 111 are separated along the embrittlement layers 113. Since the bonding layers 114 are bonded to the base substrate 101, the single crystal semiconductor layers 115 separated from the single crystal semiconductor substrates 111 are fixed over the base substrate 101. The temperature of the heat treatment for separating the single crystal semiconductor layers 115 from the single crystal semiconductor substrates 111 is set at a temperature which does not exceed a strain point of the base substrate 101. The single crystal semiconductor substrates 117 from which the single crystal semiconductor layers 115 are separated by the heat treatment are held in the depression portions 21 provided in the second tray 20.

As illustrated in FIG. 8C, the peripheral portions of the single crystal semiconductor substrates 111 are not bonded to the base substrate 101 in many cases. The reason can be as follows: at the time of the planarization of the single crystal semiconductor substrates 111, a region having a smaller thickness of the substrate and which has a lower level of planarity than the center, which is referred to as edge roll-off (E.R.O), is formed in the peripheral portions of the single crystal semiconductor substrates 111; the peripheral portions of the single crystal semiconductor substrates 111 have a chamfered portion; or the peripheral portions of the bonding layers 114 are damaged or soiled at the time of transferring the single crystal semiconductor substrates 111. Accordingly, the base substrate 101 and the bonding layers 114 are not in a close contact with each other and it is estimated that separation along the embrittlement layers 113 is not easily performed in the peripheral portions of the single crystal semiconductor substrates 111. Thus, the single crystal semiconductor layer 115 whose size is smaller than that of the single crystal semiconductor substrate 111 is bonded to the base substrate 101 and a projection portion 130 is formed at the peripheral portion of the single crystal semiconductor substrate 117. The projection portion 130 includes a remaining embrittlement layer 133, a remaining single crystal semiconductor layer 135, a remaining insulating layer 132 (a remaining insulating film 132b and a remaining insulating film 132a) and a remaining bonding layer 134, which are not bonded to the base substrate 101.

Moreover, also in the remaining embrittlement layer 133, the microvoids are expanded by pressure increase therein by the heat treatment and burst in some cases. By this burst, the remaining single crystal semiconductor layer 135, the remaining insulating layer 132 (the remaining insulating film 132b and the remaining insulating film 132a) and the remaining bonding layer 134 over the remaining embrittlement layer 133 are scattered and attached to the single crystal semiconductor layer 115 as contaminants or to damage the single crystal semiconductor layer 115 in some cases. This occurs more remarkably when the single crystal semiconductor substrate 117 which is separated from the single crystal semiconductor layer 115 moves in a direction parallel to a surface of the substrate so that the projection portion 130 overlaps with the single crystal semiconductor layer 115.

In this embodiment, however, the depression portion 21 is made to have a size that allows the single crystal semiconductor substrate 111 to fit in the depression portion 21 and the area of the bottom surface of the depression portion 21 is made less than or equal to 1.1 times that of the bottom surface of the single crystal semiconductor substrate 111; therefore, there is very little spatial room allowing the separated single crystal semiconductor substrate 117 to move in a direction parallel to a surface of the substrate with respect to the single crystal semiconductor layer 115. In this manner, the single crystal semiconductor substrate 117 is disposed in a position by which the projection portion 130 does not overlap with the single crystal semiconductor layer 115, whereby contaminants are prevented from attaching to the single crystal semiconductor layer 115 and the single crystal semiconductor layer 115 is prevented from being damaged and the single crystal semiconductor layers which are uniform in quality can be formed over the base substrate 101.

For the heat treatment, a rapid thermal annealing (RTA) apparatus, a resistance heating furnace, or a microwave heating apparatus can be used. As the RTA apparatus, a gas rapid thermal annealing (GRTA) apparatus or a lamp rapid thermal annealing (LRTA) apparatus can be used. It is preferable that the temperature of the base substrate 101 to which the single crystal semiconductor layers 115 are bonded is set so as not to exceed the strain point of the base substrate 101 and increased to a temperature of greater than or equal to 550° C. and less than or equal to 650° C. by this heat treatment.

In the case of using a GRTA apparatus, the heating temperature can be greater than or equal to 550° C. and less than or equal to 650° C., and the treatment time can be greater than or equal to 0.5 minutes and less than or equal to 60 minutes. In the case of using a resistance heating device, the heating temperature can be greater than or equal to 200° C. and less than or equal to 650° C., and the treatment time can be greater than or equal to two hours and less than or equal to four hours. In the case of using a microwave heating apparatus, for example, the treatment time can be greater than or equal to ten minutes and less than or equal to 20 minutes with a microwave having a frequency of 2.45 GHz.

A specific treatment method of a heat treatment using a vertical furnace with resistance heating is described. Together with the second tray 20, the base substrate 101 (FIG. 8B) to which the single crystal semiconductor substrates 111 are bonded is placed in a boat of the vertical furnace. This boat is carried into a chamber of the vertical furnace. First, the chamber is exhausted to have a vacuum state so that oxidation of the single crystal semiconductor substrates 111 is suppressed. The degree of vacuum is approximately $5\times10^{-3}$ Pa. After making the vacuum state, nitrogen is supplied to the chamber so that the chamber has a nitrogen atmosphere that is under atmospheric pressure. During this, the temperature is increased to 200° C.

After making the chamber have a nitrogen atmosphere that is under atmospheric pressure, heating at 200° C. is performed for two hours. Then, the temperature is increased to 400° C. in one hour. After the state at a heating temperature of 400° C. stabilizes, the temperature is increased to 600° C. in one hour. After the state at a heating temperature of 600° C. stabilizes, a heat treatment at 600° C. is performed for two hours. Then, the temperature is decreased to 400° C. in one hour; and after 10 minutes to 30 minutes, the boat is carried out of the chamber. The single crystal semiconductor substrates 117 disposed on the second tray 20 and the base substrate 101 to which the single crystal semiconductor layers 115 are bonded that are in the boat are cooled in air atmosphere.

As the heat treatment using the above-described resistance heating furnace, a heat treatment for increasing the bond force between the bonding layers 114 and the base substrate 101 and a heat treatment for causing separation at the embrittlement layers 113 are sequentially performed. In the case where these two heat treatments are performed with different apparatuses, for example, a heat treatment at a treatment temperature of 200° C. is performed for a treatment time of two hours in a resistance heating furnace, and the base substrate 101 and the single crystal semiconductor substrates 111, which are bonded to each other, are carried out of the furnace. Then, a heat treatment at a treatment temperature of greater than or equal to 600° C. and less than or equal to 700° C. is performed for a treatment time of greater than or equal to one minute and less than or equal to 30 minutes with an RTA apparatus, so that the single crystal semiconductor substrates 111 are separated at the embrittlement layers 113. For example, the heat treatment may be performed at a treatment temperature of 650° C. for a treatment time of five minutes.

In order that the bonding layers 114 and the base substrate 101 are firmly bonded to each other by a treatment with such a low temperature of less than or equal to 700° C., it is preferable that an OH group or a water molecule ($H_2O$) exist on the surfaces of the bonding layers 114 or the surface of the base substrate. This is because the bonding layers 114 and the base substrate 101 start bonding to each other by formation of a covalent bond (covalent bond between an oxygen and a hydrogen) or a hydrogen bond by the OH group or the water molecule.

Accordingly, the surfaces of the bonding layers 114 and the base substrate 101 are preferably activated to be hydrophilic. Further, the bonding layers 114 are preferably formed by such a method as to contain oxygen or hydrogen. For example, when a silicon oxide film, a silicon oxynitride film, a silicon nitride oxide film, a silicon nitride film, or the like is formed by a PECVD method at a treatment temperature of 400° C. or lower, the film can contain hydrogen. For formation of the silicon oxide film or the silicon oxynitride film, $SiH_4$ and $N_2O$ may be used, for example, as a process gas. For formation of the silicon nitride oxide film, $SiH_4$, $NH_3$, and $N_2O$ may be used, for example. For formation of the silicon nitride film, $SiH_4$ and $NH_3$ may be used, for example. Further, it is also preferable to use a compound including an OH group such as TEOS (chemical formula: $Si(OC_2H_5)_4$) as a source material in formation by a PECVD method.

Here, a treatment with a low temperature of less than or equal to 700° C. is performed because the treatment temperature is lower than an allowable temperature limit of a glass substrate. Note that in forming an SOI substrate by Smart Cut (registered trademark), a heat treatment at greater than or equal to 800° C. is performed in order to bond a single crystal silicon layer to a single crystal silicon wafer, and a heat treatment at a temperature higher than the allowable temperature limit of a glass substrate is needed.

When a substrate which greatly shrinks by heat is used as the base substrate 101, thermal shrinkage due to temperature increase is, in some cases, a problem in a manufacturing process of the SOI substrate 100 and a manufacturing process of a semiconductor device. In such a case, the influence of the problem can be suppressed by heating the base substrate 101 before bonding the single crystal semiconductor substrates 111 so as to cause thermal shrinkage in advance. This heat treatment can be, for example, performed in such a manner that heating at 640° C. is conducted for four hours in a resistance heating device and then cooling at a rate of 0.2° C./minute is conducted. Alternatively, the heat treatment can be performed with a GRTA apparatus in such a manner that heating at 650° C. for six minutes is repeated three to five times. Note that if the base substrate 101 can thermally shrink by the heat treatment of FIG. 8C for separating the single crystal semiconductor substrates 111, it is not necessary to perform the heat treatment before bonding.

Figure 10A:
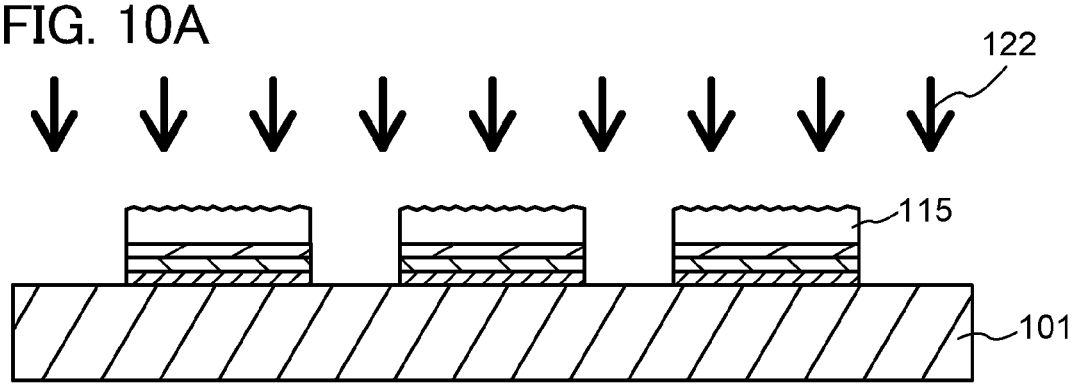
FIGS. 10A and 10B are cross-sectional views of a manufacturing method of an SOI substrate according to one embodiment of the present invention.

Here, crystal defects are formed in the single crystal semiconductor layers 115, which are closely in contact with the base substrate 101, due to formation at the embrittlement layers 113 and separation of the embrittlement layers 113. In addition, the planarity of surfaces of the single crystal semiconductor layers 115 is deteriorated. For reduction of the crystal defects and improvement in the planarity of the surfaces, the single crystal semiconductor layers 115 are preferably irradiated with a laser beam 122 as illustrated in FIG. 10A.

Figure 10B:
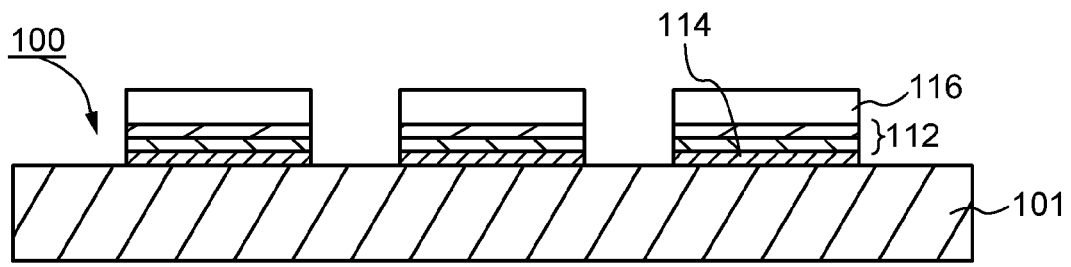

By irradiation with the laser beam 122 from the single crystal semiconductor layers 115 side, the single crystal semiconductor layers 115 are melted from their upper surfaces. After melting, the single crystal semiconductor layers 115 are cooled and solidified; accordingly, single crystal semiconductor layers 116 having upper surfaces with improved planarity are formed as illustrated in FIG. 10B. The external view of FIG. 10B is FIG. 1.

In this laser beam irradiation step, since the laser beam 122 is used, temperature increase of the base substrate 101 is suppressed. As a result, a substrate having low heat resistance like a glass substrate can be used as the base substrate 101. It is preferable that the single crystal semiconductor layers 115 be partially melted by irradiation with the laser beam 122. If the single crystal semiconductor layers 115 are completely melted, recrystallization of the single crystal semiconductor layers 115 is accompanied with disordered nucleation of the single crystal semiconductor layers 115 in a liquid phase and crystallinity of the single crystal semiconductor layers 115 is lowered. By partial melting, so-called longitudinal growth in which crystal growth proceeds from a solid portion which is not melted occurs in the single crystal semiconductor layers 115. Due to recrystallization by the longitudinal growth, crystal defects of the single crystal semiconductor layers 115 are decreased and crystallinity thereof is recovered. Note that the state where the single crystal semiconductor layers 115 are completely melted indicates, in the case of the stacked-layer structure of FIG. 10A, that the portion from the upper surface of the single crystal semiconductor layers 115 to the interface with the bonding layers 114 is melted and is in a liquid phase. On the other hand, the state where the single crystal semiconductor layers 115 are partially melted indicates that the upper layer thereof is melted and is in a liquid phase and a lower layer thereof is in a solid phase.

As a laser apparatus of the laser beam 122, a laser apparatus capable of oscillating a laser beam having an oscillation wavelength of from an ultraviolet region to a visible light region is selected. The laser beam 122 has such a wavelength as to be absorbed by the single crystal semiconductor layers 115. The wavelength can be determined in consideration of the skin depth of the laser beam or the like. For example, the wavelength can be in the range of greater than or equal to 250 nm and less than or equal to 700 nm.

The laser apparatus can be a continuous wave laser, a pseudo continuous wave laser, or a pulsed laser. A pulsed laser is preferable for partial melting. For example, in the case of a pulsed laser, the repetition rate is greater than or equal to 1 MHz and the pulse width is greater than or equal to 10 nanoseconds and less than or equal to 500 nanoseconds. For example, a XeCl excimer laser with a repetition rate of 10 Hz to 300 Hz, a pulse width of 25 nanoseconds, and a wavelength of 308 nm can be used.

In addition, the energy of the laser beam 122 can be determined in consideration of the wavelength of the laser beam 122, the skin depth of the laser beam 122, the thickness of the single crystal semiconductor substrates 111, and the like. The energy of the laser beam 122 can be, for example, in the range of greater than or equal to 300 mJ/cm$^2$ and less than or equal to 800 mJ/cm$^2$. For example, in the case where the thickness of the single crystal semiconductor layers 115 is approximately 120 nm, a pulsed laser is used as the laser apparatus, and the wavelength of the laser beam 122 is 308 nm, the energy density of the laser beam 122 can be 600 mJ/cm$^2$ to 700 mJ/cm$^2$.

Irradiation with the laser beam 122 is preferably performed in an inert atmosphere such as a rare gas atmosphere or a nitrogen atmosphere or in a vacuum state. In order to perform irradiation with the laser beam 122 in an inert atmosphere, irradiation with the laser beam 122 may be performed in an airtight chamber while the atmosphere in the chamber is controlled. In the case where the chamber is not used, by blowing an inert gas such as a nitrogen gas or a rare gas to the surface irradiated with the laser beam 122, irradiation with the laser beam 122 in an inert atmosphere can be realized.

The inert atmosphere such as nitrogen and a vacuum state have higher effect of improving planarity of the single crystal semiconductor layers 116 than the air atmosphere. In addition, since the inert atmosphere and the vacuum state have higher effect of suppressing generation of cracks and ridges than the air atmosphere, the applicable energy range for the laser beam 122 is widened.

By an optical system, the energy distribution of the laser beam 122 is preferably homogenized and the cross section of the laser beam 122 is preferably made to be linear. Thus, homogeneous irradiation with the laser beam 122 can be performed in high throughput. When the beam length of the laser beam 122 is longer than one side of the base substrate 101, all the single crystal semiconductor layers 115 bonded to the base substrate 101 can be irradiated with the laser beam 122 by scanning once. In the case where the beam length of the laser beam 122 is shorter than one side of the base substrate 101, the beam length may be made to be long enough that all the single crystal semiconductor layers 115 bonded to the base substrate 101 can be irradiated with the laser beam 122, by performing scanning a plurality of times.

Note that before irradiating the single crystal semiconductor layers 115 with the laser beam 122, a treatment for removing an oxide film such as a natural oxide film formed on the surfaces of the single crystal semiconductor layers 115 is preferably performed. The oxide film is removed because even if irradiation with the laser beam 122 is performed in the state that the oxide film remains on the surfaces of the single crystal semiconductor layers 115, the surfaces of the single crystal semiconductor layers 115 are not planarized sufficiently. The treatment for removing the oxide film can be performed by processing the single crystal semiconductor layers 115 with a hydrofluoric acid solution. The treatment with hydrofluoric acid is desirably performed until the surfaces of the single crystal semiconductor layers 115 exhibit a water-repellent property. By exhibition of the water-repellent property, removal of the oxide film from the single crystal semiconductor layers 115 can be confirmed.

The irradiation step with the laser beam 122 illustrated in FIG. 10A can be performed in the following manner. First, the single crystal semiconductor layer 115 is treated with 100-fold diluted hydrofluoric acid for 110 seconds to remove the oxide film on the surface. As the laser apparatus of the laser beam 122, a XeCl excimer laser (wavelength: 308 nm, pulse width: 25 nanoseconds, repetition rate: 60 Hz) is used. By an optical system, the laser beam 122 is shaped into a linear shape with a cross section of 300 mm×0.34 mm The single crystal semiconductor layers 115 are irradiated with the laser beam 122 with a scanning speed of the laser beam 122 of 2.0 mm/second, a scanning pitch of 33 μm, and a shot number of about 10. Scanning with the laser beam 122 is performed while blowing a nitrogen gas to the irradiation surface. Since the beam length of the laser beam 122 is 300 mm, in the case where the base substrate 101 has a size of 730 mm×920 mm, the irradiation region of the laser beam 122 is divided into three regions. In this manner, all the single crystal semiconductor layers 115 bonded to the base substrate 101 can be irradiated with the laser beam 122.

The surfaces of the single crystal semiconductor layers 116, which are irradiated with the laser beam 122, are planarized, and the arithmetical mean roughness of unevenness on the surfaces can be greater than or equal to 1 nm and less than or equal to 7 nm. In addition, the root-mean-square roughness of the unevenness can be greater than or equal to 1 nm and less than or equal to 10 nm. Further, the maximum difference in height of the unevenness can be greater than or equal to 5 nm and less than or equal to 250 nm That is, the irradiation treatment with the laser beam 122 can be regarded as a planarization treatment of the single crystal semiconductor layers 115.

The surface of the single crystal semiconductor layer 116 is planarized in this manner, whereby the thickness of a gate insulating film which is formed over the single crystal semiconductor layer 116 can be thinned to about 5 nm to 50 nm. Accordingly, a transistor having high ON current at the same time as having a suppressed gate voltage can be formed.

Although chemical mechanical polishing (abbr. CMP) is known as the planarization treatment, in the case of using a mother glass substrate as the base substrate 101, it is difficult to perform a planarization treatment on the single crystal semiconductor layers 115 by CMP because the mother glass substrate has a large area and distortion. Since an irradiation treatment with the laser beam 122 is performed as the planarization treatment in this embodiment, the single crystal semiconductor layers 115 can be planarized without using a way of applying force which would break the mother glass substrate or a way of heating the mother glass substrate at a temperature exceeding an allowable temperature limit thereof.

After irradiation with the laser beam 122, the single crystal semiconductor layers 116 are preferably subjected to a heat treatment at a temperature of greater than equal to 500° C. and less than or equal to 650° C. By this heat treatment, defects in the single crystal semiconductor layers 116, which have not been recovered by the irradiation with the laser beam 122, can be eliminated and distortion of the single crystal semiconductor layers 116, which also have not been recovered by the irradiation with the laser beam 122, can be alleviated. For the heat treatment, a rapid thermal annealing (RTA) apparatus, a resistance heating furnace, or a microwave heating apparatus can be used. As the RTA apparatus, a gas rapid thermal annealing (GRTA) apparatus or a lamp rapid thermal annealing (LRTA) apparatus can be used. In the case of using a resistance heating furnace, heating at a temperature of 500° C. may be performed for one hour and then heating at 550° C. may be performed for four hours.

Further, the single crystal semiconductor layers 116 may be etched so that planarization of the surfaces is realized. The followings are examples of a dry-etching method which is used in this embodiment: a reactive ion etching (RIE) method; an ICP (inductively coupled plasma) etching method; an ECR (electron cyclotron resonance) etching method; a parallel plate (capacitive coupled plasma) etching method; a magnetron plasma etching method; a dual-frequency plasma etching method; a helicon wave plasma etching method; or the like.

For example, when ICP etching is used, etching may be performed under the following conditions: the flow rate of chlorine, which is an etching gas: 40 sccm to 100 sccm; power applied to a coil type electrode: 100 W to 200 W; the power applied to a lower electrode (on the bias side): 40 W to 100 W; and the reaction pressure: 0.5 Pa to 1.0 Pa. In this embodiment, the single crystal semiconductor layer 115 is thinned to have a thickness of about 50 nm to 60 nm by performing the etching under the condition where the flow rate of chlorine as an etching gas is 100 sccm, the reaction pressure is 1.0 Pa, the temperature of the lower electrode is 70° C., the RF (13.56 MHz) electric power applied to the coil-shaped electrode is 150 W, the electric power applied to the lower electrode (on the bias side) is 40 W, and the etching time is about 25 seconds to 27 seconds. As the etching gas, a chloride gas such as chlorine, boron chloride, silicon chloride or carbon tetrachloride; a fluoride gas such as carbon tetrafluoride, sulfur fluoride, or nitrogen fluoride; or oxygen may be used as appropriate.

Alternatively, the single crystal semiconductor layers 115 may be etched before irradiation with the laser beam. In the case where the surfaces of the single crystal semiconductor layers 116 are etched after irradiation with the laser beam, it is not necessary that surfaces of the single crystal semiconductor layers 115 be etched before irradiation with the laser beam. Further, in the case where surfaces of the single crystal semiconductor layers 115 are etched before irradiation with the laser beam, it is not necessary that surfaces of the single crystal semiconductor layers 116 be etched after irradiation with the laser beam. Further alternatively, etching may be performed both before and after irradiation with the laser beam.

By the etching, the thickness of the single crystal semiconductor layer 116 can be reduced to be optimal for a semiconductor element to be formed later and the surface of the single crystal semiconductor layer 116 can be planarized, as well.

By the above process, an SOI substrate can be provided in which a plurality of single crystal semiconductor layers uniform in quality is formed over a substrate having a larger area than a single crystal silicon substrate. By using an SOI substrate described in this embodiment, for example, productivity of a semiconductor device such as a semiconductor integrated circuit can be improved.

In this embodiment, at the time of a heat treatment for separating the single crystal semiconductor substrates 111, the second tray 20, whose depression portions each has a greater depth than the first tray 10 which is used for bonding, is used whereby a heat treatment can be performed without a contact between the single crystal semiconductor substrates 111 and the second tray 20. Thus, the single crystal semiconductor layers 115 can be separated with the uniform heat distribution in the single crystal semiconductor substrates 111, which enables the single crystal semiconductor layers 115 uniform in quality to be formed over the base substrate 101.

In addition in this embodiment, at the time of the heat treatment for separating the single crystal semiconductor substrates 111, by using the second tray 20 in which the depression portion 21 has a size that allows the single crystal semiconductor substrate 111 to fit in the depression portion 21 and the area of the bottom surface of the depression portion 21 is made less than or equal to 1.1 times that of the bottom surface of the single crystal semiconductor substrate 111, the projection portion 130 of the single crystal semiconductor substrate 117 can be prevented from being located at a position overlapping with the single crystal semiconductor layer 115. In this manner, contaminants attaching to or damage to the single crystal semiconductor layer 115 due to bursting of the remaining the embrittlement layer 133 of the separated single crystal semiconductor substrate 117 can be prevented.

In this embodiment, the insulating layers 112, the embrittlement layers 113, and the bonding layers 114 are formed, with the plurality of single crystal semiconductor substrates 111 placed on the first tray 10. Therefore, the plurality of single crystal semiconductor substrates 111 can be processed collectively; accordingly, the SOI substrate 100 can be formed in high throughput. Note that formation of the insulating layers 112, the embrittlement layers 113, and the bonding layers 114 can also be performed without placing the single crystal semiconductor substrates 111 on the first tray 10.

Since the base substrate 101 is bonded to the single crystal semiconductor substrates 111, with the single crystal semiconductor substrates 111 placed on the first tray 10, the plurality of single crystal semiconductor substrates 111 can be easily bonded to desired positions of the base substrate 101 in high throughput.

Since the steps from FIG. 7A up to and including FIG. 10B can be performed at temperatures of less than or equal 700° C., a glass substrate having an allowable temperature limit of less than or equal to 700° C. can be used as the base substrate 101. Since an inexpensive glass substrate can be used, the material cost of the SOI substrate 100 can be reduced. Furthermore, since a large-area substrate like a mother glass substrate (500 mm×500 mm or larger, preferably 600 mm×700 mm or larger, and more preferably 700 mm×900 mm or larger) can be used as the base substrate, a large-area SOI substrate having single crystal semiconductor layers can be provided.

The steps from FIG. 7A up to and including FIG. 7C are performed without moving the single crystal semiconductor substrates 111 to another first tray 10; however, in each step of FIG. 7A up to and including FIG. 7C, the single crystal semiconductor substrates 111 may be placed on a first tray 10 special for an apparatus used in the step. For example, a first tray 10 special for a PECVD apparatus may be used in formation step of the insulating layer 112 of FIG. 7A, and a first tray 10 special for a doping apparatus may be used in the step of FIG. 7B.

Alternatively, after the formation step of the insulating layer 112 of FIG. 7A, the single crystal semiconductor substrates 111 over which the insulating layer 112 is formed can be detached from the first tray 10, and a cleaning treatment such as an ultrasonic cleaning can be performed on the single crystal semiconductor substrates 111. After the cleaning treatment, the single crystal semiconductor substrates 111 can be disposed on a different clean first tray 10 as well.

Further alternatively, after the formation step of the embrittlement layers 113 of FIG. 7B, the single crystal semiconductor substrates 111 in each of which the embrittlement layer 113 is formed can be detached from the first tray 10, and a cleaning treatment such as ultrasonic cleaning can be performed on the single crystal semiconductor substrates 111. After the cleaning treatment, the single crystal semiconductor substrates 111 can be disposed on a different clean first tray 10.

Note that the structure described in this embodiment can be combined with any of the structures described in other embodiments as appropriate.

Embodiment 2

In this embodiment, a manufacturing method of an SOI substrate in which a plurality of single crystal semiconductor layers are provided over a substrate is described in the case where a tray different from that in Embodiment 1 is used at the time of a heat treatment for separating single crystal semiconductor substrates.

First, in a manner similar to that in Embodiment 1, the single crystal semiconductor substrates 111 are bonded to the base substrate 101 as illustrated in FIG. 8A.

Figure 12A:
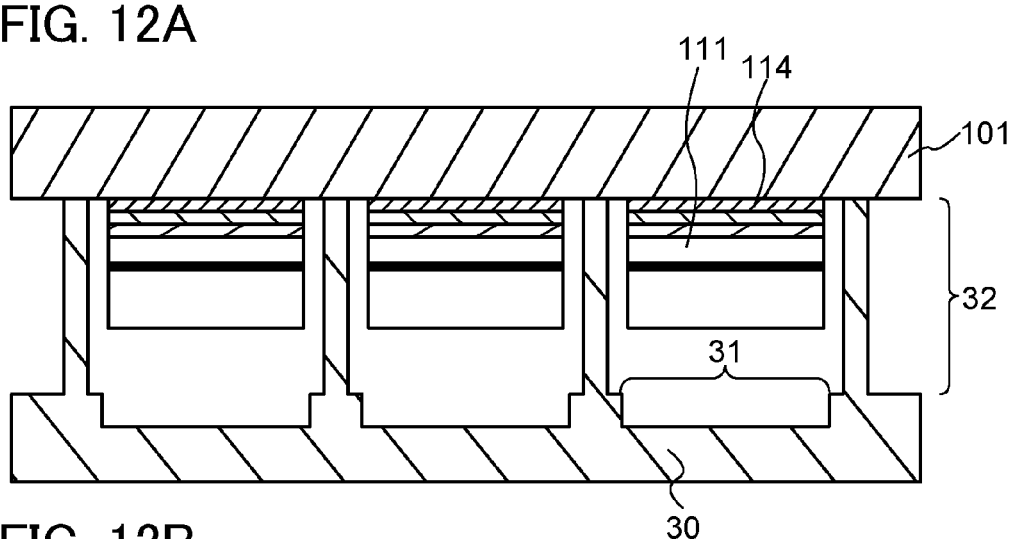
FIGS. 12A and 12B are cross-sectional views of a manufacturing method of an SOI substrate according to one embodiment of the present invention.

Then, as illustrated in FIG. 12A, the first tray 10, which is used in bonding the single crystal semiconductor substrates 111, is detached from the single crystal semiconductor substrates 111 and the base substrate 101 and a third tray 30 is disposed. Note that in this embodiment, the tray which is used after the first tray is called the third tray 30 so as to be distinguished from the second tray 20 which is used in Embodiment 1.

Figure 13A:
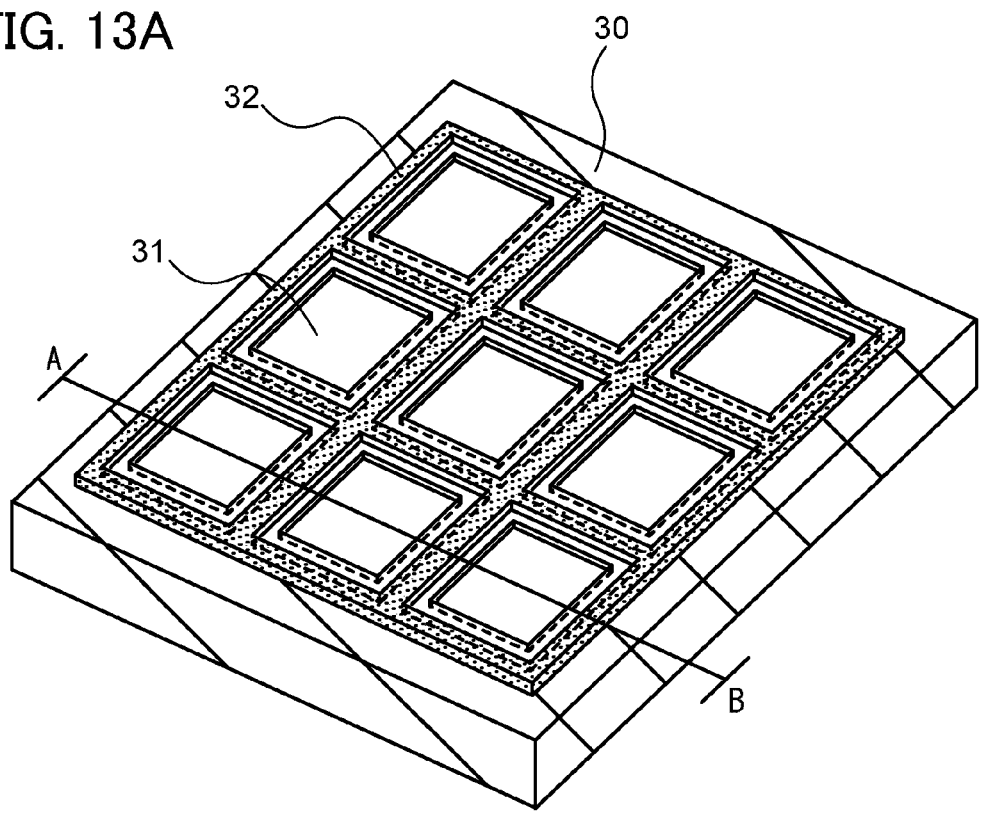
FIGS. 13A and 13B are views illustrating an example of a structure of a tray.
Figure 13B:
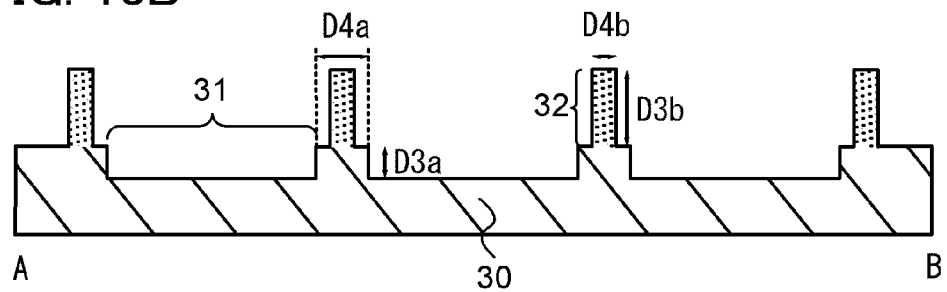

FIGS. 13A and 13B are an external view and a cross-sectional view of the third tray 30. Further, FIG. 13B is a cross-sectional view taken along line A-B of FIG. 13A. The third tray 30 is a plate-like member and is provided with a plurality of depression portions 31 for holding the single crystal semiconductor substrates 117 which are to be separated afterwards. A supporting portion 32 is formed between the depression portions 31. Here, three rows and three columns of depression portions 31 are formed. Further, the supporting portion 32 may have a portion formed to have a frame-like shape so as to surround the plurality of depression portions 31 as illustrated in FIGS. 13A and 13B. However, it is not always necessary to form the portion having a frame-like shape which surrounds the plurality of depression portions 31. In addition, although the supporting portion 32 illustrated in FIGS. 13A and 13B is continuously formed in a grid-like shape, the supporting portion 32 is not necessarily formed with this shape. For example, the supporting portion 32 may be formed discontinuously. Further, the shape of the depression portion 31 is preferably rectangular corresponding to the single crystal semiconductor substrate 111. Note that unless otherwise specified, a square is also included as a rectangle.

As illustrated in FIG. 13B, the depth of the depression portion 31 and the height of the supporting portion 32 are denoted by D3$a$ and D3$b$, respectively, and the sum of the depth D3$a$ and the height D3$b$ is made to be larger than the thickness of the single crystal semiconductor substrate 111. Further, as illustrated in FIG. 13B, the distance between the depression portions 31 is denoted by D4$a$ and the width of the supporting portion 32 is denoted by D4$b$; and D4$a$ and D4$b$ are set to satisfy D4$a$>D4$b$.

Here, the thickness of the third tray 30 is preferably greater than or equal to 1.7 mm and less than or equal to 2.9 mm. It is preferable that the depth D3$a$ of the depression portion 31 be greater than or equal to 0.2 mm and less than or equal to 0.6 mm and that the height D3$b$ of the supporting portion 32 be greater than or equal to 0.6 mm and less than or equal to 0.9 mm The width D4$a$ between the depression portions 31 is preferably greater than or equal to 1.5 times the width D4$b$ of the supporting portion 32.

Note that the third tray 30 preferably has a size similar to that of the first tray 10. In other words, the third tray 30 preferably has the same size as the base substrate 101. The depression portion 31 has a size that allows the single crystal semiconductor substrate 111 (the single crystal semiconductor substrate 117) to fit in the depression portion 31. The area of the bottom surface of the depression portion 31 is preferably less than or equal to 1.1 times that of the bottom surface of the single crystal semiconductor substrate 111 (the single crystal semiconductor substrate 117). In addition, it is preferable that the distance between an edge of the single crystal semiconductor substrate 111 (the single crystal semiconductor substrate 117) and an edge of the depression portion 31 be less than or equal to 1 mm when the single crystal semiconductor substrate 111 (the single crystal semiconductor substrate 117) fits in the depression portion 31. FIGS. 5A and 5B and FIGS. 6A and 6B illustrate not only structural examples of the first tray 10 but also those of the third tray 30. Note that the bottom surface of the depression portion 31 refers to the surface thereof which is open and faces upward in FIG. 13B and does not refer to the bottom surface of the entire third tray 30.

The third tray 30 is manufactured using a material which does not change its quality and shape by a heat treatment in a manufacturing process of the SOI substrate 100. In particular, a material which does not expand much by a heat treatment is preferably selected. For example, the third tray 30 can be manufactured using a semiconductor material such as quartz glass, silicon, or silicon carbide, non-alkali glass, or the like.

The third tray 30 described above is disposed so that the depression portion 31 and the single crystal semiconductor substrate 111 overlap with each other as illustrated in FIG. 12A, whereby the supporting portion 32 supports the base substrate 101 to which the single crystal semiconductor substrates 111 are bonded. Here, in the third tray 30, the width D4b of the supporting portion 32 is less than the width D4a between the depression portions 31, whereby a contact area between the supporting portion 32 of the third tray 30 and the base substrate 101 is reduced and the distance between the supporting portion 32 of the third tray 30 and the single crystal semiconductor substrate 111 is increased.

Since the size of the tray is similar to that of the base substrate 101, the heat distribution easily varies depending on locations. When the single crystal semiconductor substrates 111 and the base substrate 101 are in contact with the tray as illustrated in FIG. 8A, the single crystal semiconductor substrates 111 are easily affected by the heat distribution in the tray. However, when the third tray 30 is used, the contact area between the supporting portion 32 of the third tray 30 and the base substrate 101 at the time of performing a heat treatment is reduced and the distance between the supporting portion 32 of the third tray 30 and the single crystal semiconductor substrate 111 can be made larger, thereby reducing the adverse effect of the heat distribution in the third tray 30 on the base substrate 101 and the single crystal semiconductor substrates 111. Thus, the single crystal semiconductor layers 115 can be separated with the uniform heat distribution in the single crystal semiconductor substrates 111, which enables the single crystal semiconductor layers 115 uniform in quality to be formed over the base substrate 101.

In addition, as in Embodiment 1, a heat treatment can be performed without a contact between the single crystal semiconductor substrates 111 and the third tray 30; therefore, the single crystal semiconductor layers 115 can be separated with the uniform heat distribution in the single crystal semiconductor substrates 111, which enables the single crystal semiconductor layers 115 uniform in quality to be formed over the base substrate 101.

Further, by supporting the base substrate 101 by the supporting portion 32 of the third tray 30 as in Embodiment 1, the base substrate can be supported not only at the periphery thereof but also at the central portion thereof. As a result, the base substrate can be prevented from being bent at the time of performing a heat treatment, whereby the single crystal semiconductor layers which are uniform in quality can be formed over the base substrate 101.

As in Embodiment 1, after the third tray 30 is disposed, a heat treatment for increasing the bond force at the bonding interface between the base substrate 101 and the bonding layers 114 is preferably performed. This heat treatment is performed at a temperature at which the embrittlement layers 113 do not crack; specifically, the temperature is within a temperature range of greater than or equal to 200° C. and less than or equal to 450° C. Further, when the single crystal semiconductor substrates 111 are bonded to the base substrate 101 while heating at a temperature in the above-described range, the bond force at the bonding interface between the base substrate 101 and the bonding layer 114 can be made strong.

Figure 12B:
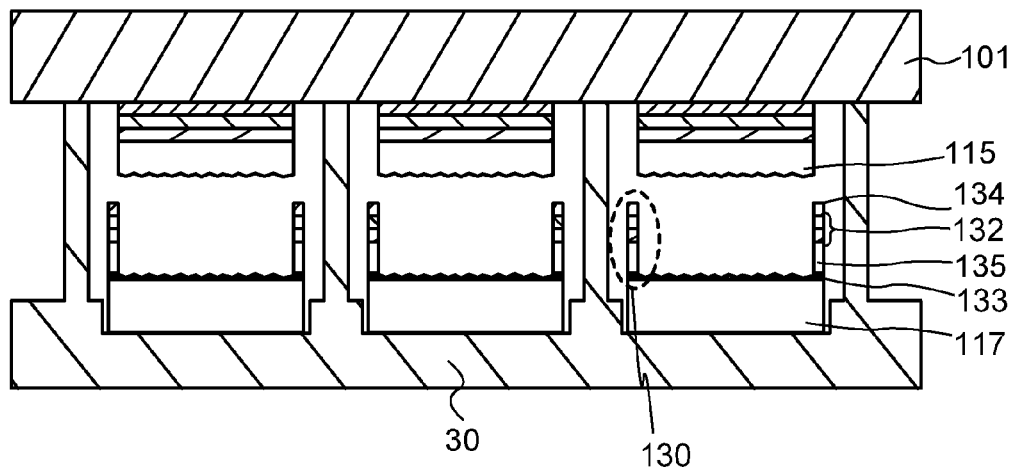

Next, as in Embodiment 1, a heat treatment is performed to cause separation at the embrittlement layers 113 so that the single crystal semiconductor layers 115 are separated from the single crystal semiconductor substrates 111. FIG. 12B is a view illustrating a separation step of separating the single crystal semiconductor layers 115 from the single crystal semiconductor substrates 111. The single crystal semiconductor substrates 117 are the single crystal semiconductor substrates 111 from which the single crystal semiconductor layers 115 are separated.

By performing a heat treatment as in Embodiment 1, the single crystal semiconductor substrates 111 are separated into the single crystal semiconductor layers 115 and the single crystal semiconductor substrates 117 along the embrittlement layers 113. The single crystal semiconductor substrates 117 from which the single crystal semiconductor layers 115 are separated by the heat treatment are held in the depression portions 31 provided in the third tray 30. The projection portion 130 is formed at the peripheral portion of the single crystal semiconductor substrate 117. The projection portion 130 includes the remaining embrittlement layer 133, the remaining single crystal semiconductor layer 135, the remaining insulating layer 132 (the remaining insulating film 132b and the remaining insulating film 132a) and the remaining bonding layer 134, which are not bonded to the base substrate 101.

Here, the third tray 30 is provided with the depression portion 31 whose bottom surface has a width less than a distance between the supporting portions 32; the depression portion 31 is made to have a size that allows the single crystal semiconductor substrate 111 to fit in the depression portion 31; and the area of the bottom surface of the depression portion 31 is made less than or equal to 1.1 times that of the bottom surface of the single crystal semiconductor substrate 111. Therefore, there is very little spatial room allowing the separated single crystal semiconductor substrate 117 to move in a direction parallel to the surface of the substrate with respect to the single crystal semiconductor layer 115. In this manner, the single crystal semiconductor substrate 117 is disposed in a position by which the projection portion 130 does not overlap with the single crystal semiconductor layer 115, whereby contaminants are prevented from attaching to the single crystal semiconductor layer 115 and the single crystal semiconductor layer 115 is prevented from being damaged and the single crystal semiconductor layers which are uniform in quality can be formed over the base substrate 101.

As for the details of the heat treatment process and the process following the heat treatment are similar to those described in Embodiment 1; therefore, Embodiment 1 is to be referred to.

By the above process, an SOI substrate can be provided in which a plurality of single crystal semiconductor layers uniform in quality is formed over a substrate having a larger area than a single crystal silicon substrate. By using an SOI substrate described in this embodiment, for example, productivity of a semiconductor device such as a semiconductor integrated circuit can be improved.

In this embodiment, by using the third tray 30 which has the supporting portion 32 between the depression portions 31 at the time of the heat treatment for separating the single crystal semiconductor substrate 111, the contact area between the supporting portion 32 of the third tray 30 and the base substrate 101 is reduced in the heat treatment and the distance between the supporting portion 32 of the third tray 30 and the single crystal semiconductor substrate 111 can be made larger. By this, the adverse effect of the heat distribution in the third tray 30 on the base substrate 101 and the single crystal semiconductor substrate 111 can be reduced; therefore, the single crystal semiconductor layers 115 can be separated with the uniform heat distribution in the single crystal semiconductor substrates 111, which enables the single crystal semiconductor layers 115 uniform in quality to be formed over the base substrate 101.

In addition, as in Embodiment 1, the heat treatment can be performed without a contact between the single crystal semiconductor substrate 111 and the third tray 30. Therefore, the single crystal semiconductor layers 115 can be separated with the uniform heat distribution in the single crystal semiconductor substrates 111, which enables the single crystal semiconductor layers 115 uniform in quality to be formed over the base substrate 101.

As in Embodiment 1, the projection portion 130 of the single crystal semiconductor substrate 117 can be prevented from being located at a position overlapping with the single crystal semiconductor layer 115. In this manner, contaminants attaching to or damage to the single crystal semiconductor layer 115 due to bursting of the remaining the embrittlement layer 133 of the separated single crystal semiconductor substrate 117 can be prevented.

Note that the structure described in this embodiment can be combined with any of the structures described in other embodiments as appropriate.

Embodiment 3

In Embodiment 3, a regenerating treatment of a single crystal semiconductor substrate will be described. Here, the single crystal semiconductor substrate 117 illustrated in FIG. 8C and FIG. 12B, from which the single crystal semiconductor layer 115 is separated, is regenerated. The regenerating treatment for the single crystal semiconductor substrate will be described with reference to FIGS. 14A to 14D.

Figure 14A:
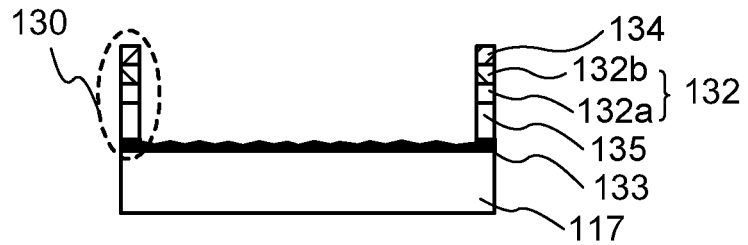
FIGS. 14A to 14D are views illustrating a regenerating treatment of a single crystal semiconductor substrate.

After the steps of FIG. 8C and FIG. 12B, as illustrated in FIG. 14A, the projection portion 130 is formed at the peripheral portion of the single crystal semiconductor substrate 117. The projection portion 130 includes the remaining embrittlement layer 133, the remaining single crystal semiconductor layer 135, the remaining insulating layer 132 (the remaining insulating film 132b and the remaining insulating film 132a) and the remaining bonding layer 134, which are not bonded to the base substrate 101.

Figure 14B:
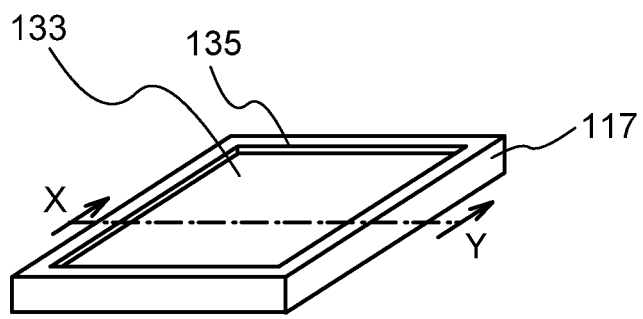
Figure 14C:
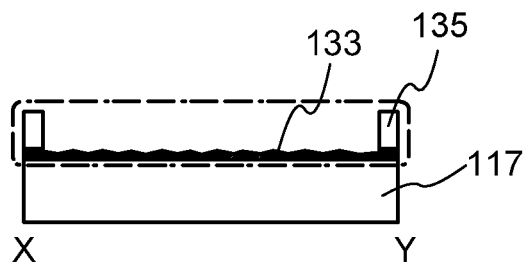

First, an etching treatment is performed to remove the remaining insulating film 132b, the remaining insulating film 132a, and the remaining bonding layer 134. In the case where these films are each formed of silicon oxide, silicon oxynitride, or silicon nitride oxide, a wet etching treatment using hydrofluoric acid is performed. By the etching treatment, the single crystal semiconductor substrate 117 is obtained as illustrated in FIG. 14B. FIG. 14C is a cross-sectional view taken along a chain line X-Y of FIG. 14B.

Then, the single crystal semiconductor substrate 117 illustrated in FIGS. 14B and 14C is subjected to an etching treatment, so that the remaining single crystal semiconductor layer 135 and the remaining embrittlement layer 133 are removed. By the etching treatment, a region containing too much hydrogen, such as the remaining embrittlement layer 133 of the single crystal semiconductor substrate 117, is removed. As the etching treatment for the single crystal semiconductor substrate 117, a wet etching treatment is preferable, and as an etchant, a tetramethylammonium hydroxide (abbr. TMAH) solution can be used.

Figure 14D:
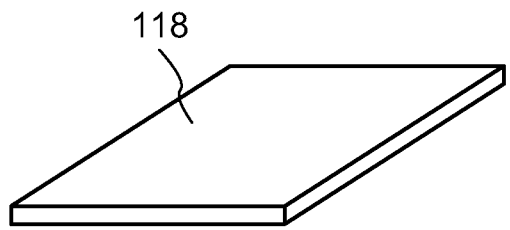

After the remaining single crystal semiconductor layer 135 and the remaining embrittlement layer 133 which are illustrated in FIG. 14C are removed by the etching treatment performed on the single crystal semiconductor substrate 117, the surface of the single crystal semiconductor substrate 117 is polished, so that a single crystal semiconductor substrate 118 having a smooth surface is formed as illustrated in FIG. 14D. This single crystal semiconductor substrate 118 can be reused as the single crystal semiconductor substrate 111 illustrated in FIG. 2.

As the polishing treatment, chemical mechanical polishing (abbr. CMP) can be used. In order to make the single crystal semiconductor substrate 118 have a smooth surface, polishing of about 1 μm to 10 μm is desirably performed. After polishing, since polishing particles and the like remain on the surface of the single crystal semiconductor substrate 118, cleaning with hydrofluoric acid or RCA cleaning is performed. Note that RCA cleaning refers to a cleaning method for a semiconductor substrate, which is developed by Radio Corporation of America, in which chemical in which hydrogen peroxide as a base is added with alkali or acid is used at a high temperature.

By reusing the single crystal semiconductor substrate 118, the material cost of the SOI substrate 100 can be reduced.

Note that the structure described in this embodiment can be combined with any of the structures described in other embodiments as appropriate.

Embodiment 4

In this embodiment, a manufacturing method of a thin film transistor which is one of semiconductor elements will be described as one example of a manufacturing method of a semiconductor device using the SOI substrate which is described in Embodiment 1 or 2. By combining a plurality of thin film transistors, a variety of types of semiconductor devices are manufactured. In this embodiment, the SOI substrate 100 manufactured by the manufacturing method of Embodiments 1 and 2 is used.

Figure 15A:
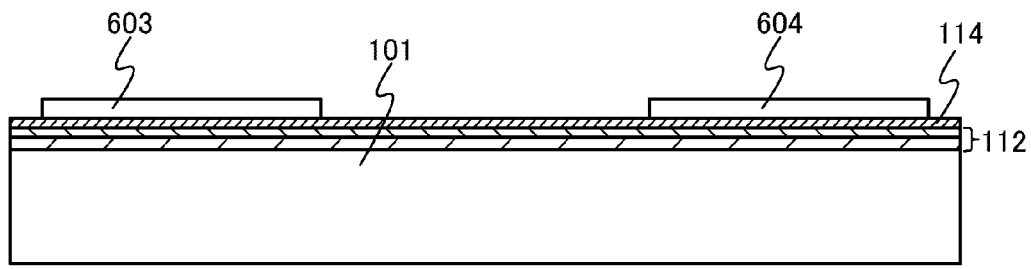
FIGS. 15A to 15D are views illustrating a manufacturing method of a semiconductor device using an SOI substrate according to one embodiment of the present invention.

First, as illustrated in FIG. 15A, a single crystal semiconductor layer over the base substrate 101 is processed (patterned) into a desired shape by etching; thus, a semiconductor film 603 and a semiconductor film 604 are formed.

In order to control a threshold voltage, a p-type impurity such as boron, aluminum, or gallium or an n-type impurity such as phosphorus or arsenic may be added to the semiconductor films 603 and 604. For example, in the case of adding boron as a p-type impurity, boron may be added at a concentration of greater than or equal to $5 \times 10^{16}$ cm$^{-3}$ and less than or equal to $1 \times 10^{17}$ cm$^{-3}$. The addition of the impurity for controlling a threshold voltage may be performed on the single crystal semiconductor layer before being etched or may be performed on the semiconductor films 603 and 604 which are formed after the etching. Alternatively, the addition of the impurity for controlling the threshold voltage may be performed on a single crystal semiconductor substrate for forming the single crystal semiconductor layer. Further alternatively, it is possible that an impurity is added to the single crystal semiconductor substrate for forming the single crystal semiconductor layer to roughly adjust a threshold voltage and then an impurity is added to the single crystal semiconductor layer or the semiconductor films 603 and 604 to finely adjust the threshold voltage.

After the semiconductor films 603 and 604 are formed, a hydrogenation treatment may be performed before a gate insulating film 606 is formed. The hydrogenation treatment is performed, for example, at 350° C. for about two hours in a hydrogen atmosphere.

Figure 15B:
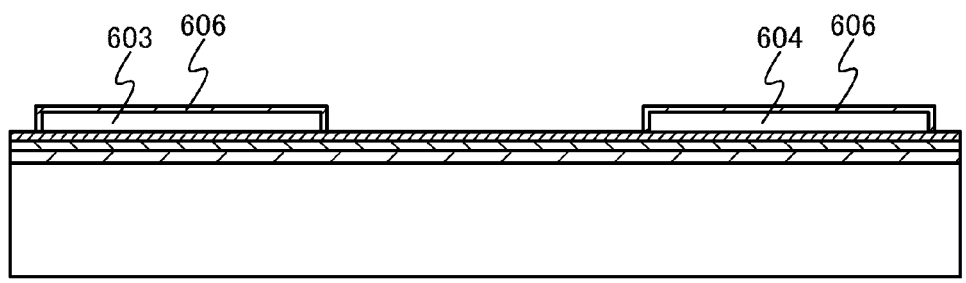

Next, as illustrated in FIG. 15B, the gate insulating film 606 is formed to cover each of the semiconductor films 603 and 604. The gate insulating film 606 can be formed by oxidizing or nitriding surfaces of the semiconductor films 603 and 604 by a high-density plasma treatment. The high-density plasma treatment is performed, for example, by using a mixed gas of a rare gas such as He, Ar, Kr, or Xe, and oxygen, nitrogen oxide, ammonia, nitrogen, hydrogen, or the like. In this case, by performing excitation of plasma with introduction of a microwave, plasma with a low electron temperature and high density can be generated. The surfaces of the semiconductor films are oxidized or nitrided by oxygen radicals (which include OH radical in some cases) or nitrogen radicals (which include NH radical in some cases) produced by such high-density plasma, whereby an insulating film of 1 nm to 20 nm thick, desirably 5 nm to 10 nm thick, is formed in contact with the semiconductor films. This insulating film of 5 nm to 10 nm thick is used as the gate insulating film 606.

Since the oxidation or nitridation of the semiconductor films by the high-density plasma treatment is a solid-phase reaction, the interface state density between the gate insulating film 606 and each of the semiconductor film 603 and the semiconductor film 604 can be drastically reduced. Further, since the semiconductor films 603 and 604 are directly oxidized or nitrided by the high-density plasma treatment, variation in thickness of the insulating film to be formed can be suppressed. In a case where the semiconductor films 603 and 604 have crystallinity, the oxidation of the surfaces of the semiconductor films 603 and 604 in a solid-phase reaction by the high-density plasma treatment makes it possible to suppress fast oxidation only at the crystal boundaries and to form the gate insulating film with favorable uniformity and low interface state density. A transistor, in which the insulating film formed by the high-density plasma treatment is included in part of or the entire gate insulating film, may reduce variations in characteristics.

Alternatively, the gate insulating film 606 may be formed by thermally oxidizing the semiconductor films 603 and 604. The gate insulating film 606 may be formed to have a single-layer or a stacked-layer structure of a film containing silicon oxide, silicon nitride oxide, silicon nitride, hafnium oxide, aluminum oxide, or tantalum oxide by a plasma CVD method, a sputtering method, or the like.

Alternatively, a heat treatment may be performed at a temperature in the range of greater than or equal to 350° C. and less than or equal to 450° C. after the formation of the gate insulating film 606 including hydrogen, whereby hydrogen in the gate insulating film 606 diffuses to the semiconductor films 603 and 604. In this case, the gate insulating film 606 may be formed by depositing silicon nitride or silicon nitride oxide by a plasma CVD method at a process temperature of less than or equal to 350° C. By supplying hydrogen to the semiconductor films 603 and 604, such defects as to serve as trapping centers in the semiconductor films 603 and 604 and at an interfaces between the gate insulating film 606 and each of the semiconductor films 603 and 604 can be reduced effectively.

Figure 15C:
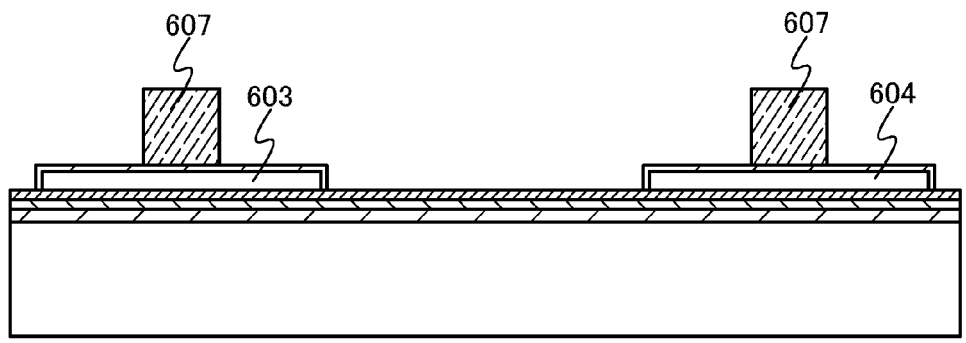

Then, after forming a conductive film over the gate insulating films 606 as illustrated in FIG. 15C, the conductive film is processed (patterned) into a predetermined shape, thereby forming an electrode 607 over each of the semiconductor films 603 and 604. A CVD method, a sputtering method, or the like may be used for forming the conductive film. As the conductive film, tantalum (Ta), tungsten (W), titanium (Ti), molybdenum (Mo), aluminum (Al), copper (Cu), chromium (Cr), niobium (Nb), or the like may be used. Moreover, an alloy containing the above-described metal as its main component or a compound containing the above-described metal may be used. Further alternatively, the conductive film may be formed using a semiconductor such as polycrystalline silicon which is formed by addition of an impurity element such as phosphorus, to a semiconductor film.

In addition, although each of the electrodes 607 is formed of a single layer conductive film in this embodiment, this embodiment is not limited to this structure. The electrode 607 may be formed by stacking plural conductive films. In a case of forming a two-layer conductive film, the first layer can be formed of tantalum nitride or tantalum (Ta) and the second layer can be formed of tungsten (W). Other than the combination, the following combinations are given: tungsten nitride and tungsten; molybdenum nitride and molybdenum; aluminum and tantalum; aluminum and titanium, and the like. Since tungsten and tantalum nitride have high heat resistance, a heat treatment for thermal activation can be performed in a step after forming the two-layer conductive films. Alternatively, as the combination of the two-layer conductive films, silicon doped with an impurity which imparts n-type conductivity and nickel silicide, silicon doped with an impurity which imparts n-type conductivity and tungsten silicide, or the like can be used.

In the case of a three-layer structure in which three or more conductive films are stacked, a stacked-layer structure of a molybdenum film, an aluminum film, and a molybdenum film is preferably employed.

Note that for a mask which is used to form the electrode 607, silicon oxide, silicon nitride oxide, or the like may be used instead of a resist mask. In that case, the step of forming the masks using silicon oxide, silicon nitride oxide, or the like by patterning is added. However, since film reduction of the masks at the time of etching is less than that in the case of using a resist, the electrode 607 with desired widths can be formed. Alternatively, the electrode 607 may be formed selectively by a droplet discharge method instead of using a mask.

Note that a droplet discharge method means a method in which droplets containing a predetermined composition are discharged or ejected from fine pores to form a predetermined pattern, and includes an ink-jet method and the like.

The electrode 607 can be etched into a desired tapered shape by using an ICP (Inductively Coupled Plasma) etching method and appropriately controlling the etching condition (e.g., the amount of electric power applied to a coiled electrode layer, the amount of electric power applied to an electrode layer on the substrate side, or the electrode temperature on the substrate side) after the conductive film is formed. In addition, angles and the like of the tapered shapes may also be controlled by a shape of a mask. Note that as the etching gas, a chloride gas such as chlorine, boron chloride, silicon chloride or carbon tetrachloride; a fluoride gas such as carbon tetrafluoride, sulfur fluoride, or nitrogen fluoride; or oxygen may be used as appropriate.

Figure 15D:
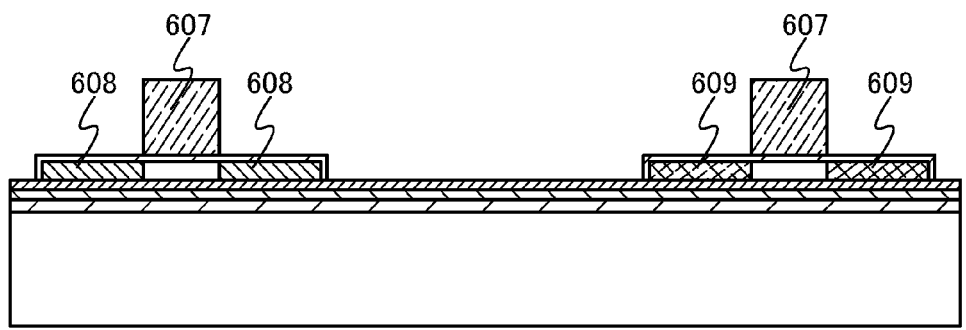

Next, as illustrated in FIG. 15D, an impurity element imparting one conductivity type is added to the semiconductor film 603 and the semiconductor film 604 with use of the electrodes 607 as masks. In this embodiment, a p-type impurity element (such as boron) is added to the semiconductor film 604 while an n-type impurity element (such as phosphorus or arsenic) is added to the semiconductor film 603. It is to be noted that when the p-type impurity element is added to the semiconductor film 604, the semiconductor film 603 to which the n-type impurity element is added is covered with a mask or the like so that the p-type impurity element is added selectively. On the other hand, when the n-type impurity element is added to the semiconductor film 603, the semiconductor film 604 to which the p-type impurity element is added is covered with a mask or the like so that the n-type impurity element is added selectively. Alternatively, after adding an impurity element imparting one of p-type and n-type conductivity to the semiconductor films 603 and 604, an impurity element imparting the other conductivity may be added to one of the semiconductor films 603 and 604 selectively at a higher concentration than the previously added impurity. By the impurity addition, impurity regions 608 are formed in the semiconductor film 603 and impurity regions 609 are formed in the semiconductor film 604.

Figure 16A:
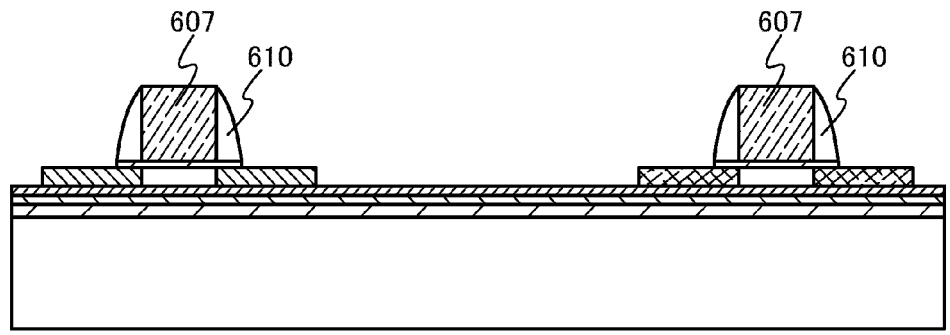
FIGS. 16A to 16C are views illustrating a manufacturing method of a semiconductor device using an SOI substrate according to one embodiment of the present invention.

Next, as illustrated in FIG. 16A, sidewalls 610 are formed on side surfaces of the electrodes 607. The sidewalls 610 can be formed by, for example, newly forming an insulating film so as to cover the gate insulating film 606 and the electrodes 607 and anisotropically etching mainly in a perpendicular direction to partially etch the newly formed insulating film. By the anisotropic etching, the newly formed insulating film is partially etched to form the sidewalls 610 at the side surfaces of the electrodes 607. It is to be noted that the gate insulating film 606 may also be etched partially by the anisotropic etching. The insulating film for forming the sidewall 610 may be formed by a plasma CVD method, a sputtering method, or the like as a single layer or stacked layers of a silicon film, a silicon oxide film, a silicon nitride oxide film, or a film containing an organic material such as an organic resin. In this embodiment, a 100 nm thick silicon oxide film is formed by a plasma CVD method. As the etching gas, a mixed gas of $CHF_3$ and helium can be used. It is to be noted that the step of forming the sidewalls 610 is not limited to this.

Figure 16B:
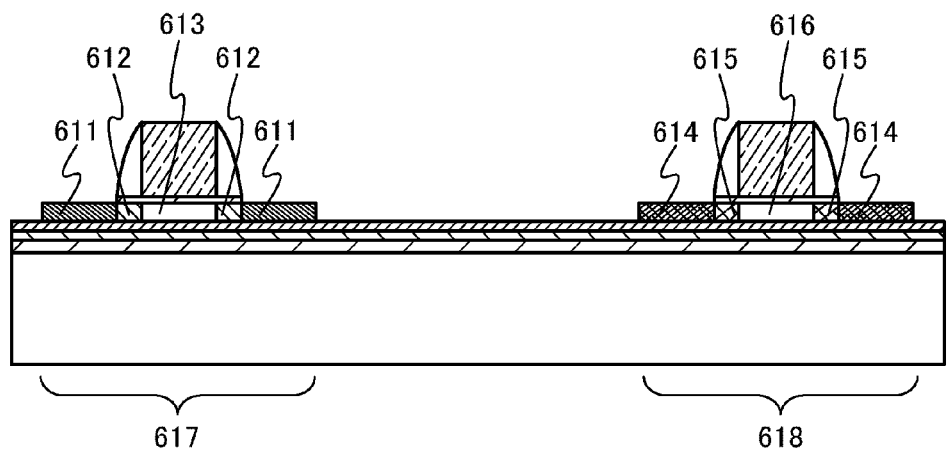

Next, as illustrated in FIG. 16B, an impurity element imparting one conductivity type is added to the impurity regions 608 of the semiconductor film 603 and the impurity regions 609 of the semiconductor film 604 with the electrodes 607 and the sidewalls 610 used as masks. Note that the impurity elements imparting the same conductivity type as the impurity elements which have been added in the previous step are added to the impurity regions 608 of the semiconductor film 603 and the impurity regions 609 of the semiconductor film 604 at a higher concentration than in the previous step. Further, when the p-type impurity element is added to the impurity regions 609 of the semiconductor film 604, the semiconductor film 603 to which the n-type impurity element is added is covered with a mask or the like so that the p-type impurity element is added selectively. On the other hand, when the n-type impurity element is added to the impurity regions 608 of the semiconductor film 603, the semiconductor film 604 to which the p-type impurity element is added is covered with a mask or the like so that the n-type impurity element is added selectively.

By the addition of the impurity elements, a pair of high-concentration impurity regions 611, a pair of low-concentration impurity regions 612, and a channel formation region 613 are formed in the semiconductor film 603. Moreover, by the addition of the impurity elements, a pair of high-concentration impurity regions 614, a pair of low-concentration impurity regions 615, and a channel formation region 616 are formed in the semiconductor film 604. The high-concentration impurity regions 611 and 614 function as sources and drains, while the low-concentration impurity regions 612 and 615 function as LDD (lightly doped drain) regions.

It is to be noted that the sidewalls 610 formed over the semiconductor film 604 and the sidewalls 610 formed over the semiconductor film 603 may have the same widths in a carrier moving direction or may have different widths in the carrier moving direction. The width of each of the sidewalls 610 over the semiconductor film 604 which forms a p-type transistor is preferably larger than that over the semiconductor film 603 which forms an n-type transistor. This is because boron which is added for forming a source and a drain in the p-type transistor is easily diffused and a short channel effect is easily induced. When the sidewalls 610 of the p-type transistor each have a larger width, boron can be added to the source and the drain at a high concentration, whereby the source and the drain can be made to have a lower resistance.

Next, a silicide layer may be formed by siliciding the semiconductor films 603 and 604 in order to further decrease the resistance of the sources and the drains. The siliciding is performed in such a manner that a metal is brought into contact with the semiconductor films, and silicon in the semiconductor films is made to react with the metal by a heat treatment such as a GRTA method or an LRTA method. The silicide layer may be formed of cobalt silicide or nickel silicide. In the case where the semiconductor film 603 and the semiconductor film 604 are thin, the silicide reaction may proceed to the bottom of the semiconductor film 603 and the semiconductor film 604 in this region. As a metal material used for the silicidation, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Alternatively, the silicide may be formed by laser irradiation, light irradiation using a lamp, or the like.

Through the aforementioned steps, an n-channel transistor 617 and a p-channel transistor 618 are formed.

Figure 16C:
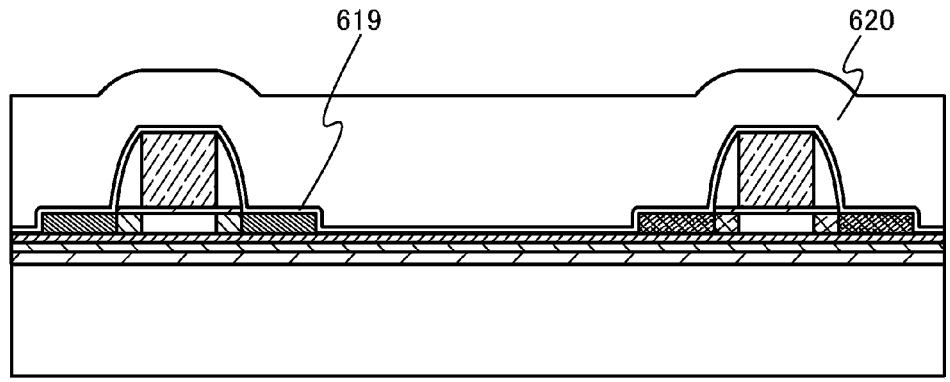

Next, an insulating film 619 is formed so as to cover the transistors 617 and 618, as illustrated in FIG. 16C. The insulating film 619 is not always necessary; however, the formation of the insulating film 619 can prevent impurities such as an alkali metal and an alkaline-earth metal from entering the transistors 617 and 618. Specifically, it is desirable to use silicon nitride, silicon nitride oxide, aluminum nitride, aluminum oxide, silicon oxide, or the like for the insulating film 619. In this embodiment, a silicon nitride oxide film with a thickness of approximately 600 nm is used as the insulating film 619. In this case, the hydrogenation treatment described above may be performed after formation of the silicon nitride oxide film.

Next, an insulating film 620 is formed over the insulating film 619 so as to cover the transistors 617 and 618. An organic material having heat resistance, such as polyimide, acrylic, benzocyclobutene, polyamide, or epoxy can be used for the insulating film 620. In addition to such organic materials, it is also possible to use a low-dielectric constant material (a low-k material), a siloxane resin, silicon oxide, silicon nitride, silicon nitride oxide, PSG (phosphosilicate glass), BPSG (borophosphosilicate glass), alumina, or the like. As a substituent, the siloxane-based resin may include at least any one of hydrogen, fluorine, an alkyl group, and aromatic hydrocarbon. Alternatively, the insulating film 620 may be formed by stacking plural insulating films formed of these materials. Further, a surface of the insulating film 620 may be planarized by a CMP (chemical mechanical polishing) method or the like.

Note that the siloxane resin corresponds to a resin including a Si—O—Si bond formed using a siloxane-based material as a starting material. As a substituent, the siloxane-based resin may include at least any one of hydrogen, fluorine, an alkyl group, and aromatic hydrocarbon.

For the formation of the insulating film 620, the following method can be used depending on the material of the insulating film 620: a CVD method, a sputtering method, an SOG method, a spin coating method, a dip coating method, a spray coating method, a droplet discharge method (e.g., an ink-jet method, screen printing, offset printing, or the like), a doctor knife, a roll coater, a curtain coater, a knife coater, or the like.

Figure 17:
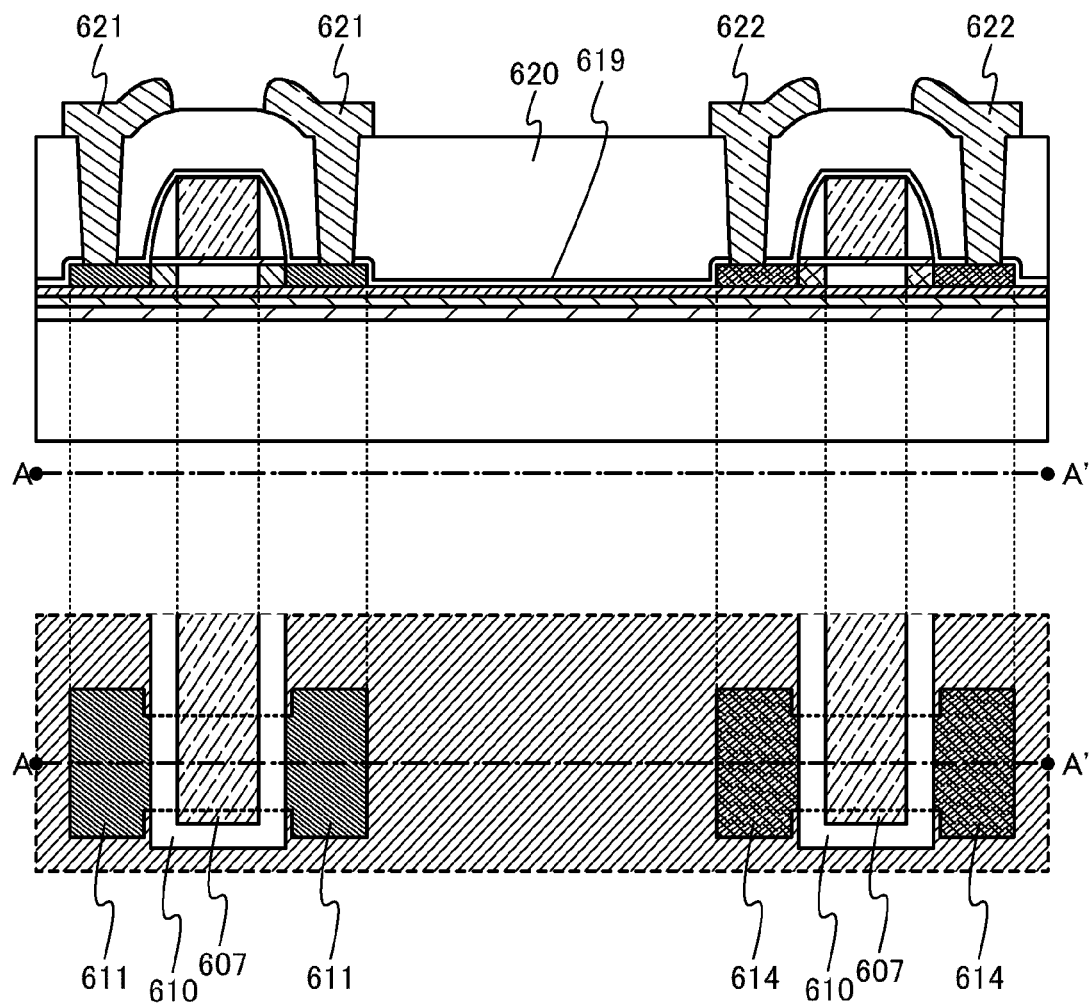
FIG. 17 is a view illustrating a manufacturing method of a semiconductor device using an SOI substrate according to one embodiment of the present invention.

Next, as illustrated in FIG. 17, contact holes are formed in the insulating films 619 and 620 so that each of the semiconductor films 603 and 604 is partially exposed. Then, conductive films 621 and conductive films 622 are formed to be in contact with the semiconductor film 603 and the semiconductor film 604, respectively, through the contact holes. As an etching gas for forming the contact holes, a mixed gas of $CHF_3$ and He is employed, but the etching gas is not limited thereto.

The conductive films 621 and the conductive films 622 can be formed by a CVD method, a sputtering method, or the like. Specifically, the following can be used for the conductive films 621 and 622: aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Moreover, an alloy containing the above-described metal as its main component or a compound containing the above-described metal may be used. The conductive films 621 and 622 can be formed as a single layer or stacked layers by using a film formed of any of the aforementioned metals.

As an example of an alloy containing aluminum as a main component, an alloy containing aluminum as the main component and containing nickel is given. Further, an alloy which contains aluminum as its main component and contains nickel and one or both of carbon and silicon can also be given as an example. Since aluminum and aluminum silicon have low resistance and are inexpensive, they are suitable for forming the conductive films 621 and 622. In comparison to an aluminum film, an aluminum silicon (Al—Si) film can particularly prevent the generation of hillock at resist baking at the time of patterning the conductive films 621 and 622. Moreover, Cu of approximately 0.5% may be mixed instead of the silicon (Si) into the aluminum film.

For example, a stacked-layer structure including a barrier film, an aluminum silicon (Al—Si) film, and a barrier film or a stacked-layer structure including a barrier film, an aluminum silicon (Al—Si) film, a titanium nitride film, and a barrier film may be used as the conductive films 621 and the conductive films 622. Note that a barrier film is a film formed using titanium, a nitride of titanium, molybdenum, or a nitride of molybdenum. When the barrier films are formed so as to sandwich the aluminum silicon (Al—Si) film therebetween, generation of a hillock in aluminum or aluminum-silicon may be prevented. Moreover, when the barrier film is formed using titanium that is a highly-reducible element, even if a thin oxide film is formed over the semiconductor film 603 and the semiconductor film 604, the oxide film is reduced by the titanium contained in the barrier film, whereby a preferable contact between the conductive films 621 and 622 and the semiconductor films 603 and 604 can be obtained. Moreover, a plurality of barrier films may be stacked. In that case, for example, each of the conductive films 621 and 622 can be formed to have a five-layer structure of titanium (Ti), titanium nitride, aluminum silicon (Al—Si), titanium (Ti), and titanium nitride in order from the bottom.

For the conductive films 621 and 622, tungsten silicide formed by a chemical vapor deposition method using a $WF_6$ gas and a $SiH_4$ gas may be used. Alternatively, tungsten formed by hydrogen reduction of $WF_6$ may be used for the conductive films 621 and the conductive films 622.

It is to be noted that the conductive films 621 are connected to the high-concentration impurity regions 611 of the n-channel transistor 617. The conductive films 622 are connected to the high-concentration impurity regions 614 of the p-channel transistor 618.

FIG. 17 shows a top view of the n-channel transistor 617 and the p-channel transistor 618. However, the conductive films 621 and 622, the insulating film 619, and the insulating film 620 are omitted in this top view.

Further, although this embodiment exemplifies the case where the n-channel transistor 617 and the p-channel transistor 618 each has one of the electrodes 607 functioning as a gate, Embodiment 4 is not limited to this structure. The transistor manufactured in this embodiment may have a multi-gate structure in which a plurality of electrodes functioning as gates are included and electrically connected to one another.

Moreover, the transistor included in the semiconductor device manufactured in this embodiment may have a gate planar structure.

It is to be noted that the semiconductor film of the SOI substrate is of almost single crystal. Therefore, variation in orientation is small as compared with a polycrystalline semiconductor film; accordingly, variation in threshold voltage of transistors can be decreased. Further, unlike a polycrystalline semiconductor film, crystal grain boundary is hardly observed; accordingly, leakage current due to a crystal grain boundary can be suppressed, and thus, power saving of a semiconductor device can be realized. In a polycrystalline semiconductor film obtained by laser crystallization, a surface of the semiconductor film tends to have a projection (ridge) in reflection of distribution of energy density of a beam spot. However, irradiation may be performed on the semiconductor film included in the SOI substrate at low energy density such that a defect in a semiconductor film, which is caused by bonding, can be recovered. Accordingly, the semiconductor film of the SOI substrate has a much flatter surface than the polycrystalline semiconductor film obtained by laser crystallization and the gate insulating film formed over the semiconductor film of the SOI substrate can therefore has a thickness as small as 5 nm to 50 nm. Thus, high on-current can be obtained while suppressing gate voltage. In the case of using a polycrystalline semiconductor film obtained by laser crystallization, it is necessary to arrange the semiconductor films of transistors along a direction to which a laser beam is scanned, in order to achieve higher mobility. However, the semiconductor film of the SOI substrate is not restricted in arrangement; therefore, limit on design of semiconductor devices is reduced.

Embodiment 5

Figure 18A:
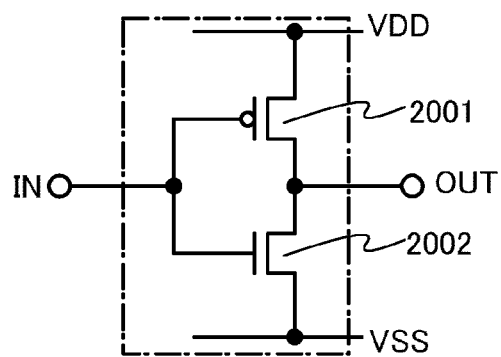
FIGS. 18A and 18B are views illustrating a structure of an inverter which is formed using an SOI substrate according to one embodiment of the present invention.

In this embodiment, a specific structure of a variety of circuits included in a semiconductor device which uses the SOI substrate described in Embodiment 1 or 2 is described with an inverter as an example. FIG. 18A is an example of a circuit diagram of an inverter and FIG. 18B is an example of a top view of the inverter illustrated in FIG. 18A.

The inverter illustrated in FIG. 18A has a p-channel transistor 2001 and an n-channel transistor 2002. The transistor 2001 and the transistor 2002 are connected in series. Specifically, a drain of the transistor 2001 and a drain of the transistor 2002 are connected. A potential of the drain of the transistor 2001 and the drain of the transistor 2002 is applied to an output terminal OUT.

Further, a gate of the transistor 2001 is connected to a gate of the transistor 2002. A potential of a signal input to an input terminal IN is applied to the gate of the transistor 2001 and the gate of the transistor 2002. High-level voltage VDD is applied to a source of the transistor 2001, and low-level voltage VSS is applied to a source of the transistor 2002.

Figure 18B:
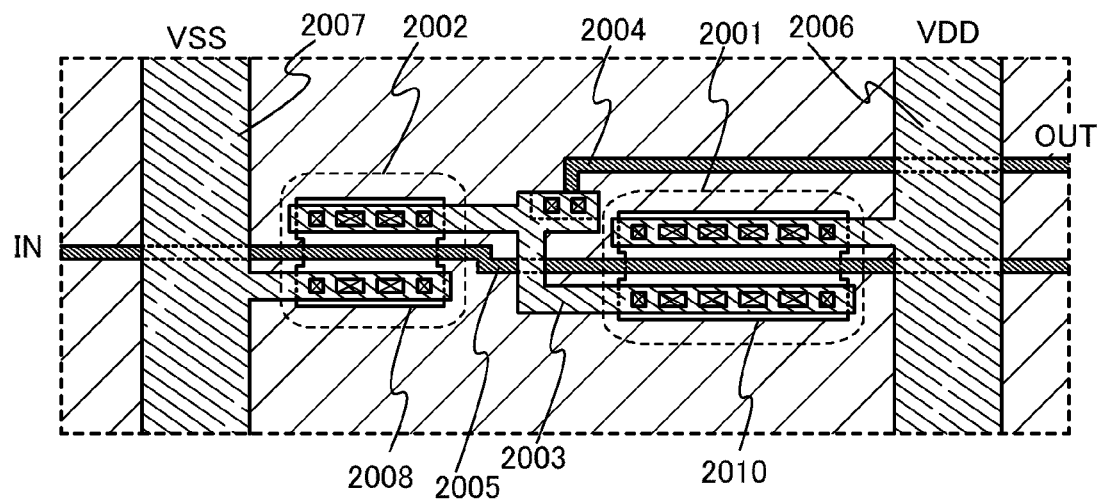

In the inverter illustrated in FIG. 18B, the transistor 2001 includes a semiconductor film 2010 and the transistor 2002 includes a semiconductor film 2008. Further, the drain of the transistor 2001 and the drain of the transistor 2002 are electrically connected through a wiring 2003. The wiring 2003 is connected to a wiring 2004. Thus, a potential of the drain of the transistor 2001 and the drain of the transistor 2002 is applied to a circuit in a next stage as a potential of the output terminal OUT through the wirings 2003 and 2004.

Further, in the inverter illustrated in FIG. 18B, part of the wiring 2005 serves as the gate of the transistor 2001 and the gate of the transistor 2002. Thus, a potential applied to the wiring 2005 is applied to the gate of the transistor 2001 and the gate of the transistor 2002 as a potential of the input terminal IN. Voltage VDD is applied to the source of the transistor 2001 through the wiring 2006, and voltage VSS is applied to the source of the transistor 2002 through the wiring 2007.

This embodiment can be implemented by being combined as appropriate with any of the above-described embodiments.

Embodiment 6

In this embodiment, a specific structure of a variety of circuits included in a semiconductor device which uses the SOI substrate described in Embodiment 1 or 2 is described with a NAND circuit as an example. As an example, FIG. 19A illustrates a circuit diagram of the NAND circuit and FIG. 19B illustrates a top view of the NAND circuit illustrated in FIG. 19A.

Figure 19A:
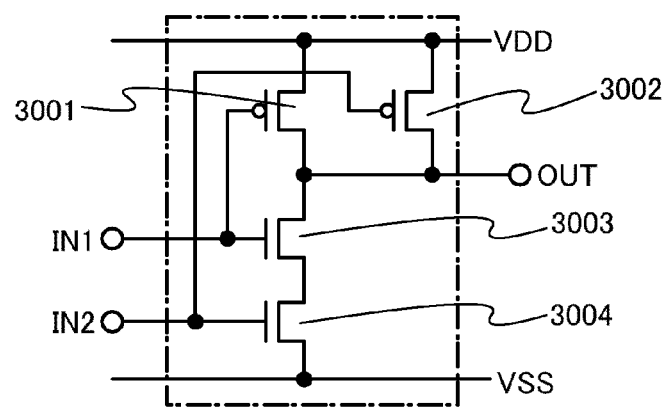
FIGS. 19A and 19B are views illustrating a structure of a NAND circuit which is formed using an SOI substrate according to one embodiment of the present invention.

The NAND circuit illustrated in FIG. 19A includes a p-channel transistor 3001, a p-channel transistor 3002, an n-channel transistor 3003, and an n-channel transistor 3004. The transistors 3001, 3003, and 3004 are sequentially connected in series. The transistors 3001 and 3002 are connected in parallel.

Specifically, a high level voltage VDD is applied to one of a source and a drain of the transistor 3001 and the other is connected to an output terminal OUT. High-level voltage VDD is applied to one of a source and a drain of the transistor 3002, and the other of the source and the drain is connected to the output terminal OUT. Low-level voltage VSS is applied to one of a source and a drain of the transistor 3004. One of a source and a drain of the transistor 3003 is connected to the output terminal OUT. The other of the source and the drain of the transistor 3003 is connected to the other of the source and the drain of the transistor 3004. A potential of an input terminal IN1 is applied to a gate of the transistor 3001 and a gate of the transistor 3003. A potential of an input terminal IN2 is applied to a gate of the transistor 3002 and a gate of the transistor 3004.

Figure 19B:
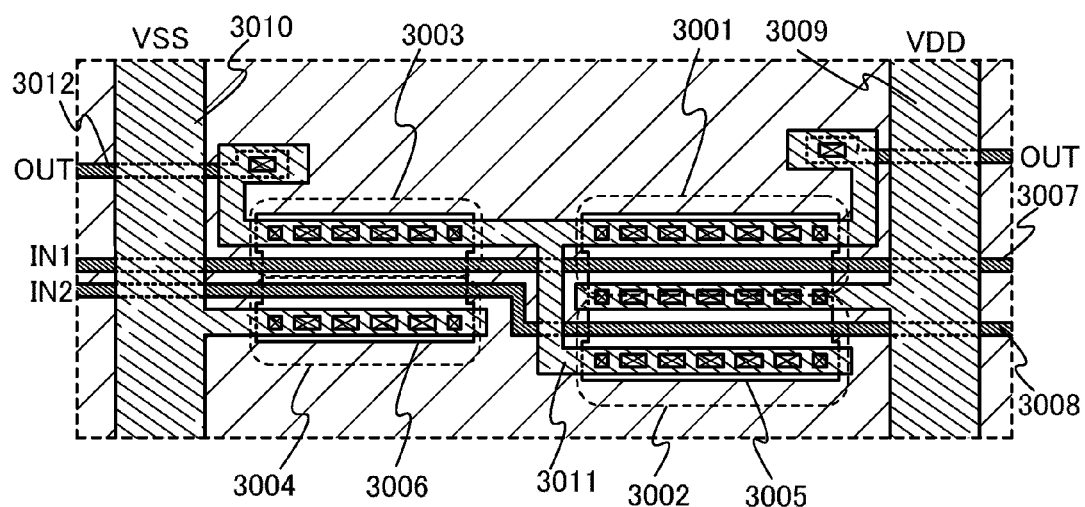

In the NAND circuit illustrated in FIG. 19B, the transistors 3001 and 3002 connected in parallel share the semiconductor film 3005. Moreover, the serially connected transistors 3003 and 3004 share the semiconductor film 3006. Part of a wiring 3007 serves as the gate of the transistor 3001 and the gate of the transistor 3003. Thus, a potential applied to the wiring 3007 is applied to the gate of the transistor 3001 and the gate of the transistor 3003 as a potential of the input terminal IN1. Part of a wiring 3008 serves as the gate of the transistor 3002 and the gate of the transistor 3004. Thus, a potential applied to the wiring 3008 is applied to the gate of the transistor 3002 and the gate of the transistor 3004 as a potential of the input terminal IN2.

High-level voltage VDD is applied to one of the source and the drain of the transistor 3001 and one of the source and the drain of the transistor 3002 through a wiring 3009. Low-level voltage VSS is applied to one of the source and the drain of the transistor 3004 through a wiring 3010. A potential of the other of the source and the drain of the transistor 3001, the other of the source and the drain of the transistor 3002, and the one of the source and the drain of the transistor 3003 is applied to a circuit in a next stage as a potential of the output terminal OUT through wirings 3011 and 3012.

This embodiment can be implemented by being combined as appropriate with any of the above-described embodiments.

Embodiment 7

Figure 20A:
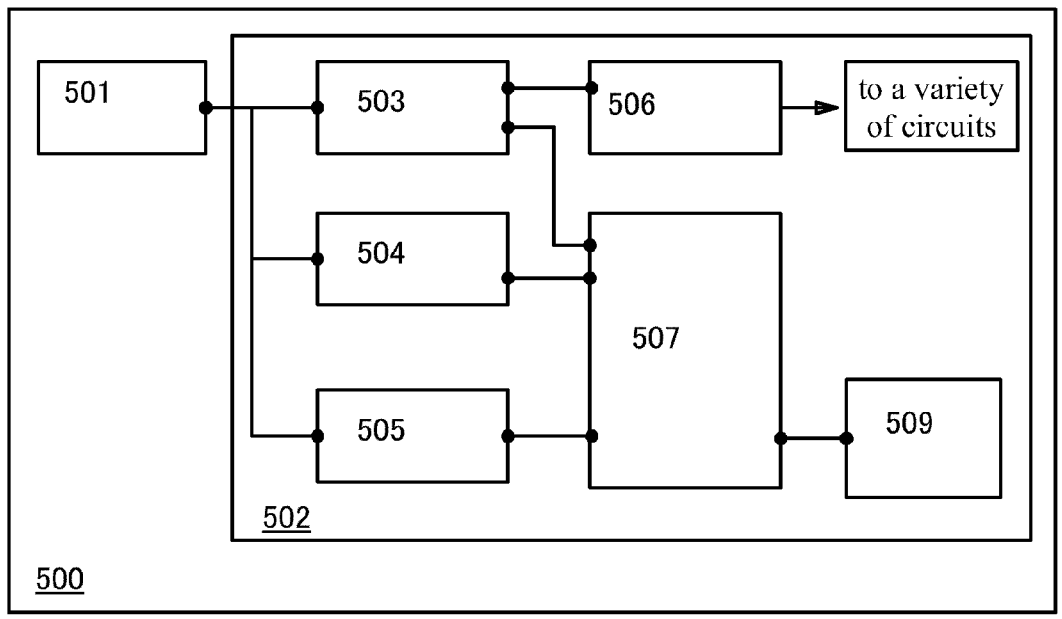
FIGS. 20A and 20B are views illustrating a structure of a semiconductor device which is formed using an SOI substrate according to one embodiment of the present invention.

In this embodiment, a structure of an RF tag, which is one of semiconductor devices using the SOI substrate described in Embodiment 1 or 2, is described. FIG. 20A is a block diagram illustrating one mode of the RF tag. In FIG. 20A, an RF tag 500 includes an antenna 501 and an integrated circuit 502. The integrated circuit 502 includes a power supply circuit 503, a demodulation circuit 504, a modulation circuit 505, a regulator 506, a control circuit 507, and a memory 509.

When a radio wave is transmitted from an interrogator, the radio wave is converted into an AC voltage in the antenna 501. In the power supply circuit 503, the AC voltage from the antenna 501 is rectified to generate a voltage for a power supply. The voltage for a power supply, which is generated in the power supply circuit 503, is fed to the control circuit 507 and the regulator 506. After stabilizing the voltage for a power supply from the power supply circuit 503 or after adjusting the level thereof, the regulator 506 supplies the voltage to circuits such as the demodulation circuit 504, the modulation circuit 505, the control circuit 507, or the memory 509 in the integrated circuit 502.

The demodulation circuit 504 demodulates an AC voltage from the antenna 501 to generate a signal and outputs the signal to the control circuit 507 of the next stage. The control circuit 507 performs arithmetic processing in accordance with the signal input from the demodulation circuit 504 and generates another signal. In the above arithmetic processing, the memory 509 can be used as a primary cache memory or a secondary cache memory. Further, the control circuit 507 analyzes the signal input from the demodulation circuit 504, and information in the memory 509 is output or the content of an instruction in the memory 509 is stored in accordance with the content of an instruction transmitted from the interrogator. The signal output from the control circuit 507 is encoded and transmitted to the modulation circuit 505. The modulation circuit 505 modulates a radio wave received by the antenna 501 in accordance with the signal. The radio wave modulated in the antenna 501 is received by the interrogator. Thus, data output from the RF tag 500 can be known.

In this manner, communication between the RF tag 500 and the interrogator is performed by modulating a radio wave used as a carrier (a carrier wave). As the carrier, there are radio waves with frequencies of 125 kHz, 13.56 MHz, 950 MHz, and the like, which vary depending on the standard. A modulation method includes various methods such as amplitude modulation, frequency modulation, and phase modulation, depending on the standard; however, any modulation may be employed as long as it is based on the standard.

A transmission method of signals can be classified into an electromagnetic coupling method, an electromagnetic induction method, a micro-wave method and the like in accordance with a wavelength of the carrier.

The memory 509 may be either a nonvolatile memory or a volatile memory. As the memory 509, an SRAM, a DRAM, a flash memory, an EEPROM, an FeRAM, or the like can be used.

In this embodiment, a structure of the RF tag 500 including the antenna 501 is described; however, the RF tag of this embodiment does not necessarily include an antenna. In addition, the RF tag illustrated in FIG. 20A may be provided with an oscillation circuit or a secondary battery.

Although the structure of the RF tag having only one antenna is described in FIG. 20A, this embodiment is not limited to this structure. A semiconductor device may include two antennas, that is, an antenna for receiving power and an antenna for receiving a signal. If the RF tag includes one antenna, in the case where both supply of power and transmission of a signal are performed with a radio wave of 950 MHz for example, there is a possibility that a large amount of power is transmitted to a distance and thus reception of other wireless devices is impeded. Therefore, it is desirable that power be supplied in a short distance with a radio wave which has reduced frequency; however, a communication distance is inevitably short in this case. On the other hand, if the RF tag includes two antennas, frequency of a radio wave for supplying power and frequency of a radio wave for transmitting a signal can be separately used. For example, in the case of transmitting power, a radio wave with a frequency of 13.56 MHz and a magnetic field are used, and in the case of transmitting a signal, a radio wave with a frequency of 950 MHz and an electric field are used. By thus separately using antennas depending on functions, power can be supplied for communication only in a short distance and a signal can be transmitted even in a long distance.

In the RF tag which is one of semiconductor devices using the SOI substrate 100, the integrated circuit 502 can be formed using a substrate having an insulating surface or a single crystal semiconductor layer (SOI layer) which is bonded onto an insulating substrate; therefore, not only faster processing speed but also lower power consumption can be achieved. Further, in the semiconductor device using the SOI substrate 100, productivity can be increased while a base substrate is increased in size, so that the cost for each RF tag can be reduced.

This embodiment can be implemented by being combined as appropriate with any of the above-described embodiments.

Next, a structure of a CPU (central processing unit) which is one of the semiconductor devices using the SOI substrate 100 is described.

Figure 20B:
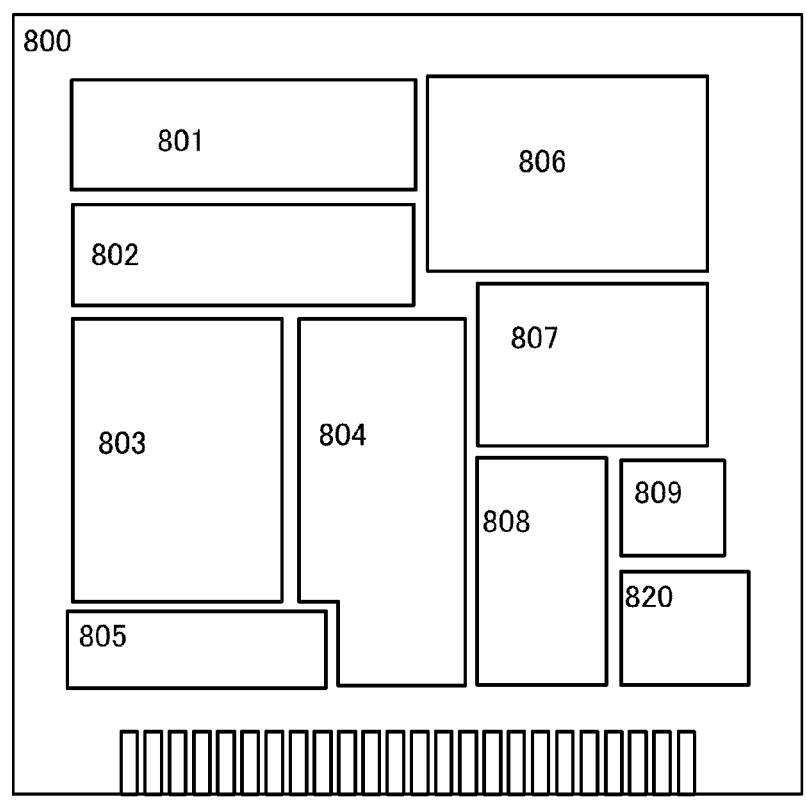

FIG. 20B is a block diagram illustrating a structure of the CPU of this embodiment. The CPU illustrated in FIG. 20B mainly includes over a substrate 800 an arithmetic logic unit (ALU) 801, an ALU controller 802, an instruction decoder 803, an interrupt controller 804, a timing controller 805, a register 806, a register controller 807, a bus interface (Bus I/F) 808, a memory 809, and a memory interface 820. The memory 809 and the memory interface 820 may be provided over another chip. It is needless to say that the CPU illustrated in FIG. 20B is only an example in which a configuration is simplified, and an actual CPU may have various configurations depending on the application.

An instruction input to the CPU through the bus interface 808 is decoded in the instruction decoder 803, and then input to the ALU controller 802, the interrupt controller 804, the register controller 807 and the timing controller 805. The ALU controller 802, the interrupt controller 804, the register controller 807 and the timing controller 805 conduct various controls based on the decoded instruction. Specifically, the ALU controller 802 generates signals for controlling the operation of the ALU 801. While the CPU is executing a program, the interrupt controller 804 judges an interrupt request from an external input/output device or a peripheral circuit based on its priority or a mask state, and processes the request. The register controller 807 generates an address of the register 806, and reads/writes data from/to the register 806 in accordance with the state of the CPU.

The timing controller 805 generates signals for controlling timing of operation of the ALU 801, the ALU controller 802, the instruction decoder 803, the interrupt controller 804, and the register controller 807. For example, the timing controller 805 is provided with an internal clock generator for generating an internal clock signal based on a reference clock signal, and supplies an internal clock signal to the above-mentioned circuits.

The CPU which is one of the semiconductor devices using the SOI substrate 100 can be formed using a substrate having an insulating surface or a single crystal semiconductor layer (SOI layer) which is bonded onto an insulating substrate; therefore, not only faster processing speed but also lower power consumption can be achieved. Further, in the semiconductor device using the SOI substrate 100, productivity can be increased while a base substrate is increased in size, so that the cost for each CPU can be reduced.

This embodiment can be implemented by being combined as appropriate with any of the above-described embodiments.

Embodiment 8

In this embodiment, a structure of an active matrix semiconductor display device, which is one of the semiconductor devices using the SOI substrate described in Embodiment 1 or 2, is described.

In an active matrix light-emitting device, each pixel is provided with a light-emitting element which corresponds to a display element. Since a light-emitting element emits light by itself, the light-emitting element has high visibility, does not need a backlight which is necessary for a liquid crystal display device, is suitable for reduction in thickness, and does not have limitations on the viewing angle. Although this embodiment describes a light-emitting device using an organic light-emitting diode (an OLED) which is one of light-emitting elements, the semiconductor display device manufactured in this embodiment may be a light-emitting device using any other light-emitting element.

The OLED includes a layer containing a material from which luminescence (electroluminescence) generated by application of an electric field can be obtained (hereinafter, referred to as an electroluminescent layer), an anode layer, and a cathode layer. As electroluminescence, there are luminescence (fluorescence) at the time of returning to a ground state from a singlet-excited state and luminescence (phosphorescence) at the time of returning to a ground state from a triplet-excited state. A light-emitting device which is manufactured in this embodiment may use either one of fluorescence and phosphorescence or both fluorescence and phosphorescence.

FIG. 21A illustrates a cross-sectional view of a light-emitting device of this embodiment. The light-emitting device illustrated in FIG. 21A includes a transistor 1601 and a transistor 1602 which are used in a driver circuit, and a driving transistor 1604 and a switching transistor 1603 which are used in a pixel, over an element substrate 1600. In addition, the light-emitting device illustrated in FIG. 21A includes a light-emitting element 1605 in the pixel over the element substrate 1600.

The light-emitting element 1605 has a pixel electrode 1606, an electroluminescent layer 1607, and a counter electrode 1608. One of the pixel electrode 1606 and the counter electrode 1608 is an anode, and the other is a cathode.

The anode can be formed of a light-transmitting oxide conductive material such as indium tin oxide including silicon oxide (ITSO), indium tin oxide (ITO), zinc oxide (ZnO), indium zinc oxide (IZO), or gallium-doped zinc oxide (GZO). As an alternative to the light-transmitting oxide conductive material, the anode can be formed, for example, as a single-layer film including one or more of titanium nitride, zirconium nitride, Ti, W, Ni, Pt, Cr, Ag, Al, and the like, as a stacked-layer structure of a titanium nitride film and a film containing aluminum as its main component, as a three-layer film of a titanium nitride film, a film containing aluminum as its main component, and a titanium nitride film, or the like. In a case where the anode is formed of a material other than the light-transmitting oxide conductive material and light is extracted from the anode side, the anode is formed to a thickness such that light transmits therethrough (preferably about 5 nm to 30 nm).

It is to be noted that the anode can be formed of a conductive composition including a conductive macromolecule (also referred to as a conductive polymer). The conductive composition preferably has a sheet resistance of less than or equal to 10000 Ω/square and a light transmittance of greater than or equal to 70% at a wavelength of 550 nm when the conductive composition is formed into a conductive film serving as an anode. In addition, the resistivity of the conductive macromolecule which is contained in the conductive composition is preferably less than or equal to 0.1 Ω·cm.

As the conductive macromolecule, a so-called π-electron conjugated conductive macromolecule can be used. For example, polyaniline and/or a derivative thereof, polypyrrole and/or a derivative thereof, polythiophene and/or a derivative thereof, and a copolymer of plural kinds of those materials can be given as the π-electron conjugated conductive macromolecule.

Specific examples of a conjugated conductive macromolecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), or poly(3-anilinesulfonic acid).

The aforementioned conductive macromolecule may be used alone as the conductive composition for the anode. Alternatively, in order to adjust the film characteristics such as the uniformity of the film thickness of the conductive composition and the film strength thereof, an organic resin may be added to the aforementioned conductive macromolecule.

As for an organic resin, a thermosetting resin, a thermoplastic resin, or a photocurable resin may be used as long as such a resin is compatible to a conductive macromolecule or such a resin can be mixed with and dispersed into a conductive macromolecule. For example, a polyester-based resin such as polyethylene terephthalate, polybutylene terephthalate, or polyethylene naphthalate; a polyimide-based resin such as polyimide or polyimide amide; a polyamide resin such as polyamide 6, polyamide 66, polyamide 12, or polyamide 11; a fluorine resin such as poly(vinylidene fluoride), polyvinyl fluoride, polytetrafluoroethylene, ethylene-tetrafluoroethylene copolymer, or polychlorotrifluoroethylene; a vinyl resin such as poly(vinyl alcohol), poly(vinyl ether), poly(vinyl butyral), poly(vinyl acetate), or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of those resins.

Further, a conductive composition may be doped with an acceptor dopant or a donor dopant so that oxidation-reduction potential of a conjugated electron in a conjugated conductive macromolecule may be changed in order to adjust conductivity of the conductive composition.

A halogen compound, a Lewis acid, a protonic acid, an organic cyano compound, an organic metal compound, or the like can be used as an acceptor dopant. As examples of the halogen compound, chlorine, bromine, iodine, iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid and organic acid such as organic carboxylic acid and organic sulfonic acid can be given. As an organic carboxylic acid and an organic sulfonic acid, the aforementioned carboxylic acid compound and sulfonic acid compound can be used. As an organic cyano compound, a compound in which two or more cyano groups are included in a conjugated bond can be used; for example, tetracyanoethylene, tetracyanoethylene oxide, tetracyanobenzene, tetracyanoquinodimethane, and tetracyanoazanaphthalene are given.

As a donor dopant, alkali metal, alkaline-earth metal, a quaternary ammonium compound, or the like can be used.

Alternatively, a conductive composition is dissolved in water or an organic solvent (e.g., an alcohol-based solvent, a ketone-based solvent, an ester-based solvent, a hydrocarbon-based solvent, or an aromatic-based solvent) and a wet process is used, whereby a thin film which serves as the anode can be formed.

A solvent which dissolves a conductive composition is not particularly limited. A solvent which dissolves the foregoing conductive macromolecules and high molecular resin compounds such as an organic resin may be used. For example, a conductive composition may be dissolved in any one of or mixture of water, methanol, ethanol, propylene carbonate, N-methylpyrrolidone, dimethylformamide, dimethylacetamide, cyclohexanone, acetone, methyl ethyl ketone, methyl isobutyl ketone, or toluene.

A film of the conductive composition can be formed by a wet process such as an application method, a coating method, a droplet discharge method (also referred to as "an ink-jet method"), or a printing method after the conductive composition is dissolved in a solvent. The solvent may be dried by a heat treatment or may be dried under reduced pressure. In the case where the organic resin is a thermosetting resin, a heat treatment may be further performed. In the case where the organic resin is a photocurable resin, a light irradiation treatment may be performed.

The cathode can be formed in general by using a metal, an alloy, an electrically conductive compound, or a mixture thereof, each of which has a low work function. Specifically, a rare-earth metal such as Yb or Er as well as an alkali metal such as Li or Cs, an alkaline-earth metal such as Mg, Ca, or Sr, or an alloy containing these (Mg:Ag, Al:Li, or the like) can be used. When a layer containing a material having a high electron-injection property is formed in contact with the cathode, a general conductive film of aluminum, a light-transmitting conductive oxide material, or the like can be used.

The electroluminescent layer 1607 may be formed to have a single-layer structure or a stacked-layer structure and each layer thereof may include an inorganic material in addition to an organic material. The luminescence of the electroluminescent layer 1607 includes luminescence (fluorescence) at the time of returning from a singlet-excited state to a ground state and luminescence (phosphorescence) at the time of returning from a triplet-excited state to a ground state. When the electroluminescent layer 1607 is formed to have a plurality of layers and the pixel electrode 1606 is the cathode, the electroluminescent layer 1607 is formed by stacking an electron-injecting layer, an electron-transporting layer, a light-emitting layer, a hole-transporting layer, and a hole-injecting layer in order over the pixel electrode 1606. When the pixel electrode 1606 corresponds to the anode, the electroluminescent layer 1607 is formed by stacking a hole-injecting layer, a hole-transporting layer, a light-emitting layer, an electron-transporting layer, and an electron-injecting layer in order.

The electroluminescent layer 1607 can be formed by a droplet discharge method using any of a macromolecular organic compound, an intermolecular organic compound (which does not have a subliming property but has a molecular chain length of less than or equal to 10 μm), a low molecular organic compound, and an inorganic compound. In a case of using an intermolecular organic compound, a low molecular organic compound, or an inorganic compound, the electroluminescent layer 1607 may be formed by an evaporation method.

The switching transistor 1603 and the driver transistor 1604 may each have a multigate structure such as a double gate structure or a triple gate structure instead of having a single gate structure.

Next, FIG. 21B is a cross-sectional view of a liquid crystal display device of this embodiment. In the liquid crystal display device illustrated in FIG. 21B, a transistor 1611 and a transistor 1612 that are used for a driver circuit, and a transistor 1613 that is used as a switching element in a pixel are formed over an element substrate 1610. In addition, the liquid crystal display device illustrated in FIG. 21B includes a liquid crystal cell 1615 between the element substrate 1610 and a counter substrate 1614.

The liquid crystal cell 1615 has a pixel electrode 1616 formed over the element substrate 1610, a counter electrode 1617 formed on the counter substrate 1614, and a liquid crystal 1618 provided between the pixel electrode 1616 and the counter electrode 1617. The pixel electrode 1616 can be formed using, for example, indium tin oxide containing silicon oxide (ITSO), indium tin oxide (ITO), zinc oxide (ZnO), indium zinc oxide (IZO), gallium-doped zinc oxide (GZO), or the like.

This embodiment can be implemented by being combined as appropriate with any of the above-described embodiments.

Embodiment 9

Figure 22A:
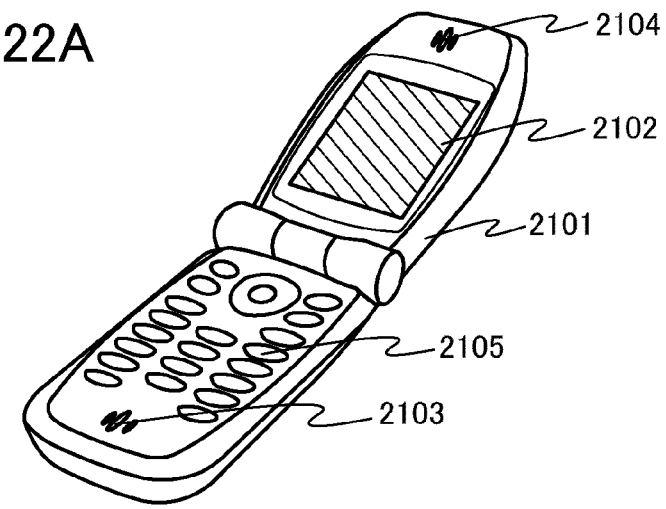
FIGS. 22A to 22C are views each illustrating an electronic appliance using a semiconductor device which is formed using an SOI substrate according to one embodiment of the present invention.
Figure 22B:
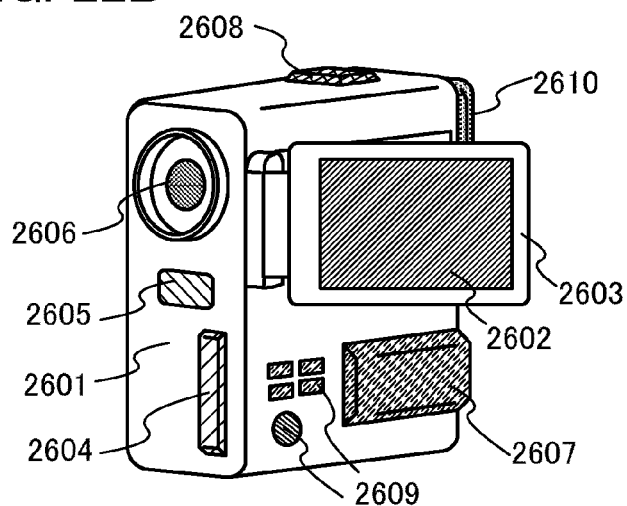
Figure 22C:
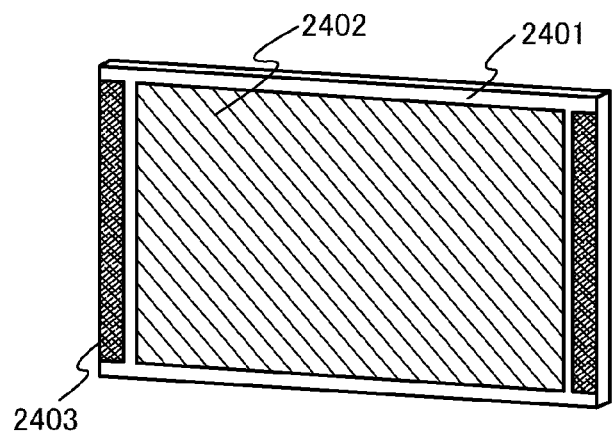

As an electronic appliances which can use the semiconductor device using the SOI substrate of Embodiment 1 or 2, the following can be given: mobile phones, portable game machines, electronic books, cameras such as video cameras or digital still cameras, goggle displays (head mounted displays), navigation systems, audio reproducing devices (e.g., car audio components or audio component sets), laptop computers, image reproducing devices provided with a recording medium (typically, devices for reproducing a recording medium such as digital versatile discs (DVDs) and having a display for displaying the reproduced image), and the like. FIGS. 22A to 22C illustrate specific examples of these electronic appliances.

FIG. 22A illustrates a mobile phone which includes a main body 2101, a display portion 2102, an audio input portion 2103, an audio output portion 2104, and operation keys 2105. By using a semiconductor device formed by the manufacturing method which is described in Embodiment 1 or 2 for the display portion 2102 or a signal processing circuit, a mobile phone can be provided at low cost.

FIG. 22B illustrates a video camera, which includes a main body 2601, a display portion 2602, a housing 2603, an external connection port 2604, a remote control receiving portion 2605, an image receiving portion 2606, a battery 2607, an audio input portion 2608, operation keys 2609, an eyepiece portion 2610, and the like. By using a semiconductor device formed by the manufacturing method which is described in Embodiment 1 or 2 for the display portion 2602 or a signal processing circuit, a video camera can be provided at low cost.

FIG. 22C illustrates an image display device, which includes a housing 2401, a display portion 2402, a speaker portion 2403, and the like. By using a semiconductor device formed by the manufacturing method which is described in Embodiment 1 or 2 for the display portion 2402 or a signal processing circuit, an image display device can be provided at low cost. Note that the image display device includes all devices for displaying image such as for a personal computer, for receiving TV broadcasting, and for displaying an advertisement, or the like.

As described above, the application range of a semiconductor device formed by the manufacturing method which is described in Embodiment 1 or 2 is extremely wide and the semiconductor device can be used for electronic appliances of various fields.

This embodiment can be implemented in combination with any of the embodiments mentioned above as appropriate.

This application is based on Japanese Patent Application serial No. 2009-126962 filed with the Japan Patent Office on May 26, 2009, the entire contents of which are hereby incorporated by reference.

What is claimed is:

1. A manufacturing method of an SOI substrate comprising the steps of:

disposing a plurality of single crystal semiconductor substrates in a plurality of depression portions of a first tray, wherein bonding layers are formed over top surfaces of the plurality of single crystal semiconductor substrates, and embrittlement layers are formed in the plurality of single crystal semiconductor substrates;

bonding a base substrate and the plurality of single crystal semiconductor substrates by making the plurality of single crystal semiconductor substrates be in contact with the base substrate with the bonding layers interposed therebetween so as to bond surfaces of the bonding layers and a surface of the base substrate;

detaching the first tray from the plurality of single crystal semiconductor substrates;

disposing a second tray so that the plurality of single crystal semiconductor substrates overlaps with a plurality of depression portions of the second tray; and forming the base substrate with which a plurality of single crystal semiconductor layers separated from the single crystal semiconductor substrates is in contact, wherein a depth of the depression portion of the first tray is smaller than a thickness of the single crystal semiconductor substrate, wherein a depth of the depression portion of the second tray is larger than the thickness of the single crystal semiconductor substrate, and wherein the second tray is disposed without being in contact with bottom surfaces of the plurality of single crystal semiconductor substrates.

2. A manufacturing method of an SOI substrate according to claim 1,
wherein the single crystal semiconductor substrates separated from the single crystal semiconductor layers are held in the plurality of depression portions of the second tray.

3. A manufacturing method of an SOI substrate according to claim 1,
wherein an area of a bottom surface of the depression portion of the second tray is less than or equal to 1.1 times that of a bottom surface of the single crystal semiconductor substrate.

4. A manufacturing method of an SOI substrate according to claim 1,
wherein the bonding layer is formed over an insulating layer which is in contact with the single crystal semiconductor substrate.

5. A manufacturing method of an SOI substrate according to claim 1,
wherein the bonding layer is formed over an insulating layer which is in contact with the single crystal semiconductor substrate, and
wherein the insulating layer has a stacked-layer structure including a plurality of insulating films.

6. A manufacturing method of an SOI substrate according to claim 1,
wherein the embrittlement layer is formed by exciting hydrogen gas to generate plasma containing $H_3^+$, and accelerating an ion species contained in the plasma to dope the single crystal semiconductor substrate with the ion species.

7. A manufacturing method of an SOI substrate according to claim 1,
wherein the base substrate is a glass substrate.

8. A manufacturing method of an SOI substrate according to claim 1,
wherein the second tray is made of quartz glass, silicon, silicon carbide, or non-alkali glass.

9. A manufacturing method of a semiconductor device, comprising the step of forming a semiconductor device using the SOI substrate according to claim 1.

10. A manufacturing method of an SOI substrate comprising the steps of:
disposing a plurality of single crystal semiconductor substrates in a plurality of depression portions of a first tray, wherein bonding layers are formed over top surfaces of the plurality of single crystal semiconductor substrates, and embrittlement layers are formed in the plurality of single crystal semiconductor substrates;
bonding a base substrate and the plurality of single crystal semiconductor substrates by making the plurality of single crystal semiconductor substrates be in contact with the base substrate with the bonding layers interposed therebetween, so as to bond surfaces of the bonding layers and a surface of the base substrate;
detaching the first tray from the plurality of single crystal semiconductor substrates;
disposing a second tray so that the plurality of single crystal semiconductor substrates overlaps with a plurality of depression portions of the second tray, wherein supporting portions are provided between the depression portions of the second tray; and
forming the base substrate with which a plurality of single crystal semiconductor layers separated from the single crystal semiconductor substrates is in contact,
wherein a depth of the depression portion of the first tray is smaller than a thickness of the single crystal semiconductor substrate,
wherein a sum of a depth of the depression portion of the second tray and a height of the supporting portion of the second tray is larger than the thickness of the single crystal semiconductor substrate,
wherein a distance between adjacent depression portions of the second tray is larger than a width of the supporting portion, and
wherein the second tray is disposed without being in contact with bottom surfaces of the plurality of single crystal semiconductor substrates.

11. A manufacturing method of an SOI substrate according to claim 10,
wherein the single crystal semiconductor substrates separated from the single crystal semiconductor layers are held in the plurality of depression portions of the second tray.

12. A manufacturing method of an SOI substrate according to claim 10,
wherein an area of a bottom surface of the depression portion of the second tray is less than or equal to 1.1 times that of the bottom surface of the single crystal semiconductor substrate.

13. A manufacturing method of an SOI substrate according to claim 10,
wherein the bonding layer is formed over an insulating layer which is in contact with the single crystal semiconductor substrate.

14. A manufacturing method of an SOI substrate according to claim 10,
wherein the bonding layer is formed over an insulating layer which is in contact with the single crystal semiconductor substrate,
wherein the insulating layer has a stacked-layer structure including a plurality of insulating films.

15. A manufacturing method of an SOI substrate according to claim 10,
wherein the embrittlement layer is formed by exciting hydrogen gas to generate plasma containing $H_3^+$, and accelerating an ion species contained in the plasma to dope the single crystal semiconductor substrate with the ion species.

16. A manufacturing method of an SOI substrate according to claim 10,
wherein the base substrate is a glass substrate.

17. A manufacturing method of an SOI substrate according to claim 10,
wherein the second tray is made of quartz glass, silicon, silicon carbide, or non-alkali glass.

18. A manufacturing method of a semiconductor device, comprising the step of forming a semiconductor device using the SOI substrate according to claim 10.

* * * * *